United States Patent
Timmerwilke

(10) Patent No.: US 12,375,086 B2
(45) Date of Patent: Jul. 29, 2025

(54) RECONFIGURABLE CLOCKLESS SINGLE FLUX QUANTUM LOGIC CIRCUITRY

(71) Applicant: International Business Machines Corporation, Armonk, NY (US)

(72) Inventor: John Timmerwilke, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 18/126,691

(22) Filed: Mar. 27, 2023

(65) Prior Publication Data

US 2024/0356555 A1 Oct. 24, 2024

(51) Int. Cl.
| | |
|---|---|
| H03K 19/195 | (2006.01) |
| H03K 3/037 | (2006.01) |
| H03K 19/173 | (2006.01) |
| H03K 19/20 | (2006.01) |
| H03K 19/21 | (2006.01) |

(52) U.S. Cl.
CPC ........... *H03K 19/195* (2013.01); *H03K 3/037* (2013.01); *H03K 19/173* (2013.01); *H03K 19/20* (2013.01); *H03K 19/21* (2013.01)

(58) Field of Classification Search
CPC .... H03K 19/195; H03K 3/037; H03K 19/173; H03K 19/21; H03K 19/1952; H03K 19/20
USPC .................................. 326/1, 3; 505/846, 170
See application file for complete search history.

(56) References Cited

U.S. PATENT DOCUMENTS

| | | |
|---|---|---|
| 5,598,105 A | 1/1997 | Kurosawa et al. |
| 6,420,895 B1 | 7/2002 | Herr et al. |
| 6,518,786 B2 | 2/2003 | Herr |
| 6,734,699 B1 | 5/2004 | Herr et al. |

(Continued)

FOREIGN PATENT DOCUMENTS

| | | |
|---|---|---|
| CN | 115202612 A | 10/2022 |
| WO | 2021183344 A1 | 9/2021 |

OTHER PUBLICATIONS

B Dimov et al 2006 J. Phys.: Conf. Ser. 43 1183 Universal asynchronous RSFQ gate for realization of Boolean functions of dual-rail binary variables (Year: 2006).*

(Continued)

*Primary Examiner* — Arnold M Kinkead
(74) *Attorney, Agent, or Firm* — Erik Johnson; Ryan, Mason & Lewis, LLP

(57) ABSTRACT

A device comprises a clockless single flux quantum (SFQ) logic circuit comprising input and output stages and a configurable logic circuit which comprises at least one configurable logic gate that holds an internal state. The input stage comprises a signal input converter circuit which receives a two-level input signal and generates an SFQ pulse on each rising and falling edge of the two-level input signal. The configurable logic circuit performs logic operations using SFQ pulses from the input stage, and outputs SFQ pulses to the output stage which comprises a signal output converter circuit that converts each output SFQ pulse into a two-level output signal. The signal output converter circuit holds an internal state. The configurable logic circuit is configurable to implement a logic function by initializing the internal state of the signal output converter circuit and/or the internal state of the at least one configurable logic gate.

20 Claims, 23 Drawing Sheets

(56) References Cited

U.S. PATENT DOCUMENTS

| | | |
|---|---|---|
| 10,171,087 B1 * | 1/2019 | Braun .................. H03K 19/195 |
| 10,552,756 B2 | 2/2020 | Ipek et al. |
| 10,707,873 B2 | 7/2020 | Katam et al. |
| 11,342,919 B1 | 5/2022 | Whiteley |
| 2022/0190830 A1 * | 6/2022 | Beck ........................ H03K 3/38 |

OTHER PUBLICATIONS

K. K. Likharev et al., "RSFQ Logic/Memory Family: A New Josephson-Junction Technology for Sub-Terahertz-Clock-Frequency Digital Systems," IEEE Transactions on Applied Superconductivity, Mar. 1991, pp. 3-28, vol. 1, No. 1.

S. V. Rylov, "Clockless Dynamic SFQ and Gate With High Input Skew Tolerance," IEEE Transactions on Applied Superconductivity, Aug. 2019, pp. 1-5, vol. 29, No. 5.

D. E. Kirichenko et al., "Zero Static Power Dissipation Biasing of RSFQ Circuits," IEEE Transactions on Applied Superconductivity, Jun. 2011, pp. 776-779, vol. 21, No. 3.

Need From Inventors: M. Bhushan et al., "Silicon Technology Inspired Test Structures and Methodology for SFQ Model-to-Hardware Correlation," IEEE Transactions on Applied Superconductivity, Aug. 2019, 7 pages, vol. 29, No. 5.

G. Krylov, "Asynchronous Dynamic Single-Flux Quantum Majority Gates," IEEE Transactions on Applied Superconductivity, Aug. 2020, 7 pages, vol. 30, No. 5.

T. Kawaguchi et al., "Rapid Single-Flux-Quantum Logic Circuits Using Clockless Gates," IEEE Transactions on Applied Superconductivity, Jun. 2021, 8 pages, vol. 31, No. 4.

\* cited by examiner

300

310

| A_Level | B_Level | A_Pulse | B_Pulse | TIFF-A | TFF-B | Q_Pulse | Q_Level |
|---|---|---|---|---|---|---|---|
| 0 | 0 | 0 | 0 | 0 | 0 | 0 | 0 |
| 1 | 0 | 1 | 0 | 1 | 0 | 0 | 0 |
| 1 | 1 | 0 | 1 | 1 | 1 | 1 | 1 |
| 0 | 1 | 1 | 0 | 0 | 1 | 1 | 0 |
| 0 | 0 | 0 | 1 | 0 | 0 | 0 | 0 |
| 0 | 1 | 0 | 1 | 0 | 1 | 0 | 0 |
| 1 | 1 | 1 | 0 | 1 | 1 | 1 | 1 |
| 1 | 0 | 0 | 1 | 1 | 0 | 1 | 0 |
| 0 | 0 | 1 | 0 | 0 | 0 | 0 | 0 |

2-BIT MULTIPLEXER GATE
600

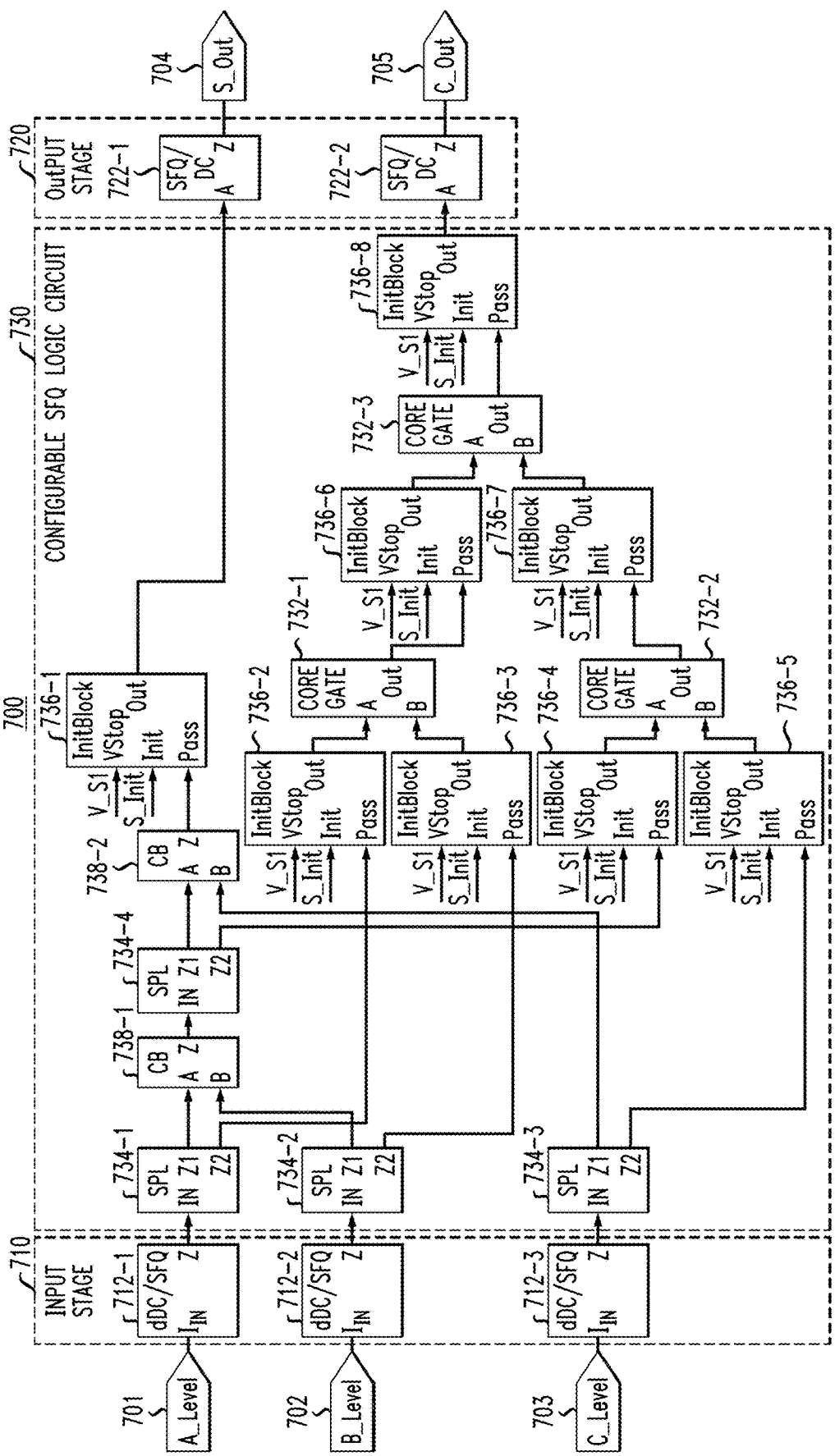

740

JOSEPHSON TRANSMISSION LINE

BLOCKING JOSEPHSON TRANSMISSION LINE

SFQ PULSE SPLITTER dDC/SFQ CONVERTER

NON-DESTRUCTIVE READOUT TOGGLE FLIP-FLOP
1100

CONFLUENCE BUFFER

BLOCKING CONFLUENCE BUFFER

SFQ/DC CONVERTER
1300

1400

RECONFIGURABLE CLOCKLESS SINGLE FLUX QUANTUM LOGIC CIRCUITRY

BACKGROUND

This disclosure relates generally to superconducting logic circuits and systems and, in particular, to superconducting clockless single flux quantum (SFQ) logic circuitry. In general, superconducting logic circuits comprise logic gates that are designed based on, e.g., superconducting passive elements (e.g., superconducting inductors, superconducting transmission lines, etc.), Josephson junctions (which are configured to operate as ultrafast Josephson junction switches), and quantization of magnetic flux. For superconducting computing, the superconducting electronic circuits have superconducting elements formed of superconducting material, such as Niobium, and operate at cryogenic temperatures (e.g., below 10 Kelvin for Niobium superconducting material).

Superconducting logic circuits can be implemented using different types of SFQ logic architectures which utilize SFQ pulses (also referred to as magnetic single flux quantum pulses) to encode, process, and transmit data. An SFQ pulse is a voltage pulse whose time integral is equal to a discrete amount of magnetic flux, i.e., a single magnetic flux quantum, referred to herein as a "fluxon." For superconducting applications, SFQ logic is utilized as an alternative to conventional complementary metal-oxide-semiconductor (CMOS) circuitry for high performance computing (HPC) applications due to the higher operating speed and low power consumption achieved through the use of superconducting SFQ circuitry as compared to conventional room temperature CMOS circuitry. In addition, superconducting SFQ circuitry can be readily fabricated using state-of-the-art thin-film very-large-scale integration lithographic fabrication techniques.

Current state-of-the-art SFQ logic architectures include, for example, direct current (DC)-powered SFQ logic families, such as rapid single flux quantum (RSFQ) logic and energy-efficient rapid single flux quantum (ERSFQ) logic, which operate intrinsically as state machines, and which provide the potential for low-power, high-frequency operation. In general, SFQ logic gates have internal logic states which must be reset to a ground state after each system clock cycle. With clocked SFQ circuit architectures, clock signals are utilized to reset the internal states of the SFQ logic gates and complete any logical decisions. Clocked SFQ circuits require cumbersome clock distribution networks (e.g., clock trees) which introduce notable timing requirements and which become a significant source of power dissipation in relatively large chips with large SFQ circuits. Further, the use of clock signals in SFQ logic networks creates significant challenges for VLSI SFQ digital design, in particular, the use of a register transfer level (RTL) design paradigm, which is a cornerstone of VLSI digital design methodology. The RTL VLSI design paradigm is based on dividing large digital circuits into clock-free, state-free logic networks of significant depth called combinational logic clouds, wherein the system clocking is achieved using clocked registers at the boundaries of the combinational logic clouds to hold all system states.

On the other hand, more recent state-of-the-art SFQ logic architectures include, for example, DC-powered clockless dynamic SFQ logic circuitry which comprises logic gates that operate asynchronously (without clocking) and which are configured with self-resetting circuitry to enable self-resetting of the internal states of the logic gate to ground state without the use of clock signals. While self-resetting clockless SFQ gates can eliminate the need for clock distribution networks as in clocked systems, the self-resetting clockless SFQ gates often include other timing requirements defined by self-reset times since clockless SFQ gates with self-resetting functions only work in a hardware defined time window.

SUMMARY

Exemplary embodiments of the disclosure include superconducting clockless SFQ circuits which implement reconfigurable clockless SFQ logic gates.

For example, an exemplary embodiment includes a device which comprises a clockless single flux quantum logic circuit comprising an input stage, an output stage, and a configurable logic circuit coupled to and between the input stage and the output stage. The configurable logic circuit comprises at least one configurable logic gate which holds an internal state. The input stage comprises a signal input converter circuit which is configured to receive a two-level input signal and generate an SFQ pulse on each rising edge and falling edge of the two-level input signal. The configurable logic circuit is configured to perform one or more logic operations using SFQ pulses received from the input stage, and outputs SFQ pulses to the output stage. The output stage comprises a signal output converter circuit which is configured to convert each of the output SFQ pulses into a two-level output signal, wherein the signal output converter circuit holds an internal state. The configurable logic circuit is configurable to implement a given logic function by initializing at least one of the internal state of the signal output converter circuit and the internal state of the at least one configurable logic gate.

Advantageously, the clockless single flux quantum logic circuit with configurable logic circuitry allows for a relaxation of the strict timing requirements and constraints associated with clocked SFQ logic gates and dynamic, self-resetting clockless SFQ logic gates which are defined by reset times of dynamic storage loops. In particular, the clockless single flux quantum logic circuit with configurable logic circuitry obviates the need to use clock signals and clock distribution trees to distribute clock signals to clocked SFQ logic gates to control logic operations and reset internal states of the clocked SFQ logic gates. In addition, the clockless single flux quantum logic circuit with configurable logic circuitry eliminates the need to implement SFQ logic gates with self-resetting circuitry to automatically reset the internal states of the SFQ logic gates, wherein the self-resetting circuitry imposes relatively strict timing requirements and constraints to enable dynamic self-resetting of an internal state of the dynamic storage loop circuit based on, e.g., a time constant for resetting the internal state to a ground state. Moreover, the clockless single flux quantum logic circuit with configurable logic circuitry enables configurability of SFQ logic gates by initializing the internal states of one or more clockless gates that hold internal state.

In an exemplary embodiment, the configurable logic circuit is configurable to implement one of a plurality of logic gates including an AND gate, a NAND gate, an OR gate, a NOR gate, an IMPLY gate, a NIMPLY gate, an XOR gate, and an XNOR gate, based on an initialized internal state of at least one of the signal output converter circuit and the at least one configurable logic gate.

In another exemplary embodiment, as may be combined with the preceding paragraphs, the configurable logic circuit comprises a first state initialization circuit and a second state initialization circuit. The first state initialization circuit is configured to inject an SFQ pulse into an input port of the at least one configurable logic gate to initialize the internal state of the at least one configurable logic gate. The second state initialization circuit that is configured to inject an SFQ pulse into an input port of the signal output converter circuit to initialize the internal state of the signal output converter circuit.

In another exemplary embodiment, a device comprises a clockless single flux quantum logic circuit comprising a configurable logic gate. The configurable logic gate comprises a first toggle flip-flop circuit, a second toggle flip-flop flop circuit, a first pulse splitter circuit, and a second pulse splitter circuit. The first toggle flip-flop circuit is configured for non-destructive readout of an internal state of the first toggle flip-flop circuit. The second toggle flip-flop circuit configured for non-destructive readout of an internal state of the second toggle flip-flop circuit. The first pulse splitter circuit comprises an input port, a first output port coupled to a toggle input port of the first toggle flip-flop circuit, and a second output port coupled to a readout control input port of the second toggle flip-flop circuit. The second pulse splitter circuit comprises an input port, a first output port coupled to a readout control input port of the first toggle flip-flop circuit, and a second output port coupled to a toggle input port of the second toggle flip-flop circuit. The configurable logic gate is configurable to implement one of a plurality of logic gates by initializing an internal state of at least one of the first toggle flip-flop circuit and the second toggle flip-flop circuit.

In another exemplary embodiment, as may be combined with the preceding paragraphs, the configurable logic gate further comprises a confluence buffer circuit. The confluence buffer circuit comprises a first input port coupled to a non-destructive readout port of the first toggle flip-flop circuit, and a second input port coupled to a non-destructive readout port of the second toggle flip-flop circuit.

In another exemplary embodiment, a device comprises a clockless single flux quantum logic circuit comprising a configurable logic gate. The configurable logic gate comprises a confluence buffer circuit, a signal output converter circuit, and a state initialization circuit. The confluence buffer circuit comprises a first input port, a second input port, and an output port. The signal output converter circuit is configured to convert an SFQ pulse at the output port of the confluence buffer circuit into a two-level output signal, wherein the signal output converter circuit comprises an internal state. The state initialization circuit is configured to initialize the internal state of the signal output converter circuit. The configurable logic gate is configured to operate as one of an XOR gate and an XNOR gate depending on the initial internal state of the signal output converter circuit.

Other embodiments will be described in the following detailed description of exemplary embodiments, which is to be read in conjunction with the accompanying figures.

BRIEF DESCRIPTION OF THE DRAWINGS

FIG. 7A is a block diagram of clockless SFQ logic circuitry comprising a full adder gate that is configured using multiple instances of the configurable logic gate of FIG. 1, according to an exemplary embodiment of the disclosure.

DETAILED DESCRIPTION

Figure 1:
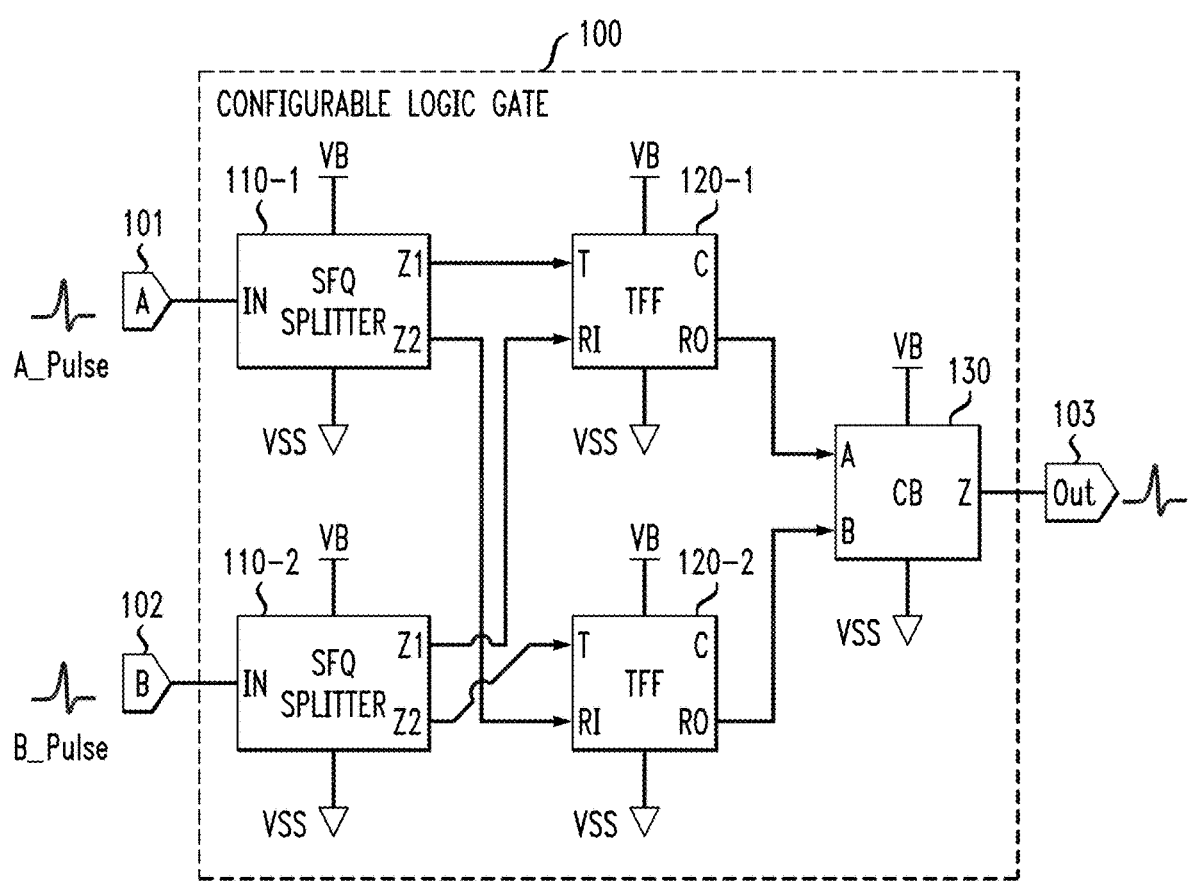
FIG. 1 is a block diagram of a configurable logic gate having a configurable logic architecture, according to an exemplary embodiment of the disclosure.

Exemplary embodiments of the disclosure will now be described in further detail with regard to superconducting clockless (asynchronous) SFQ logic circuits which are designed using reconfigurable clockless SFQ logic circuitry. It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise superconducting circuit elements (e.g., Josephson junctions), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

In general, exemplary embodiments of the disclosure implement SFQ circuitry to form SFQ logic gates and combinational networks which generate and utilize SFQ pulses to perform logic operations. An SFQ pulse is a voltage pulse whose time integral is equal to a discrete amount of magnetic flux, i.e., a single magnetic flux quantum, referred to herein as a "fluxon." More specifically, an SFQ pulse comprises a voltage pulse having a small magnitude (e.g., 1 millivolt (mV)) and a short duration (e.g., 2 picoseconds), wherein an area of the SFQ pulse (i.e., integral of voltage over time) is equal to one magnetic flux quantum $\Phi_0$ (or one fluxon), where $\Phi_0=h/(2e) \approx 2.07 \times 10^{-15}$ Weber (volt-seconds), where h is Planck's constant, and e denotes a magnitude of electron charge. As is known in the art, the magnetic flux quantum $\Phi_0$ is a fundamental unit of magnetic flux which represents a quantization of magnetic flux threading a superconducting loop. In this regard, an SFQ pulse is any voltage pulse having a magnitude (in millivolts) and duration (picoseconds) such that the integral of the magnitude (voltage) over the duration (time) of the SFQ pulse (i.e., quantized area of SFQ pulse) is substantially equal to $\Phi_0=2.07$ millivolt-picosecond (or 2.07 mA-pH), which equates to one magnetic flux quantum (or one fluxon).

Exemplary embodiments of the disclosure are based on a novel SFQ pulse definition for clockless SFQ logic circuitry, which differs from the standard definition of what constitutes digital information SFQ logic circuits. For example, in standard SFQ logic, binary information is coded/stored in the form of magnetic flux quanta and transferred in the form of SFQ voltage pulses, not by DC voltages. In standard SFQ logic circuits, SFQ pulses are passed in the form of very short (picosecond) "quantized" voltage pulses V (t) with the fixed area (integration of V(t)dt=2.07 mV-ps). In this regard, for SFQ circuits, digital information is encoded in the form of SFQ pulses, wherein during a given system clock period (wherein each system clock pulse marks a boundary between two adjacent system clock periods), an SFQ pulse can arrive (or not arrive) at a given logic cell input. The arrival of an SFQ pulse at an input terminal of a given logic cell during a given clock period defines a logic value 1 of the signal, while the absence of an SFQ pulse at the input terminal during the given clock period defines the logic value 0 of this signal.

Instead of the standard SFQ pulse definition, the exemplary SFQ logic circuit architectures as described herein separate the logical state from the SFQ pulses presence or absence and, instead, store it internally at a logic gate in a latch circuit (e.g., T flip-flop) with non-destructive readout (NRTFF) and/or a given SFQ circuit block with a storage loop (e.g., SFQ/DC converter circuit). We reinterpret an SFQ pulse as an instruction for the logic gate to change its internal state to a new state, and possibly output an SFQ pulse to downstream logic gates depending on the new state. In other words, an SFQ pulse does not represent a logic 1, but rather represents that there should be a change in state in some storage element downstream, which has a storage loop.

Furthermore, exemplary embodiments of the disclosure include clockless SFQ logic circuit architectures which are constructed using a configurable logic gate that can be configured and reconfigured (via initialization of input and/or outputs) to provide one of various types of SFQ logic gates, such as AND, NAND, OR, NOR, IMPLY, and NIMPLY logic gates, as needed for a given combinational logic circuit. In some embodiments, a combinational logic circuit comprises one or more instances of the configurable logic gate that are configured as desired to implement, e.g., basic logic gates, e.g., AND, NAND, OR, and/or NOR gates, etc., that are coupled together to construct combinational logic circuits, e.g., adders, encoders, decoders, multiplexers, demultiplexers, etc., for a given application. The logic gates and combinational logic circuitry, which are constructed by deploying and configuring one or more instances of the configurable logic gate, are configured to operate in a clockless manner and without relying on upon any self-resetting functionality.

Advantageously, the exemplary clockless SFQ logic circuit architectures as discussed herein allow for a relaxation of the strict timing requirements and constraints associated with clocked SFQ logic gates and dynamic, self-resetting clockless SFQ logic gates which are defined by reset times of dynamic storage loops. In particular, the exemplary embodiments of clockless SFQ logic circuits with configurable logic circuitry obviate the need to use clock signals and clock distribution trees to distribute clock signals to clocked SFQ logic gates to control logic operations and reset internal states of the clocked SFQ logic gates.

In addition, the exemplary embodiments of clockless SFQ logic circuits with configurable logic circuitry eliminates the need to implement SFQ logic gates with self-resetting circuitry to automatically reset the internal states of the SFQ logic gates, wherein the self-resetting circuitry imposes relatively strict timing requirements and constraints to enable dynamic self-resetting of an internal state of the dynamic storage loop circuit based on, e.g., a time constant for resetting the internal state to a ground state. Moreover, the exemplary embodiment of clockless SFQ logic circuits with configurable logic circuitry enables configurability of SFQ logic gates by initializing the internal states of one or more clockless gates that hold internal state.

FIG. 1 is a block diagram of a configurable logic gate having a configurable logic architecture, according to an exemplary embodiment of the disclosure. In particular, FIG. 1 illustrates a configurable logic gate 100 (illustratively referred to herein as a "configurable core logic gate" or "core logic gate") which comprises a first input port 101 (denoted input port A), a second input port 102 (denoted input port B), an output port 103 (denoted output port OUT), a first SFQ splitter 110-1, a second SFQ splitter 110-2, a first toggle (T) flip-flop (TFF) 120-1, a second T flip-flop 120-2, and a confluence buffer (CB) 130. The first and second SFQ splitters 110-1 and 110-2 each comprise an input port (denoted input port IN), first output port (denoted output port Z1), and second output port (denoted output port Z2). The first and second T flip-flops 120-1 and 120-2 each comprise a first input port (denoted input port T), a second input port (denoted input port RI), a first output port (denoted output port C), and a second output port (denoted output port RO).

The confluence buffer 130 comprises a first input port (denoted input port A), a second input port (denoted input port B), and an output port (denoted output port Z).

As schematically illustrated in FIG. 1, the first and second input ports 101 and 102 of the core logic gate 100 are coupled to the respective input ports IN of the first and second SFQ splitters 110-1 and 110-2. The output port Z1 of the first SFQ splitter 110-1 is coupled to the input port T of the first T flip-flop 120-1. The output port Z2 of the first SFQ splitter 110-1 is coupled to the input port RI of the second T flip-flop 120-2. The output port Z1 of the second SFQ splitter 110-2 is coupled to the input port RI of the first T flip-flop 120-1. The output port Z2 of the second SFQ splitter 110-1 is coupled to the input port T of the second T flip-flop 120-2. The output port RO of the first T flip-flop 120-1 is coupled to the input port A of the confluence buffer 130. The output port RO of the second T flip-flop 120-2 is coupled to the input port B of the confluence buffer 130. The output port Z of the confluence buffer 130 is coupled to the output port 103 of the core logic gate 100. In some embodiments, the output ports C of the first and second T flip-flops 120-1 and 120-2 are not used for logic operations, and can be terminated to ground or connected to a monitoring circuit to monitor the output signals on the output ports C to ensure that the first and second T flip-flops 120-1 and 120-2 are operating as expected.

In an exemplary embodiment, the first and second SFQ splitters 110-1 and 110-2 have a same circuit architecture, an exemplary embodiment of which will be discussed in further detail below in conjunction with FIG. 9. In operation, the first SFQ splitter 110-1 is configured to convert an SFQ pulse (denoted A_Pulse) into first and second SFQ pulses which are output from the first and second output ports Z1 and Z2 thereof, without a significant decrease in the amplitude of the voltage. Similarly, the second SFQ splitter 110-2 is configured to convert an SFQ pulse (denoted as B_Pulse) into first and second SFQ pulses which are output from the first and second output ports Z1 and Z2 thereof, without a significant decrease in the amplitude of the voltage.

In an exemplary embodiment, the first and second T flip-flops 120-1 and 120-2 have a same circuit architecture, an exemplary embodiment of which will be discussed in further detail below in conjunction with FIG. 11. In some embodiments, the first and second T flip-flops 120-1 and 120-2 each comprise a nondestructive readout (NDRO) cell architecture. The respective input ports T of the first and second T flip-flops 120-1 and 120-2 are the toggle inputs of the T flip-flops. The first and second T flip-flops 120-1 and 120-2 each have two stable states, including a first state ("1") in which a fluxon is stored inside a superconducting storage loop, and a second state ("0") in which no fluxon is stored inside the superconducting storage loop. Each SFQ pulse applied to the input port T of a given T flip-flop triggers the switching of the T flip-flop to the opposite state.

In particular, when a given T flip-flop is in the "0" state, an input SFQ pulse at the input port T switches the given T flip-flop to the "1" state. On the other hand, when a given T flip-flop is in the "1" state, an input SFQ pulse at the input port T switches the given T flip-flop to the "0" state. The switching of the state of the T flip-flop from "1" to "0" results in an SFQ pulse being output from the output port C (i.e., the frequency of the output SFQ pulses on the output port C is ½ of the frequency of the input SFQ pulses on the input port T). In some embodiments, the respective output ports C of the first and second T flip-flops 120-1 and 120-2 are not utilized, and are left open. In other embodiment, the respective output ports C of the first and second T flip-flops 120-1 and 120-2 are neglected and generally left open but can be connected to respective Josephson transmission lines to monitor the operation of the first and second T flip-flops 120-1 and 120-2, if desired for a given application.

The respective input ports RI the first and second T flip-flops 120-1 and 120-2 are readout control ports of the T flip-flops. When an SFQ pulse is applied to the input port RI of a given T flip-flop, an SFQ pulse will be output from the output port RO, if the given T flip-flop is in the "1" state (in which case, the "1" state is read out from the T flip-flop). On the other hand, when an SFQ pulse is applied to the input port RI of a given T flip-flop, no SFQ pulse will be output from the output port RO, if the given T flip-flop is in the "0" state (in which case, the "0" state is read out from the T flip-flop).

The confluence buffer 130 is configured to merge SFQ pulses from two input lines, which are coupled to the first and second input ports A and B, onto a common output line coupled to the output port Z. When an input SFQ pulse arrives at the first input port A, an output SFQ pulse appears at the output port Z. When an input SFQ pulse arrives at the second input port B, an output SFQ pulse appears at the output port Z. The confluence buffer 130 is configured to prevent an SFQ pulse being output from the input port B when an input SFQ pulse is applied to the input port A, and vice versa. An exemplary embodiment of a circuit architecture of the confluence buffer 130 will be discussed in further detail below in conjunction with FIG. 12A.

The core logic gate 100 generally operates as follows. The first SFQ splitter 110-1 is configured to feed an input SFQ pulse (A_Pulse), which is applied to the first input port 101, to the input port T of the first T flip-flop 120-1 and to the control input port RI of the second T flip-flop 120-2. In this regard, the input A_Pulse causes (i) the first T flip-flop 120-1 to toggle its state and (ii) the second T flip-flop to non-destructively readout its state on the output port RO. Similarly, the second SFQ splitter 110-2 is configured to feed an input SFQ pulse (B_Pulse), which is applied to the second input port 102, to the input port T of the second T flip-flop 120-2 and to the control input port RI of the first T flip-flop 120-1. In this regard, the input B_Pulse causes (i) the second T flip-flop 120-2 to toggle its state and (ii) the first T flip-flop 120-1 to non-destructively readout its state on the output port RO. The confluence buffer 130 passes the non-destructive read out signals from either of the readout ports RO to the output port 103. In other words, if either T flip-flop is read while in an excited state, it will pass an SFQ pulse to the confluence buffer 130, resulting in an SFQ pulse on the output port 103 of the core logic gate 100.

Figure 2:
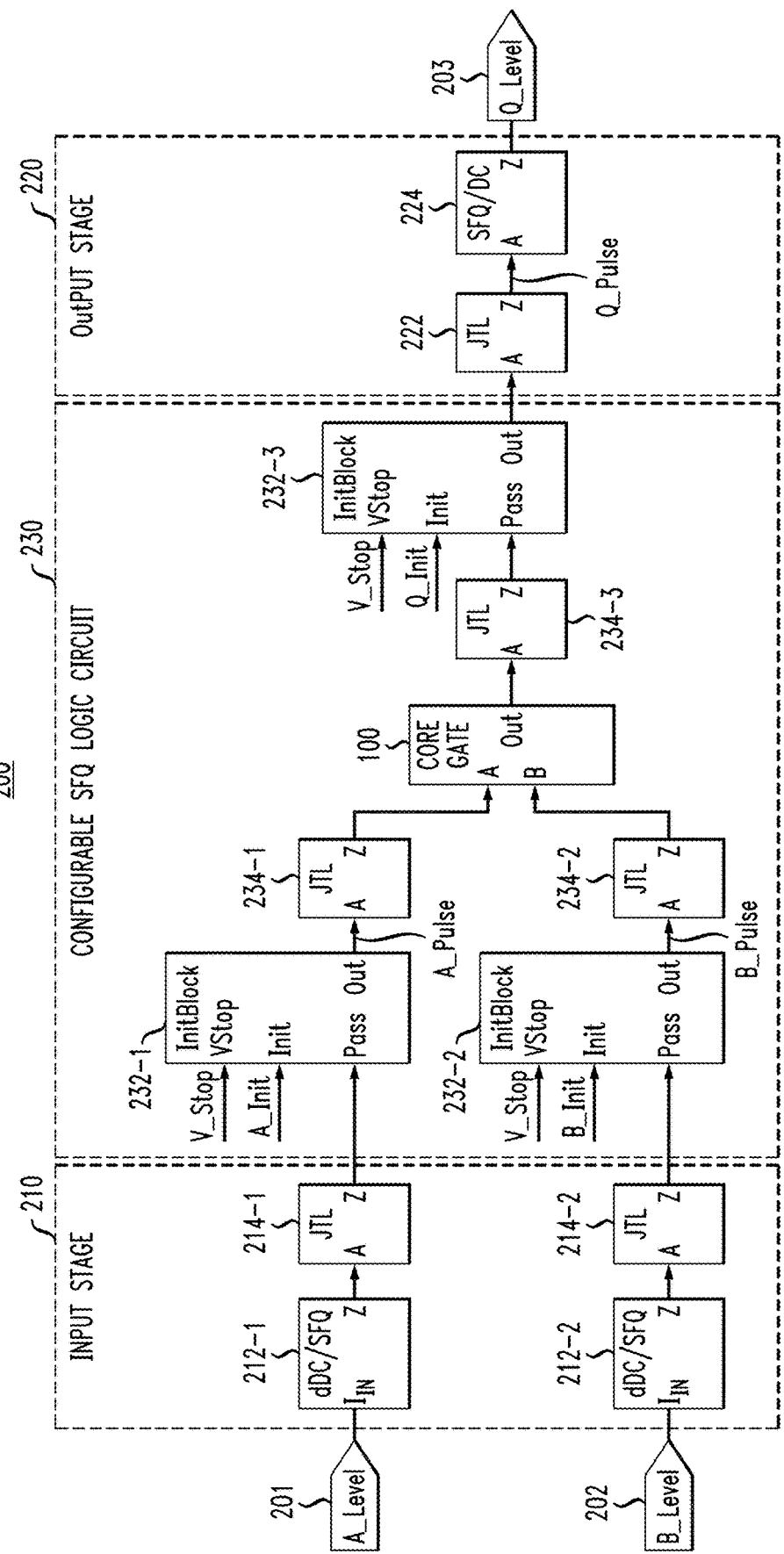
FIG. 2 is a block diagram of clockless SFQ logic circuitry comprising a configurable logic circuit, according to an exemplary embodiment of the disclosure.

As noted above, in some embodiments, the core logic gate 100 can be utilized to implement a configurable logic circuit, where the configurable logic circuit can be configured to implement one of a plurality of different logic gates including, for example, an AND gate, a NAND gate, an OR gate, a NOR gate, an IMPLY gate, and a NIMPLY gate. For example, FIG. 2 is a block diagram of clockless SFQ logic circuitry comprising a configurable logic circuit, according to an exemplary embodiment of the disclosure. More specifically, FIG. 2 is a block diagram of clockless SFQ logic circuitry 200 which comprises a first input port 201, a second input port 202, an output port 203, an input stage 210, and output stage 220, and a configurable SFQ logic circuit 230 coupled between the input and output stages 210 and 220.

The input stage 210 comprises a first dual-output DC/SFQ (dDC/SFQ) converter 212-1, a second dDC/SFQ converter 212-2, a first Josephson transmission line (JTL) 214-1, and a second JTL 214-2. The output stage 220 comprises a JTL 222, and an SFQ/DC converter 224. The configurable SFQ logic circuit 230 comprises the core logic gate 100, a first state initialization block 232-1 (or first InitBlock), a second state initialization block 232-2 (or second InitBlock), a third state initialization block 232-3 (or third InitBlock), a first JTL 234-1, a second JTL 234-2, and a third JTL 234-3. The first and second dDC/SFQ converters 212-1 and 212-2 each comprises a respective input port $I_{IN}$ and a respective output port Z. Each JTL 214-1, 214-2, 222, 234-1, 234-2, and 234-3 comprises a respective input port A and a respective output port Z. Each state initialization block 232-1, 232-2, and 232-3 comprises a respective first input port (denoted Pass), second input port (denoted Init), control input port (denoted VStop), and output port (denoted Out).

The first and second dDC/SFQ converters 212-1 and 212-2 are each configured to convert two-level signals (e.g., binary signals, digital signal, logic signal, etc.) to SFQ pulses. More specifically, in some embodiments, the first and second dDC/SFQ converters 212-1 and 212-2 are each configured to receive two-level current signals, which are input to the input ports $I_{IN}$, and generate and output SFQ pulses on the output port Z, wherein an SFQ pulse is generated on a rising edge of the two-level input signal, and on a falling edge of the two-level input signal. It is to be noted that the term "two-level signal" as used herein is to be broadly construed to be any waveform (e.g., current waveform or voltage waveform) that switches between two states (or DC levels) including a 0 state (e.g., logic low) and a 1 state (e.g., logic high). In an exemplary embodiment, the first and second dDC/SFQ converters 212-1 and 212-2 have a same circuit architecture, an exemplary embodiment of which will be discussed in further detail below in conjunction with FIG. 10.

The SFQ/DC converter 224 is configured to convert SFQ pulses to a two-level level signal on output port Z thereof, which is output from the output port 203 of the clockless SFQ logic circuitry 200. In some embodiments, the SFQ/DC converter 224 is configured to output a two-level voltage signal which represents a result of a logical operation or operations performed in response to two-level current input signals applied to the first and second input ports 201 and 202. In an exemplary embodiment, the SFQ/DC converter 224 comprises a superconducting storage loop that may be used to actively initialize a state of the SFQ/DC converter 224, as needed, to configure a desired logic gate, as will be explained in further detail below. An exemplary embodiment of the SFQ/DC converter 224 will be discussed below in conjunction with FIG. 13.

The JTLs 214-1, 214-2, 222, 234-1, 234-2, and 234-3 are optional SFQ circuit blocks that can be used as buffers to interconnect the various inputs and outputs of the circuit blocks shown in FIG. 2. In some embodiments, the JTLs 214-1, 214-2, 222, 234-1, 234-2, and 234-3 each comprise a two-stage, non-amplifying JTL architecture, an exemplary embodiment of which will be discussed in further detail below in conjunction with FIG. 8A.

The first, second, and third state initialization blocks 232-1, 232-2, and 232-3 are configured for use in programming the internal states of downstream gates to initial states (into either logic 1 level or logic 0 level), as needed, for a given logic gate configuration. For example, in the exemplary embodiment of FIG. 2, the first and second state initialization blocks 232-1, and 232-2 are used to initialize the internal states of the first and second T flip-flops 120-1 and 120-2 of the core logic gate 100, as needed, for a given logic gate configuration. Moreover, the third state initialization blocks 232-3 is used to initialize the internal state of the SFQ/DC converter 224, as needed, for a given logic gate configuration.

In general, the first, second, and third state initialization blocks 232-1, 232-2, and 232-3 operate as follows. A control voltage (denoted V_Stop) is applied to the control input port VStop of each state initialization block. During normal operation, the control voltage V_Stop is asserted to a logic "1" level (e.g., the level of the bias voltage VB that is applied to the various logic and circuit blocks), which allows an input SFQ pulse applied to the input port Pass of a given state initialization block to pass through to the output port Out of the given state initialization block. On the other hand, during an initialization process, the control voltage V_Stop is asserted to a logic "0" level (e.g., zero (0) volts) which prevents/blocks any input SFQ pulse applied to the input port Pass from passing to the output port Out, and a state initialization SFQ pulse can be applied to the input port Init and passed to the output port Out of the given state initialization block.

For example, to initialize a state of the first T flip-flop 120-1 of the core logic gate 100 using the first state initialization block 232-1, a control voltage (V_Stop) of, e.g., 0V is applied to the control input ports VStop of the first, second, and third state initialization blocks 232-1, 232-2, and 232-3, and an initialization SFQ pulse A_Init is applied to the input port Init of the first state initialization block 232-1. As a result, an initialization SFQ pulse is output from the output port Out of the first state initialization block 232-1, and applied to the input port A of the core logic gate 100 to toggle the internal state of the first T flip-flop 120-1. The second and third state initialization blocks 232-2 and 232-3 operate in a similar manner to either allow pulses from traveling forward or introduce extra pulses during the initialization/startup to controllably set the initial state of the target gates. In some embodiments, the first, second, and third state initialization blocks 232-1, 232-2, and 232-3 have a same blocking confluence buffer circuit architecture, an exemplary embodiment of which will be discussed below in conjunction with FIG. 12B.

The state initialization SFQ pulses (e.g., A_Init, B_Init, and Q_Init, FIG. 2), which are applied to the input ports Init of the state initialization blocks, are generated by control circuitry which is configured to control gate initialization operations for configuring clockless SFQ logic circuitry, as discussed herein. For example, in some embodiments, the control circuitry comprises standard DC/SFQ circuits with outputs coupled to JTL buffer circuits, wherein each DC/SFQ circuit is configured to receive a current signal (which transitions from 0 to 500 uA) and generate/output a single SFQ pulse (state initialization SFQ pulse) only on, e.g., the rising edge on the input current signal. Further, in some embodiments, the control circuitry is configured to generate the control voltages (V_Stop) that are applied to the control input ports VStop of the state initialization blocks.

FIG. 2 illustrates an exemplary embodiment in which the clockless SFQ logic circuitry 200 can be configured to implement any one of an AND logic gate, a NAND logic gate, an OR logic gate, a NOR logic gate, an IMPLY logic gate, or a NIMPLY logic gate by controlling the configurable SFQ logic circuit 230 to initialize internal states of the core logic gate 100 and/or the SFQ/DC converter 224, as needed, to implement a desired logic gate. Exemplary modes of operation of the clockless SFQ logic circuitry 200 will now be discussed in further detail in conjunction with FIGS. 3A and 3B, and FIGS. 4A-4F.

Figures 3A, 3B:
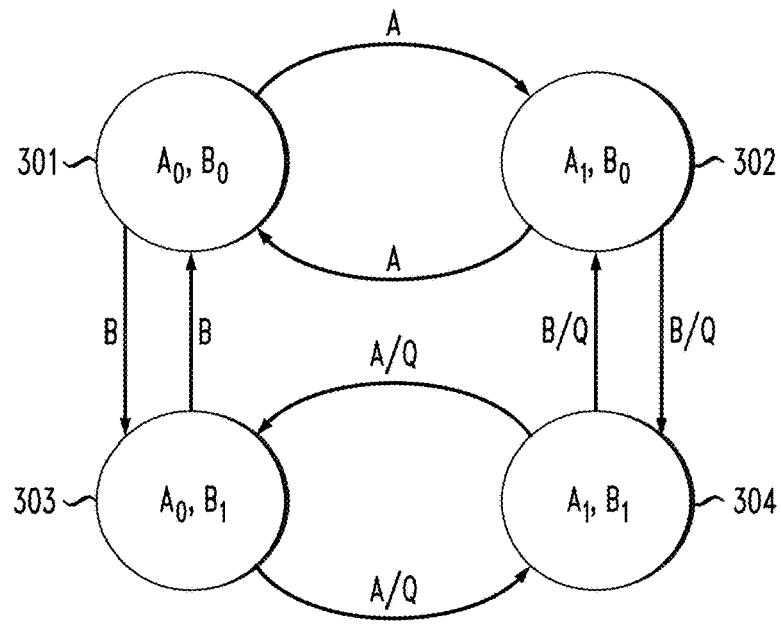
FIG. 3A depicts a finite state machine diagram which represents operating behaviors of the clockless SFQ logic circuitry of FIG. 2, according to an exemplary embodiment of the disclosure.
FIG. 3B illustrates a table of logic values that represent various operating states of the clockless SFQ logic circuitry of FIG. 2 when configured to implement an AND logic gate, according to an exemplary embodiment of the disclosure.

For example, FIG. 3A depicts a finite state machine diagram 300 which represents operating behaviors of the clockless SFQ logic circuitry 200, according to an exemplary embodiment of the disclosure. The finite state machine diagram 300 comprises a directed graph which comprises a plurality of states 301, 302, 303, and 304 (represented by nodes), and edges (represented by arrows) which represent transitions from one state to another. Each arrow is labeled with an input that triggers that transition. The states 301, 302, 303, and 304 represent internal states Ai, Bi of the respective first and second T flip-flops 120-1 and 120-2 of the core logic gate 100. The transitions labeled A represent an SFQ pulse (A_Pulse) applied to the first input port 101 (A port) of the core logic gate 100, and the transitions labeled B represent an SFQ pulse (B_Pulse) applied to the second input port 102 of the core logic gate 100. The transitions that are also labeled with/Q representing the outputs associated with the transitions, namely, the SFQ pulse output from the output port 103 of the core logic gate 100.

A finite state machine is defined by a list of its states, its initial state, and inputs that trigger each transition. The finite state machine diagram 300 illustrates different logic gate behaviors depending on which state 301, 302, 303, and 304 is deemed the initial state of the finite state machine. For example, for AND gate operation, the state 301 ($A_0$, $B_0$) is deemed the initial state of the finite state machine, where the first and second T flip-flops 120-1 and 120-2 each have an initial "0" state. Further, for OR gate operation, the state 304 ($A_1$, $B_1$) is deemed the initial state of the finite state machine, where the first and second T flip-flops 120-1 and 120-2 each have an initial "1" state.

FIG. 3B illustrates a table of logic values that represent various operating states of the clockless SFQ logic circuitry 200 when configured to implement an AND logic gate, according to an exemplary embodiment of the disclosure. In particular, FIG. 3B illustrates a table 310 which illustrates logic values and state transitions associated with various signals and internal states of gates. For example, A_Level and B_Level denote the input levels (of two-level signals) applied to the first and second input ports 201 and 202, respectively. A_Pulse and B_Pulse denote SFQ pulses that are generated by the first and second dDC-SFQ blocks 212-1 and 212-2, respectively, wherein the A_Pulse is applied to the input port A of the core logic gate 100 (the A path), and the B_Pulse is applied to the input port B of the core logic gate 100 (the B path). TFF-A denotes an internal state of the superconducting loop of the NDRO of the first T flip-flop 120-1. TFF-B denotes an internal state of the superconducting loop of the NDRO of the second T flip-flop 120-2. Q_Pulse denotes a signal which is output from the core logic gate 100. Q_Level denotes the input level of the two-level signal that is output from the SFQ/DC converter 224.

For the basic AND gate logic, the internal states of the first and second T flip-flops 120-1 and 120-1 of the core logic gate 100, and the internal state of the SFQ/DC converter 224 are initialized to the "0" state. This shown, for example, in a first row of the table 310 where TFF-A, TFF-B, and Q_Level have a "0" logic level. The table 310 illustrates a pattern of test vectors with an initialization state (as shown the first row) where all signals and internal states are at the "0" level. For the basic AND Gate logic, table 310 shows that when both A_Level and B_Level input are high ("1" logic level), then Q_Level is high.

Figure 4A:
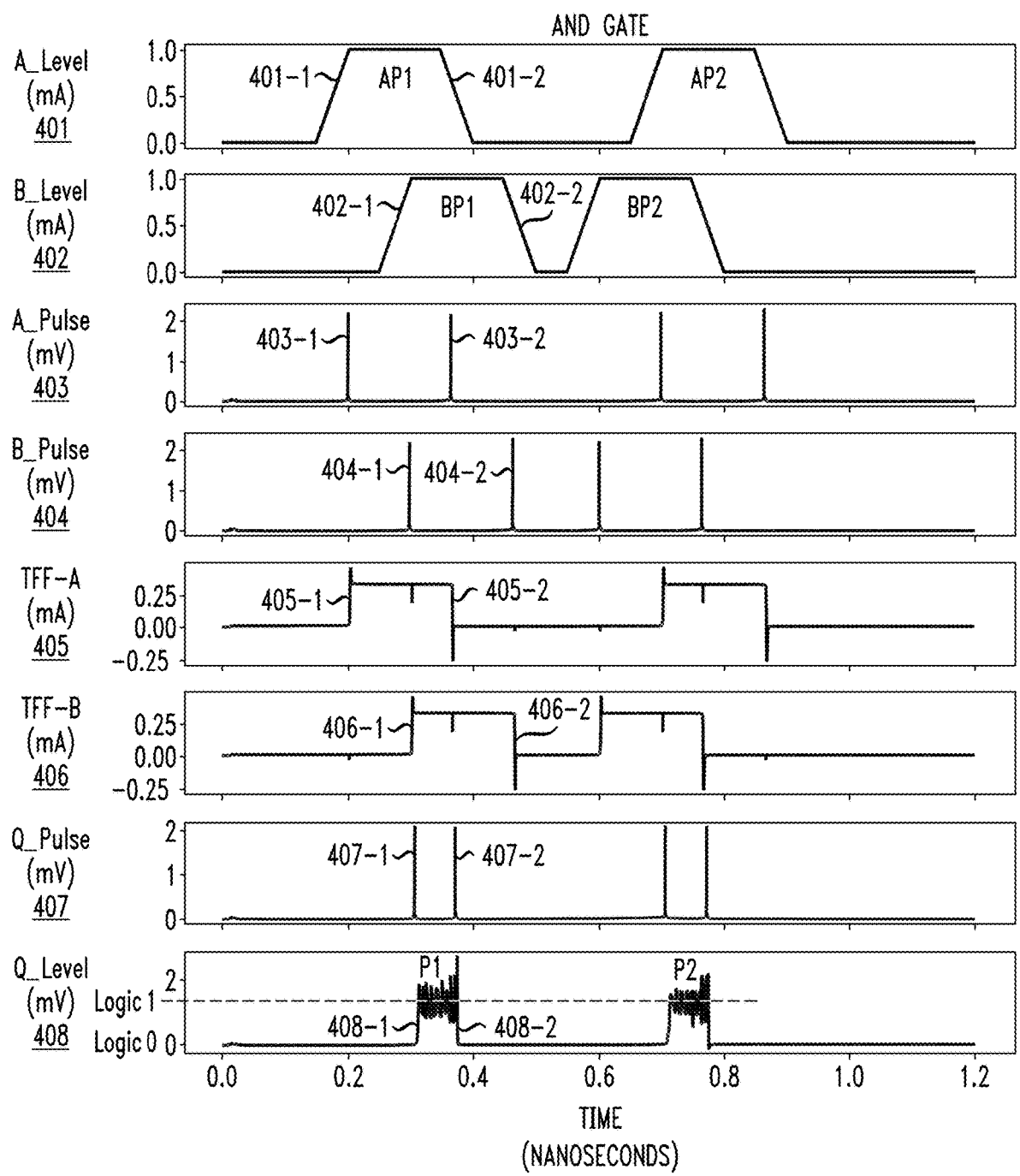
FIG. 4A depicts waveform diagrams that illustrate an exemplary mode of operation of the clockless SFQ logic circuitry of FIG. 2 when configured to implement an AND logic gate, according to an exemplary embodiment of the disclosure.

FIG. 4A depicts waveform diagrams 400 that illustrate an exemplary mode of operation of the clockless SFQ logic circuitry 200 of FIG. 2 when configured to implement an AND logic gate, according to an exemplary embodiment of the disclosure. In particular, FIG. 4A illustrates an A_Level input waveform 401 and a B_Level input waveform 402, which are input to the first and second input ports 201 and 202 of the clockless SFQ logic circuitry 200. In some embodiments, the A_Level input waveform 401 and the B_Level input waveform 402 each comprise a two-level current waveform with a "0" logic level corresponding to zero (0) milliamps (mA), and a "1" logic level corresponding to about 1 mA.

Moreover, FIG. 4A illustrates an A_Pulse waveform 403 and a B_Pulse waveform 404, which represent waveforms that are input to the first and second input ports A and B, respectively, of the core logic gate 100. The A_Pulse waveform 403 and a B_Pulse waveform 404 are generated by the first and second dDC/SFQ converters 212-1 and 212-2, respectively, in response to the respective A_Level and B_Level input waveforms 401 and 402. More specifically, as shown in FIG. 4A, the A_Pulse waveform 403 comprises SFQ pulses that are generated in response to each rising edge and each falling edge of the A_Level input waveform 401, and the B_Pulse waveform 404 comprises SFQ pulses that are generated in response to each rising edge and each falling edge of the B_Level input waveform 403.

FIG. 4A further illustrates a TFF-A waveform 405 and a TFF-B waveform 406, which represent internal states of the respective first and second T flip-flops 120-1 and 120-2 of the core logic gate 100. The TFF-A waveform 405 and the TFF-B waveform 406 comprise current waveforms that represent a level of circulating current in respective superconducting storage loops of the respective first and second T flip-flops 120-1 and 120-2. In some embodiments, the TFF-A waveform 405 and the TFF-B waveform 406 each comprise a two-level current waveform with a "0" logic level corresponding to zero (0) milliamps (mA) (no circulating current), and a "1" logic level corresponding to about 0.25 mA.

Next, a Q_Pulse waveform 407 comprises SFQ pulses that are output from the core logic gate 100 and input to the SFQ/DC converter 224. A Q_Level waveform 408 represents a two-level voltage output signal that is generated by the SFQ/DC converter 224 based on the Q_Pulse waveform 407. As shown in FIG. 4A, the Q_Level waveform 408 is two-level voltage waveform with a "0" logic level corresponding to zero (0) millivolts (mV), and a "1" logic level corresponding to an average DC level (represented by a dashed line) of a fluctuating voltage output signal. More specifically, in some embodiments, the SFQ/DC converter 224 is configured to output a logic "1" level as a series of SFQ pulses at a maximum rate in the order of hundreds of GHz (e.g., 640 GHz), resulting in a fluctuating output of overlapping SFQ pulses. As such, the output logic "1" level is represented by the DC voltage offset (or average voltage) of the fluctuating voltage output of overlapping SFQ pulses.

FIG. 4A illustrates that all waveforms 401-408 are initially at 0 levels (at time 0.0 ns). For example, as noted above, for an AND logic gate configuration, the first and second T flip-flops 120-1 and 120-2 of the core logic gate 100 each have an internal state that is initialized to the "0" state (as shown by the respective TFF-A and TFF-B waveforms 405 and 406), and the SFQ/DC converter 224 has an internal state that is initialized to the "0" state (as shown by the Q_Level waveform 408 that is output from the SFQ/DC converter 224). In some embodiments, the AND logic gate is configured by default upon start up.

Next, a first rising edge 401-1 of the A_Level input waveform 401 triggers an SFQ pulse 403-1 in the A_Pulse waveform 403 which is output from the first dDC/SFQ converter 212-1. The SFQ pulse 403-1 is applied to the input port A of the core logic gate 100, which causes a change in the state of the first T flip-flop 120-1 and causes a non-destructive readout of the state of the second T flip-flop 120-2. For example, the SFQ pulse 403-1 triggers a change in the internal state of the first T flip-flop 120-1, which is shown by a transition 405-1 of the TFF-A waveform 405 from the "0" state to the "1" state. In addition, since the internal state of the second T flip-flop 120-2 is in the "0" state, the non-destructive readout of the second T flip-flop 120-2 remains at a logic "0" level, which is shown by the Q_Pulse waveform 407 remaining at a logic "0" level in response to the SFQ pulse 403-1.

Next, a first rising edge 402-1 of the B_Level input waveform 402 triggers an SFQ pulse 404-1 in the B_Pulse waveform 404 which is output from the second dDC/SFQ converter 212-2. The SFQ pulse 404-1 is applied to the input port B of the core logic gate 100, which causes a change in the state of the second T flip-flop 120-2 and causes a non-destructive readout of the state of the first T flip-flop 120-1. For example, the SFQ pulse 404-1 triggers a change in the internal state of the second T flip-flop 120-2, which is shown by a transition 406-1 of the TFF-B waveform 406 from the "0" state to the "1" state. In addition, since the internal state (TFF_A) of the first T flip-flop 120-1 is in the "1" state, the non-destructive readout of the first T flip-flop 120-1 triggers an SFQ pulse 407-1 in the Q_Pulse waveform 407 to be output and applied to the input port A of the SFQ/DC converter 224. The SFQ pulse 407-1 triggers a state transition of the SFQ/DC converter 224, as shown by a transition 408-1 in the Q_Level waveform 408 from the logic "0" state to the logic "1" state.

Next, a first falling edge 401-2 of the A_Level input waveform 401 triggers an SFQ pulse 403-2 in the A_Pulse waveform 403 which is output from the first dDC/SFQ converter 212-1. The SFQ pulse 403-2 is applied to the input port A of the core logic gate 100, which causes a change in the state of the first T flip-flop 120-1 and causes a non-destructive readout of the state of the second T flip-flop 120-2. For example, the SFQ pulse 403-2 triggers a change in the internal state of the first T flip-flop 120-1, which is shown by a transition 405-2 of the TFF-A waveform 405 transition from the "1" state to the "0" state. In addition, since the internal state of the second T flip-flop 120-2 is in the "1" state, the non-destructive readout of the second T flip-flop 120-2 triggers an SFQ pulse 407-2 in the Q_Pulse waveform 407 to be output and applied to the input port A of the SFQ/DC converter 224. The SFQ pulse 407-2 triggers a state transition of the SFQ/DC converter 224, as shown by a transition 408-2 in the Q_Level waveform 408 from the logic "1" state to the logic "0" state.

Next, a first falling edge 402-2 of the B_Level input waveform 402 triggers an SFQ pulse 404-2 in the B_Pulse waveform 404 which is output from the second dDC/SFQ converter 212-2. The SFQ pulse 404-2 is applied to the input port B of the core logic gate 100, which causes a change in the state of the second T flip-flop 120-2 and causes a non-destructive readout of the state of the first T flip-flop 120-1. For example, the SFQ pulse 404-2 triggers a change in the internal state of the second T flip-flop 120-2, which is shown by a transition 406-2 in the TFF-B waveform 406 from the "1" state to the "0" state. In addition, since the internal state of the first T flip-flop 120-1 is in the "0" state, the non-destructive readout of the first T flip-flop 120-1 remains at a logic "0" level, which is shown by the Q_Pulse waveform 407 remaining at a logic "0" level in response to the SFQ pulse 404-2.

FIG. 4A shows the AND logic gate operation wherein the Q_Level waveform 408 is asserted to a logic "1" level during a period in which the A_Level input waveform 401 and the B_Level input waveform 402 are both asserted to logic "1" levels, and wherein the Q_Level waveform 408 is asserted to a logic "0" level otherwise. In particular, FIG. 4A shows that the Q_Level waveform 408 is asserted to a logic "1" level during a first period P1 in response to a first A_Level input pulse (denoted AP1) and a first B_Level input pulse (denoted BP1), wherein AP1 is an "early pulse" and BP1 is a "late pulse" which arrives after AP1. In addition, FIG. 4A shows that the Q_Level waveform 408 is asserted to a logic "1" level during a second period P2 in response to a second A_Level input pulse (denoted AP2) and a second B_Level input pulse (denoted BP2), wherein BP2 is an "early pulse" and AP2 is a "late pulse" which arrives after BP2. The various state transitions and SFQ pulse signal events that occur in response to the input pulses AP2 and BP2 is similar to the state transitions and SFQ pulse signal events that occur in response to the input pulses AP1 and BP1, as discussed above, the details of which are shown by the waveform diagrams of FIG. 4A and will not be repeated.

As noted above, the clockless SFQ logic circuitry 200 in FIG. 2 can be configured to implement a NAND logic gate. In some embodiments, a NAND logic gate is implemented by performing an initialization process to initialize the internal state of the SFQ/DC converter 224 to a "1" state (as opposed to a "0" state for the AND gate configuration). For example, in some embodiments, referring to FIG. 2, the clockless SFQ logic circuitry 200 can be configured to implement a NAND logic gate by utilizing the third state initialization block 232-3 to input a single initialization SFQ pulse (denoted Q_Init) to the input port Init of the third state initialization block 232-3 and applying a control voltage to the control port VStop to allow the initialization SFQ pulse to pass through to the output port OUT of the third state initialization block 232-3 and propagate to the input port A of the SFQ/DC converter 224. The initialization SFQ pulse causes the state of the SFQ/DC converter 224 to transition from the "0" state to the "1" state, which inverts the Q_Level output, which is equivalent to adding a NOT gate to the output of the AND gate.

Figure 4B:
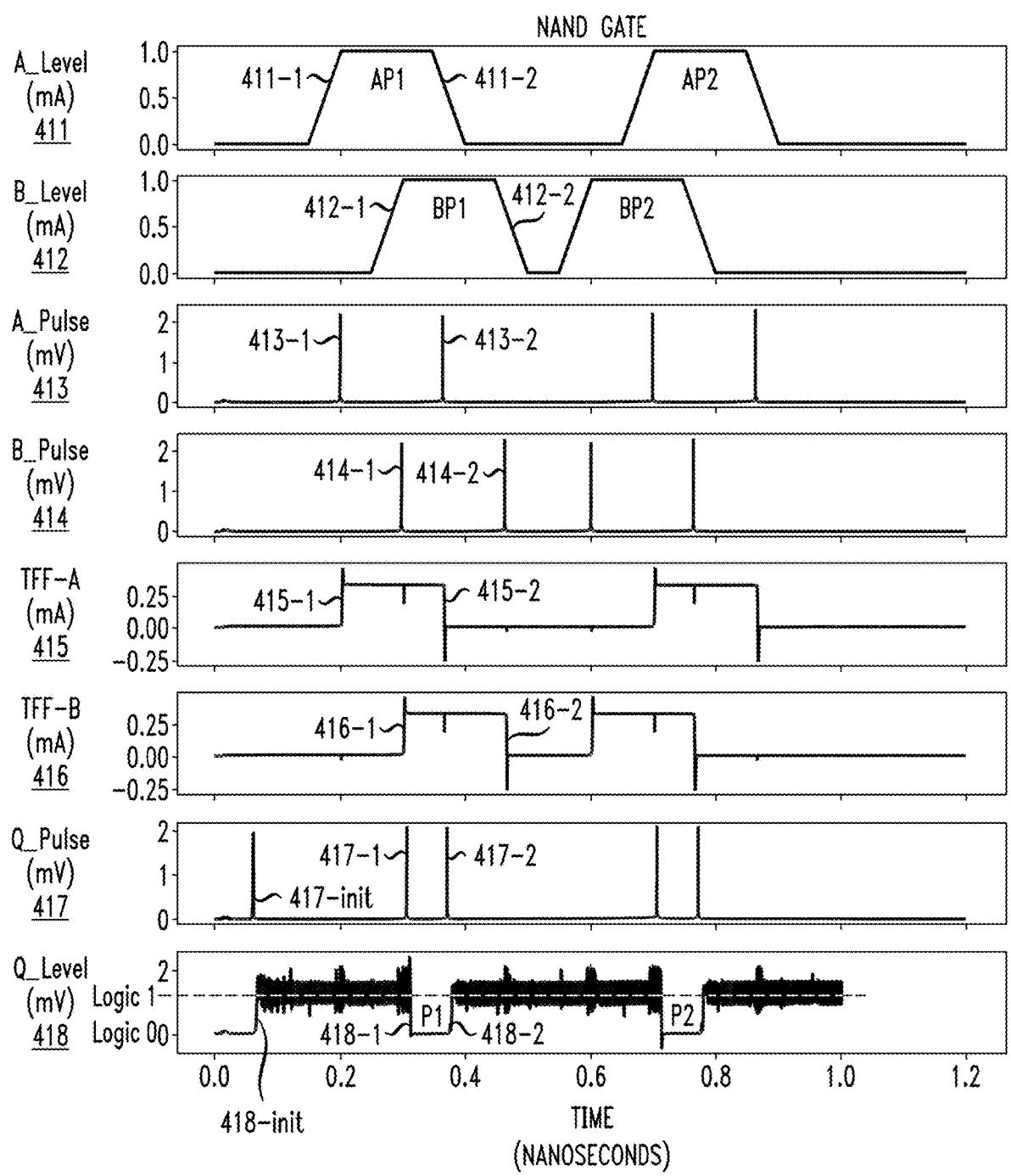
FIG. 4B depicts waveform diagrams that illustrate an exemplary mode of operation of the clockless SFQ logic circuitry of FIG. 2 when configured to implement a NAND logic gate, according to an exemplary embodiment of the disclosure.

FIG. 4B depicts waveform diagrams 410 that illustrate an exemplary mode of operation of the clockless SFQ logic circuitry of FIG. 2 when configured to implement a NAND logic gate, according to an exemplary embodiment of the disclosure. Similar to the waveforms shown in FIG. 4A, the waveform diagrams in FIG. 4B include (i) an A_Level input waveform 411 and a B_Level input waveform 412, which are input to the first and second input ports 201 and 202 of the clockless SFQ logic circuitry 200, (ii) an A_Pulse waveform 413 and a B_Pulse waveform 414, which represent output waveforms of the first and second dDC/SFQ converters 212-1 and 212-2, (iii) a TFF-A waveform 415 and a TFF-B waveform 416, which represent internal states of the respective first and second T flip-flops 120-1 and 120-2, (iv) a Q_Pulse waveform 417 which represents an output of the core logic gate 100, and (v) a Q_Level waveform 418, which represents an output of the SFQ/DC converter 224.

FIG. 4B illustrates that all waveforms 411-418 are initially at 0 levels (at time 0.0 ns), similar to the default AND gate configuration. However, FIG. 4B shows an initialization process in which an initialization SFQ pulse 417-init is injected into the output stage 220 and applied to the input of the SFQ/DC converter 224. The initialization SFQ pulse 417-init triggers a state transition of the SFQ/DC converter 224, as shown by a transition 418-init in the Q_Level waveform 418 from the logic "0" state to the logic "1" state, which results in configuring the AND gate to a NAND gate (e.g., AND gate with inverted output). Following the initialization process, since the A_Level input waveform 411 and the B_Level input waveform 412 are both at logic "0" levels, the Q_Level waveform 418 remains at a logic "1" level.

Next, a rising edge 411-1 of the A_Level input waveform 411 triggers an SFQ pulse 413-1 in the A_Pulse waveform 413 which is output from the first dDC/SFQ converter 212-1. The SFQ pulse 413-1 is applied to the input port A of the core logic gate 100, which causes a change in the state of the first T flip-flop 120-1 and causes a non-destructive readout of the state of the second T flip-flop 120-2. For example, the SFQ pulse 413-1 triggers a change in the internal state of the first T flip-flop 120-1, which is shown by a transition 415-1 of the TFF-A waveform 415 from the "0" state to the "1" state. In addition, since the internal state of the second T flip-flop 120-2 is in the "0" state, the non-destructive readout of the second T flip-flop 120-2 remains at a logic "0" level, which is shown by the Q_Pulse waveform 417 remaining at a logic "0" level in response to the SFQ pulse 413-1. Consequently, the Q_Level waveform 418 remains at a logic "1" level.

Next, a rising edge 412-1 of the B_Level input waveform 412 triggers an SFQ pulse 414-1 in the B_Pulse waveform 414 which is output from the second dDC/SFQ converter 212-2. The SFQ pulse 414-1 is applied to the input port B of the core logic gate 100, which causes a change in the state of the second T flip-flop 120-2 and causes a non-destructive readout of the state of the first T flip-flop 120-1. For example, the SFQ pulse 414-1 triggers a change in the internal state of the second T flip-flop 120-2, which is shown by a transition 416-1 of the TFF-B waveform 416 from the "0" state to the "1" state. In addition, since the internal state (TFF_A) of the first T flip-flop 120-1 is in the "1" state, the non-destructive readout of the first T flip-flop 120-1 triggers an SFQ pulse 417-1 in the Q_Pulse waveform 417 to be output and applied to the input port A of the SFQ/DC converter 224. The SFQ pulse 417-1 triggers a state transition of the SFQ/DC converter 224, as shown by a transition 418-1 in the Q_Level waveform 418 from the logic "1" state to the logic "0" state.

Next, a falling edge 411-2 of the A_Level input waveform 411 triggers an SFQ pulse 413-2 in the A_Pulse waveform 413 which is output from the first dDC/SFQ converter 212-1. The SFQ pulse 413-2 is applied to the input port A of the core logic gate 100, which causes a change in the state of the first T flip-flop 120-1 and causes a non-destructive readout of the state of the second T flip-flop 120-2. For example, the SFQ pulse 413-2 triggers a change in the internal state of the first T flip-flop 120-1, which is shown by a transition 415-2 of the TFF-A waveform 415 transition from the "1" state to the "0" state. In addition, since the internal state of the second T flip-flop 120-2 is in the "1" state, the non-destructive readout of the second T flip-flop 120-2 triggers an SFQ pulse 417-2 in the Q_Pulse waveform 417 to be output and applied to the input port A of the SFQ/DC converter 224. The SFQ pulse 417-2 triggers a state transition of the SFQ/DC converter 224, as shown by a transition 418-2 in the Q_Level waveform 418 from the logic "0" state to the logic "1" state.

Next, a falling edge 412-2 of the B_Level input waveform 412 triggers an SFQ pulse 414-2 in the B_Pulse waveform 414 which is output from the second dDC/SFQ converter 212-2. The SFQ pulse 414-2 is applied to the input port B of the core logic gate 100, which causes a change in the state of the second T flip-flop 120-2 and causes a non-destructive readout of the state of the first T flip-flop 120-1. For example, the SFQ pulse 414-2 triggers a change in the internal state of the second T flip-flop 120-2, which is shown by a transition 416-2 in the TFF-B waveform 416 from the "1" state to the "0" state. In addition, since the internal state of the first T flip-flop 120-1 is in the "0" state, the non-destructive readout of the first T flip-flop 120-1 remains at a logic "0" level. In this instance, the Q_Pulse waveform 417 remains at a logic "0" level in response to the SFQ pulse 414-2. Consequently, the Q_Level waveform 418 remains at a logic "1" level.

FIG. 4B shows exemplary NAND logic gate operations which correspond to the following NAND truth table:

| A_Level | B_Level | Q_Level |
|---------|---------|---------|
| 0       | 0       | 1       |
| 0       | 1       | 1       |
| 1       | 0       | 1       |
| 1       | 1       | 0       |

In particular, FIG. 4B shows the NAND logic gate operation wherein the Q_Level waveform 418 is asserted to a logic "0" level during periods in which the A_Level input waveform 411 and the B_Level input waveform 412 are both asserted to logic "1" levels, and wherein the Q_Level waveform 418 is asserted to a logic "1" level otherwise. For example, FIG. 4B shows that the Q_Level waveform 418 is asserted to a logic "0" level during a first period P1 in response to a period of overlap between the logic "1" levels of the first A_Level input pulse (AP1) and the first B_Level input pulse (BP1), wherein AP1 is an "early pulse" and BP1 is a "late pulse" which arrives after AP1. In addition, FIG. 4B shows that the Q_Level waveform 418 is asserted to a logic "0" level during a second period P2 in response to the second A_Level input pulse (AP2) and the second B_Level input pulse (BP2), wherein BP2 is an "early pulse" and AP2 is a "late pulse" which arrives after BP2. The various state transitions and SFQ pulse signal events that occur in response to the input pulses AP2 and BP2 are similar to the state transitions and SFQ pulse signal events that occur in response to the input pulses AP1 and BP1, as discussed above, the details of which are shown by the waveform diagrams of FIG. 4B and will not be repeated.

As noted above, the clockless SFQ logic circuitry 200 can be configured to implement an OR gate. According to De Morgans Theorem, an OR gate is identical to an AND gate with negated inputs and outputs, and a NOR gate is equivalent to an AND gate with negated inputs. In some embodiments, an OR gate is configured by configuring a NOT gate at each input port A and B of the core logic gate 100, wherein the NOT gates are implemented by initializing the internal states of the first and second T flip-flops 120-1 and 120-2 to a "1" state. For example, in some embodiments, the internal states of the first and second T flip-flops 120-1 and 120-2 are initialized to a logic "1" state by utilizing the first and second state initialization blocks 232-1 and 232-2 to apply initialization SFQ pulses to the input ports A and B of the core logic gate 100. This initialization process generates an SFQ pulse on the output port OUT of the core logic gate 100, which can either be (i) blocked or (ii) cancelled by applying another SFQ pulse on the output using a state initialization block (e.g., blocking confluence buffer).

Figure 4C:
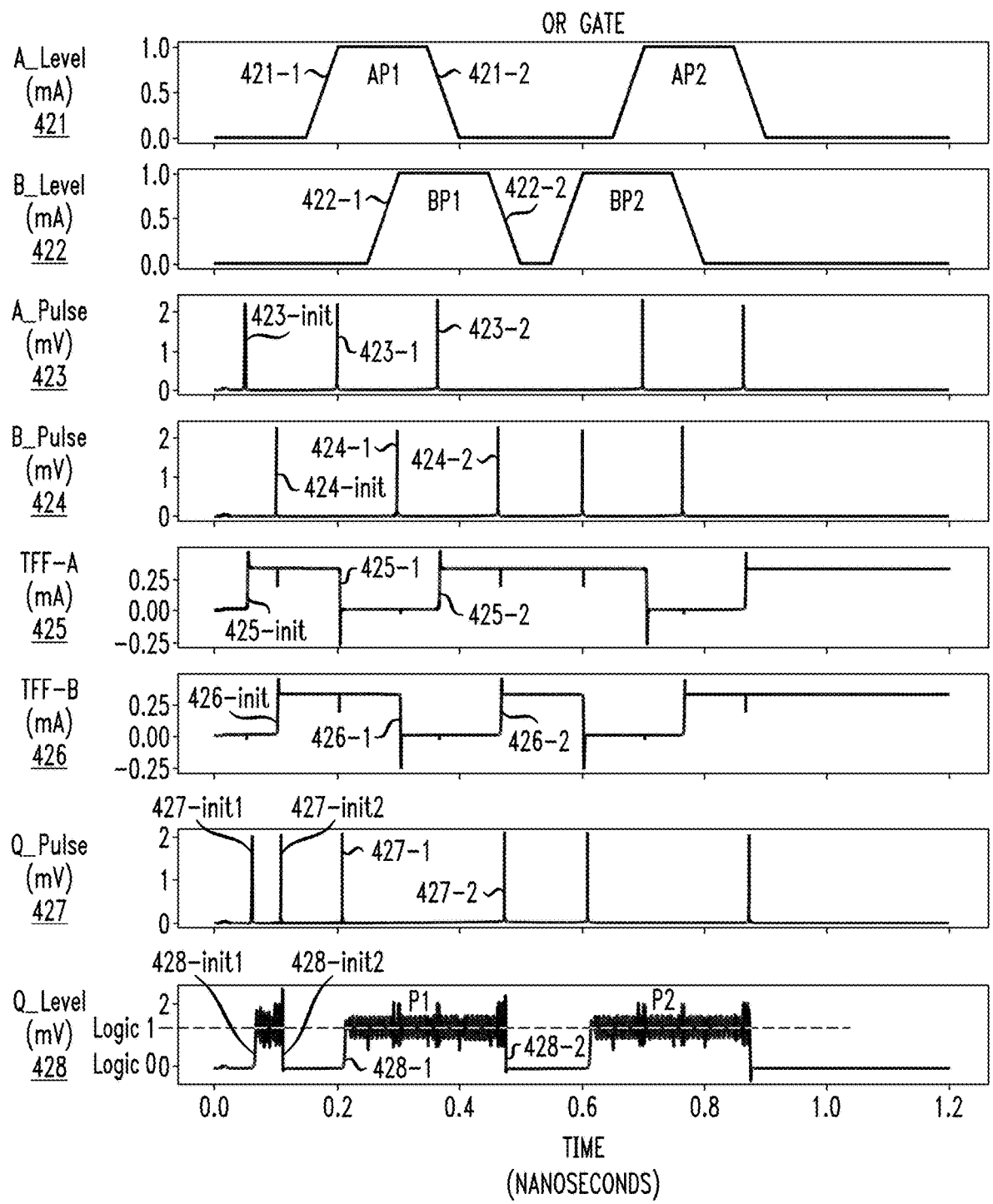
FIG. 4C depicts waveform diagrams that illustrate an exemplary mode of operation of the clockless SFQ logic circuitry of FIG. 2 when configured to implement an OR logic gate, according to an exemplary embodiment of the disclosure.

FIG. 4C depicts waveform diagrams 420 that illustrate an exemplary mode of operation of the clockless SFQ logic circuitry of FIG. 2 when configured to implement an OR logic gate, according to an exemplary embodiment of the disclosure. Similar to the waveforms shown in FIGS. 4A and 4B, the waveform diagrams in FIG. 4C include (i) an A_Level input waveform 421 and a B_Level input waveform 422, which are input to the first and second input ports 201 and 202 of the clockless SFQ logic circuitry 200), (ii) an A_Pulse waveform 423 and a B_Pulse waveform 424, which represent output waveforms of the first and second dDC/SFQ converters 212-1 and 212-2, (iii) a TFF-A waveform 425 and a TFF-B waveform 426, which represent internal states of the respective first and second T flip-flops 120-1 and 120-2, (iv) a Q_Pulse waveform 427 which represents an output of the core logic gate 100, and (v) a Q_Level waveform 428, which represents an output of the SFQ/DC converter 224.

FIG. 4C illustrates that all waveforms 421-428 are initially at 0 levels (at time 0.0 ns), similar to the default AND gate configuration. However, FIG. 4C shows an initialization process which comprises applying an initialization SFQ pulse 423-init (of the A_Pulse waveform 423) to the input port A of the core logic gate 100 to trigger a state transition of the first T flip-flop 120-1, which is shown by a transition 425-int of the TFF-A waveform 425 from the logic "0" state to the logic "1" state. The initialization SFQ pulse 423-init also causes a non-destructive readout of the second T flip-flop 120-2, but since the internal state of the second T flip-flop 120-2 is in the logic "0" state at that time, the non-destructive readout of the second T flip-flop 120-2 results in a readout of a logic "0" level.

The initialization process further comprises injecting an initialization SFQ pulse 427-init1 into the output stage 220 to trigger a state transition of the SFQ/DC converter 224, as shown in FIG. 4C by a transition 428-init1 in the Q_Level waveform 428 from the logic "0" state to the logic "1" state. In some embodiments, the initialization SFQ pulses 423-init and 427-init1 are applied to the logic paths at substantially the same time by operation of the first and third state initialization blocks 232-1 and 232-3.

Next, the initialization process comprises applying an initialization SFQ pulse 424-init (of the B_Pulse waveform 424) to the input port B of the core logic gate 100 to trigger a state transition of the second T flip-flop 120-2, which is shown by a transition 426-int of the TFF-B waveform 426 from the logic "0" state to the logic "1" state. The initialization SFQ pulse 424-init also causes a non-destructive readout of the state of the first T flip-flop 120-1. Since the internal state of the first T flip-flop 120-1 is in the logic "1" state at that time, the non-destructive readout of the first T flip-flop 120-1 triggers an initialization SFQ pulse 427-init2 in the Q_Pulse waveform 427 to be output and applied to the input port A of the SFQ/DC converter 224. The initialization SFQ pulse 427-init2 triggers a state transition of the SFQ/DC converter 224, as shown by a transition 428-init2 in the Q_Level waveform 428 from the logic "1" state to the logic "0" state. In some embodiments, the initialization SFQ pulse 424-init is applied to the logic path by operation of the second state initialization block 232-2. Following the initialization process, since the A_Level input waveform 421 and the B_Level input waveform 422 are both at logic "0" levels, the Q_Level waveform 428 remains at a logic "0" level.

Next, a rising edge 421-1 of the A_Level input waveform 421 triggers an SFQ pulse 423-1 in the A_Pulse waveform 423 which is output from the first dDC/SFQ converter 212-1. The SFQ pulse 423-1 is applied to the input port A of the core logic gate 100, which causes a change in the state of the first T flip-flop 120-1 and causes a non-destructive readout of the state of the second T flip-flop 120-2. For example, the SFQ pulse 423-1 triggers a change in the internal state of the first T flip-flop 120-1, which is shown by a transition 425-1 of the TFF-A waveform 425 from the logic "1" state to the logic "0" state. In addition, since the internal state of the second T flip-flop 120-2 is in the "1" state, the non-destructive readout of the second T flip-flop 120-2 triggers an SFQ pulse 427-1 in the Q_Pulse waveform 427 to be output and applied to the input port A of the SFQ/DC converter 224. The SFQ pulse 427-1 triggers a state transition of the SFQ/DC converter 224, as shown by a transition 428-1 in the Q_Level waveform 428 from the logic "0" state to the logic "1" state.

Next, a rising edge 422-1 of the B_Level input waveform 422 triggers an SFQ pulse 424-1 in the B_Pulse waveform 424 which is output from the second dDC/SFQ converter 212-2. The SFQ pulse 424-1 is applied to the input port B of the core logic gate 100, which causes a change in the state of the second T flip-flop 120-2 and causes a non-destructive readout of the state of the first T flip-flop 120-1. For example, the SFQ pulse 424-1 triggers a change in the internal state of the second T flip-flop 120-2, which is shown by a transition 426-1 of the TFF-B waveform 426 from the logic "1" state to the logic "0" state. In addition, since the internal state (TFF_A) of the first T flip-flop 120-1 is in the logic "0" state, the non-destructive readout of the first T flip-flop 120-1 remains at a logic "0" level. In this instance, the Q_Pulse waveform 427 remains at a logic "1" level despite the SFQ pulse 424-1. Consequently, the Q_Level waveform 428 remains at a logic "1" level.

Next, a falling edge 421-2 of the A_Level input waveform 421 triggers an SFQ pulse 423-2 in the A_Pulse waveform 423 which is output from the first dDC/SFQ converter 212-1. The SFQ pulse 423-2 is applied to the input port A of the core logic gate 100, which causes a change in the state of the first T flip-flop 120-1 and causes a non-destructive readout of the state of the second T flip-flop 120-2. For example, the SFQ pulse 423-2 triggers a change in the internal state of the first T flip-flop 120-1, which is shown by a transition 425-2 in the TFF-A waveform 425 from the logic "0" state to the logic "1" state. In addition, since the internal state of the second T flip-flop 120-1 is in the "0" state, the non-destructive readout of the second T flip-flop 120-2 remains at a logic "0" level. In this instance, the Q_Pulse waveform 427 remains at a logic "0" level despite the SFQ pulse 423-2. Consequently, the Q_Level waveform 428 remains at a logic "1" level.

Next, a falling edge 422-2 of the B_Level input waveform 422 triggers an SFQ pulse 424-2 in the B_Pulse waveform 424 which is output from the second dDC/SFQ converter 212-2. The SFQ pulse 424-2 is applied to the input port B of the core logic gate 100, which causes a change in the state of the second T flip-flop 120-2 and causes a non-destructive readout of the state of the first T flip-flop 120-1. For example, the SFQ pulse 424-2 triggers a change in the internal state of the second T flip-flop 120-2, which is shown by a transition 426-2 in the TFF-B waveform 426 from the logic "0" state to the logic "1" state. In addition, since the internal state of the first T flip-flop 120-1 is in the logic "1" state, the non-destructive readout of the first T flip-flop 120-1 triggers an SFQ pulse 427-2 in the Q_Pulse waveform 427 to be output and applied to the input port A of the SFQ/DC converter 224. The SFQ pulse 427-2 triggers a state transition of the SFQ/DC converter 224, as shown by a transition 428-2 in the Q_Level waveform 428 from the logic "0" state to the logic "1" state.

FIG. 4C shows exemplary OR logic gate operations which correspond to the following OR truth table:

| A_Level | B_Level | Q_Level |
|---------|---------|---------|
| 0 | 0 | 0 |
| 0 | 1 | 1 |
| 1 | 0 | 1 |
| 1 | 1 | 1 |

In particular, FIG. 4C shows the OR logic gate operation wherein the Q_Level waveform 428 is asserted to a logic "1" level during periods P1 and P2 in which either one of the A_Level input waveform 421 or the B_Level input waveform 422 are asserted to logic "1" levels, and wherein the Q_Level waveform 428 is asserted to a logic "0" level during periods when the A_Level input waveform 421 and the B_Level input waveform 422 are both at logic "0" levels. In particular, FIG. 4C shows that the Q_Level waveform 428 is asserted to a logic "1" level during the first period P1 response to the assertion of at least one of the first A_Level input pulse (AP1) and the first B_Level input pulse (BP1), wherein AP1 is an "early pulse" and BP1 is a "late pulse" which arrives after AP1. In addition, FIG. 4C shows that the Q_Level waveform 428 is asserted to a logic "1" level during the second period P2 in response to the assertion of at least one of the second A_Level input pulse (AP2) and the second B_Level input pulse (BP2), wherein BP2 is an "early pulse" and AP2 is a "late pulse" which arrives after BP2. The various state transitions and SFQ pulse signal events that occur in response to the input pulses AP2 and BP2 is similar to the state transitions and SFQ pulse signal events that occur in response to the input pulses AP1 and BP1, as discussed above, the details of which are shown by the waveform diagrams of FIG. 4C and will not be repeated.

As noted above, the clockless SFQ logic circuitry 200 can be configured to implement a NOR gate. In some embodiments, as compared to the initialization process for configuring the OR logic gate as discussed above, a NOR gate can be configured either by (i) not blocking the output that occurs during setup of the OR gate, or (ii) adding an additional initialization SFQ after. For example, FIG. 4D depicts waveform diagrams 430 that illustrate an exemplary mode of operation of the clockless SFQ logic circuitry of FIG. 2 when configured to implement a NOR logic gate, according to an exemplary embodiment of the disclosure.

Figure 4D:
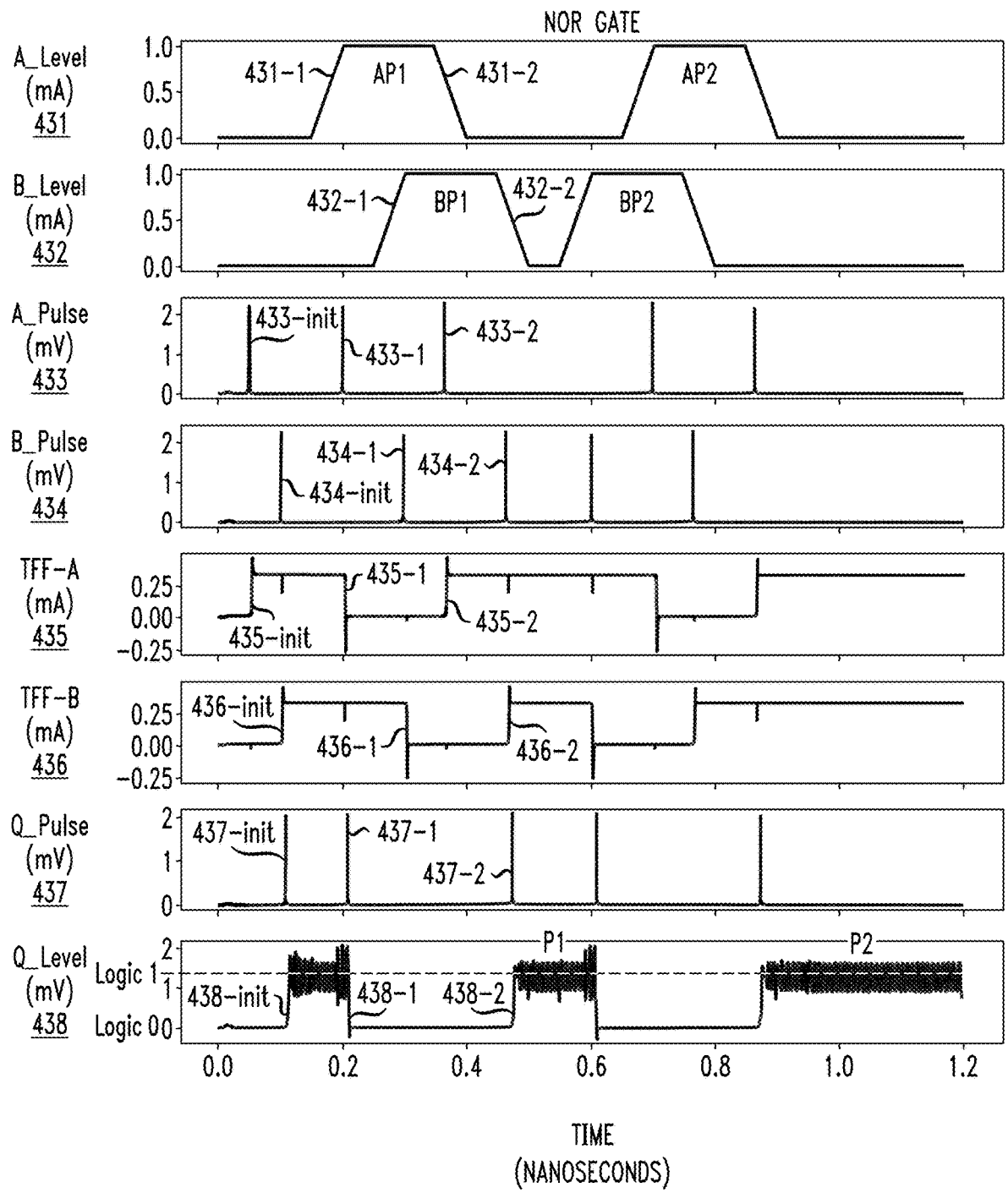
FIG. 4D depicts waveform diagrams that illustrate an exemplary mode of operation of the clockless SFQ logic circuitry of FIG. 2 when configured to implement an NOR logic gate, according to an exemplary embodiment of the disclosure.

Similar to the waveforms shown in FIG. 4C, the waveform diagrams in FIG. 4D include (i) an A_Level input waveform 431 and a B_Level input waveform 432, which are input to the first and second input ports 201 and 202 of the clockless SFQ logic circuitry 200, (ii) an A_Pulse waveform 433 and a B_Pulse waveform 434, which represent waveforms that are input to the first and second input ports A and B of the core logic gate 100, (iii) a TFF-A waveform 435 and a TFF-B waveform 436, which represent internal states of the respective first and second T flip-flops 120-1 and 120-2, (iv) a Q_Pulse waveform 437 which represents an output of the core logic gate 100, and (v) a Q_Level waveform 438, which represents an output of the SFQ/DC converter 224.

FIG. 4D illustrates that all waveforms 431-438 are initially at 0 levels (at time 0.0 ns), which in some embodiment is the default initialization state for the AND gate configuration. However, FIG. 4D shows an initialization process which comprises applying an initialization SFQ pulse 433-init (A_Pulse waveform 433) to the input port A of the core logic gate 100 to trigger a state transition of the first T flip-flop 120-1, which is shown by a transition 435-int of the TFF-A waveform 435 from the logic "0" state to the logic "1" state. The initialization SFQ pulse 433-init also causes a non-destructive readout of the second T flip-flop 120-2, but since the internal state of the second T flip-flop 120-2 is in the logic "0" state at that time, the non-destructive readout of the second T flip-flop 120-2 results in a readout of a logic "0" level. In this instance, the Q_Pulse waveform 437 remains at a logic "0" level despite the initialization SFQ pulse 433-init. Consequently, the Q_Level waveform 438 remains at a logic "0" level.

Next, the initialization process comprises applying an initialization SFQ pulse 434-init (B_Pulse waveform 434) to the input port B of the core logic gate 100 to trigger a state transition of the second T flip-flop 120-2, which is shown by a transition 436-int of the TFF-B waveform 436 from the logic "0" state to the logic "1" state. The initialization SFQ pulse 434-init also causes a non-destructive readout of the state of the first T flip-flop 120-1. Since the internal state of the first T flip-flop 120-1 is in the logic "1" state at that time, the non-destructive readout of the first T flip-flop 120-1 triggers an initialization SFQ pulse 437-init in the Q_Pulse waveform 437 to be output and applied to the input port A of the SFQ/DC converter 224. The initialization SFQ pulse 437-init triggers a state transition of the SFQ/DC converter 224, as shown by a transition 438-init in the Q_Level waveform 438 from the logic "0" state to the logic "1" state. In some embodiments, the initialization SFQ pulse 434-init is applied to the logic path by operation of the second state initialization block 232-2. Following the initialization process, since the A_Level input waveform 431 and the B_Level input waveform 432 are both at logic "0" levels, the Q_Level waveform 438 remains at a logic "1" level.

Next, a rising edge 431-1 of the A_Level input waveform 431 triggers an SFQ pulse 433-1 in the A_Pulse waveform 433, which is output from the first dDC/SFQ converter 212-1. The SFQ pulse 433-1 is applied to the input port A of the core logic gate 100, which causes a change in the state of the first T flip-flop 120-1 and causes a non-destructive readout of the state of the second T flip-flop 120-2. For example, the SFQ pulse 433-1 triggers a change in the internal state of the first T flip-flop 120-1, which is shown by a transition 435-1 of the TFF-A waveform 415 from the logic "1" state to the logic "0" state. In addition, since the internal state of the second T flip-flop 120-2 is in the "1" state, the non-destructive readout of the second T flip-flop 120-2 triggers an SFQ pulse 437-1 in the Q_Pulse waveform 437 to be output and applied to the input port A of the SFQ/DC converter 224. The SFQ pulse 437-1 triggers a state transition of the SFQ/DC converter 224, which results in a transition 438-1 in the Q_Level waveform 438 from the logic "1" state to the logic "0" state.

Next, a rising edge 432-1 of the B_Level input waveform 432 triggers an SFQ pulse 434-1 in the B_Pulse waveform 434 which is output from the second dDC/SFQ converter 212-2. The SFQ pulse 434-1 is applied to the input port B of the core logic gate 100, which causes a change in the state of the second T flip-flop 120-2 and causes a non-destructive readout of the state of the first T flip-flop 120-1. For example, the SFQ pulse 434-1 triggers a change in the internal state of the second T flip-flop 120-2, which is shown by a transition 436-1 of the TFF-B waveform 436 from the logic "1" state to the logic "0" state. In addition, since the internal state (TFF_A) of the first T flip-flop 120-1 is in the logic "0" state, the non-destructive readout of the first T flip-flop 120-1 remains at a logic "0" level. In this instance, the Q_Pulse waveform 437 remains at a logic "0" level despite the SFQ pulse 434-1. Consequently, the Q_Level waveform 438 remains at a logic "0" level.

Next, a falling edge 431-2 of the A_Level input waveform 431 triggers an SFQ pulse 433-2 in the A_Pulse waveform 433 which is output from the first dDC/SFQ converter 212-1. The SFQ pulse 433-2 is applied to the input port A of the core logic gate 100, which causes a change in the state of the first T flip-flop 120-1 and causes a non-destructive readout of the state of the second T flip-flop 120-2. For example, the SFQ pulse 433-2 triggers a change in the internal state of the first T flip-flop 120-1, which is shown by a transition 435-2 in the TFF-A waveform 435 from the logic "0" state to the logic "1" state. In addition, since the internal state of the second T flip-flop 120-2 is in the "0" state, the non-destructive readout of the second T flip-flop 120-1 remains at a logic "0" level. In this instance, the Q_Pulse waveform 437 remains at a logic "0" level despite the SFQ pulse 433-2. Consequently, the Q_Level waveform 438 remains at a logic "0" level.

Next, a falling edge 432-2 of the B_Level input waveform 432 triggers an SFQ pulse 434-2 in the B_Pulse waveform 434 which is output from the second dDC/SFQ converter 212-2. The SFQ pulse 434-2 is applied to the input port B of the core logic gate 100, which causes a change in the state of the second T flip-flop 120-2 and causes a non-destructive readout of the state of the first T flip-flop 120-1. For example, the SFQ pulse 434-2 triggers a change in the internal state of the second T flip-flop 120-2, which is shown by a transition 436-2 in the TFF-B waveform 436 from the logic "0" state to the logic "1" state. In addition, since the internal state of the first T flip-flop 120-1 is in the logic "1" state, the non-destructive readout of the first T flip-flop 120-1 triggers an SFQ pulse 437-2 in the Q_Pulse waveform 437 to be output and applied to the input port A of the SFQ/DC converter 224. The SFQ pulse 437-2 triggers a state transition of the SFQ/DC converter 224, as shown by a transition 438-2 in the Q_Level waveform 438 from the logic "0" state to the logic "1" state.

FIG. 4D shows exemplary NOR logic gate operations which correspond to the following NOR truth table:

| A_Level | B_Level | Q_Level |
| --- | --- | --- |
| 0 | 0 | 1 |
| 0 | 1 | 0 |
| 1 | 0 | 0 |
| 1 | 1 | 0 |

In particular, FIG. 4D shows the NOR logic gate operation wherein the Q_Level waveform 438 is asserted to a logic "1" level during periods P1 and P2 in which both the A_Level input waveform 431 and the B_Level input waveform 432 are asserted to logic "0" levels, and asserted at logic "0" levels otherwise. In particular, FIG. 4D shows that the Q_Level waveform 438 is asserted to a logic "1" level during the first period P1 when both the first A_Level input pulse (AP1) and the first B_Level input pulse (BP1) are at logic "0" levels, wherein AP1 is an "early pulse" and BP1 is a "late pulse" which arrives after AP1. In addition, FIG. 4D shows that the Q_Level waveform 438 is asserted to a logic "1" level during the second period P2 when both the second A_Level input pulse (AP2) and the second B_Level input pulse (BP2) are at logic "0" levels, wherein BP2 is an "early pulse" and AP2 is a "late pulse" which arrives after BP2. The various state transitions and SFQ pulse signal events that occur in response to the input pulses AP2 and BP2 are similar to the state transitions and SFQ pulse signal events that occur in response to the input pulses AP1 and BP1, as discussed above, the details of which are shown by the waveform diagrams of FIG. 4D and will not be repeated.

As noted above, the clockless SFQ logic circuitry 200 can be configured to implement an IMPLY gate. The IMPLY logic gate implements a logical conditional of the form "if A, then B." If A is at a logic "1" level, the output will be the logic level of B. On the other hand, if A is at a logic "0" level, the output will be at a logic "1" level regardless of the logic level of B. In some embodiments, an IMPLY logic gate is configured from the default AND configuration by initializing a NOT on a single input of the core logic gate 100, and initializing a NOT on the output of the core logic gate 100.

Figure 4E:
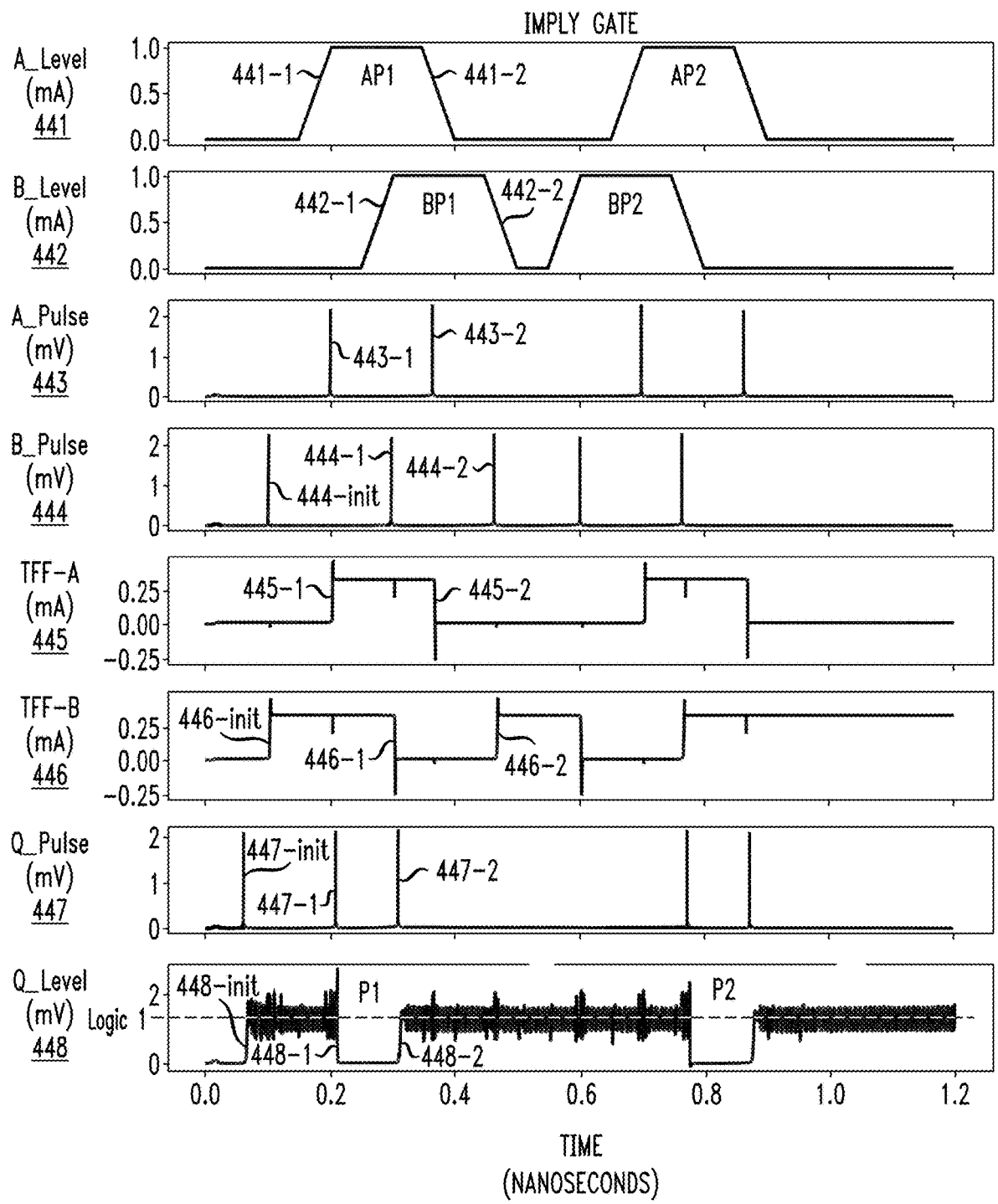
FIG. 4E depicts waveform diagrams that illustrate an exemplary mode of operation of the clockless SFQ logic circuitry of FIG. 2 when configured to implement an IMPLY logic gate, according to an exemplary embodiment of the disclosure.

For example, FIG. 4E depicts waveform diagrams 440 that illustrate an exemplary mode of operation of the clockless SFQ logic circuitry of FIG. 2 when configured to implement an IMPLY logic gate, according to an exemplary embodiment of the disclosure. Similar to the waveforms discussed above, the waveform diagrams in FIG. 4E include (i) an A_Level input waveform 441 and a B_Level input waveform 442, which are input to the first and second input ports 201 and 202 of the clockless SFQ logic circuitry 200, (ii) an A_Pulse waveform 443 and a B_Pulse waveform 444, which represent waveforms that are input to the first and second input ports A and B of the core logic gate 100, (iii) a TFF-A waveform 445 and a TFF-B waveform 446, which represent internal states of the respective first and second T flip-flops 120-1 and 120-2, (iv) a Q_Pulse waveform 447 which represents an output of the core logic gate 100, and (v) a Q_Level waveform 448, which represents an output of the SFQ/DC converter 224.

FIG. 4E illustrates that all waveforms 431-438 are initially at 0 levels (at time 0.0 ns), which in some embodiments is the default initialization state for the AND gate configuration of the core logic gate 100. However, FIG. 4E shows an initialization process which comprises applying an initialization SFQ pulse 447-init (Q_Pulse waveform 447) to the input of the SFQ/DC converter 224 to trigger a state transition of the SFQ/DC converter 224, which results in a transition 448-int of the Q_Level waveform 448 from the logic "0" state to the logic "1" state. In some embodiments, referring to FIG. 2, the state initialization block 232-3 is utilized to inject the initialization SFQ pulse 447-init into the output stage 220.

Next, the initialization process comprises applying an initialization SFQ pulse 444-init (B_Pulse waveform 444) to the input port B of the core logic gate 100. The initialization SFQ pulse 444-init triggers a state transition of the second T flip-flop 120-2, which is shown by a transition 446-init of the TFF-B waveform 446 from the logic "0" state to the logic "1" state. The initialization SFQ pulse 444-init also causes a non-destructive readout of the state of the first T flip-flop 120-1, but since the internal state of the first T flip-flop 120-1 is in the logic "0" state at that time, the non-destructive readout of the first T flip-flop 120-1 results in a readout of a logic "0" level. In this instance, the Q_Pulse waveform 447 remains at a logic "0" level despite the initialization SFQ pulse 444-init. Consequently, the Q_Level waveform 448 remains at a logic "1" level. Following the initialization process, since the A_Level input waveform 441 is at a logic "0" level, the Q_Level waveform 448 remains at a logic "1" level.

Next, a rising edge 441-1 of the A_Level input waveform 441 triggers an SFQ pulse 443-1 in the A_Pulse waveform 443, which is output from the first dDC/SFQ converter 212-1. The SFQ pulse 443-1 is applied to the input port A of the core logic gate 100, which causes a change in the state of the first T flip-flop 120-1 and causes a non-destructive readout of the state of the second T flip-flop 120-2. For example, the SFQ pulse 443-1 triggers a change in the internal state of the first T flip-flop 120-1, which is shown by a transition 445-1 of the TFF-A waveform 445 from the logic "0" state to the logic "1" state. In addition, since the internal state of the second T flip-flop 120-2 is in the "1" state, the non-destructive readout of the second T flip-flop 120-2 triggers an SFQ pulse 447-1 in the Q_Pulse waveform 447 to be output and applied to the input port A of the SFQ/DC converter 224. The SFQ pulse 447-1 triggers a state transition of the SFQ/DC converter 224, which results in a transition 448-1 in the Q_Level waveform 448 from the logic "1" state to the logic "0" state.

Next, a rising edge 442-1 of the B_Level input waveform 442 triggers an SFQ pulse 444-1 in the B_Pulse waveform 444 which is output from the second dDC/SFQ converter 212-2. The SFQ pulse 444-1 is applied to the input port B of the core logic gate 100, which causes a change in the state of the second T flip-flop 120-2 and causes a non-destructive readout of the state of the first T flip-flop 120-1. For example, the SFQ pulse 444-1 triggers a change in the internal state of the second T flip-flop 120-2, which is shown by a transition 446-1 of the TFF-B waveform 446 from the logic "1" state to the logic "0" state. In addition, since the internal state (TFF_A) of the first T flip-flop 120-1 is in the logic "1" state, the non-destructive readout of the first T flip-flop 120-1 results in an SFQ pulse 447-2 (Q_Pulse waveform 447). The SFQ pulse 447-2 causes a transition 448-2 of the Q_Level waveform 448 from the logic "0" level to a logic "1" level.

Next, a falling edge 441-2 of the A_Level input waveform 441 triggers an SFQ pulse 443-2 in the A_Pulse waveform 443 which is output from the first dDC/SFQ converter 212-1. The SFQ pulse 443-2 is applied to the input port A of the core logic gate 100, which causes a change in the state of the first T flip-flop 120-1 and causes a non-destructive readout of the state of the second T flip-flop 120-2. For example, the SFQ pulse 443-2 triggers a change in the internal state of the first T flip-flop 120-1, which is shown by a transition 445-2 in the TFF-A waveform 445 from the logic "0" state to the logic "1" state. In addition, since the internal state of the second T flip-flop 120-2 is in the "0" state, the non-destructive readout of the second T flip-flop 120-2 remains at a logic "0" level. In this instance, the Q_Pulse waveform 447 remains at a logic "0" level despite the SFQ pulse 443-2. Consequently, the Q_Level waveform 448 remains at the logic "1" level.

Next, a falling edge 442-2 of the B_Level input waveform 442 triggers an SFQ pulse 444-2 in the B_Pulse waveform 444 which is output from the second dDC/SFQ converter 212-2. The SFQ pulse 444-2 is applied to the input port B of the core logic gate 100, which causes a change in the state of the second T flip-flop 120-2 and causes a non-destructive readout of the state of the first T flip-flop 120-1. For example, the SFQ pulse 444-2 triggers a change in the internal state of the second T flip-flop 120-2, which is shown by a transition 446-2 in the TFF-B waveform 446 from the logic "0" state to the logic "1" state. In addition, since the internal state of the first T flip-flop 120-1 is in the logic "0" state, the non-destructive readout of the first T flip-flop 120-1 remains at a logic "0" level. In this instance, the Q_Pulse waveform 447 remains at a logic "1" level despite the SFQ pulse 444-2. Consequently, the Q_Level waveform 448 remains at the logic "1" level.

FIG. 4E shows exemplary IMPLY logic gate operations which correspond to the following IMPLY truth table:

| A_Level | B_Level | Q_Level |
|---------|---------|---------|
| 0 | 0 | 1 |
| 0 | 1 | 1 |
| 1 | 0 | 0 |
| 1 | 1 | 1 |

In particular, FIG. 4E shows the IMPLY logic gate operation wherein the Q_Level waveform 448 is asserted to a logic "0" level during periods P1 and P2 in which the A_Level input waveform 441 is at a logic "1" level and the B_Level input waveform 442 is at a logic "1" level, and wherein the Q_Level waveform 448 is asserted at a logic "1" level otherwise. In particular, FIG. 4E shows that the Q_Level waveform 448 is asserted to a logic "0" level during the first period P1 when the first A_Level input pulse (AP1) is at a logic "0" level, and the first B_Level input pulse (BP1) is at a logic "0" level, wherein AP1 is an "early pulse" and BP1 is a "late pulse" which arrives after AP1. In addition, FIG. 4E shows that the Q_Level waveform 448 is asserted to a logic "0" level during the second period P2 when the second B_Level input pulse (BP2) is at a logic "0" level and the second A_Level input pulse (AP2) is at a logic "1" level, wherein BP2 is an "early pulse" and AP2 is a "late pulse" which arrives after BP2. The various state transitions and SFQ pulse signal events that occur in response to the input pulses AP2 and BP2 are similar to the state transitions and SFQ pulse signal events that occur in response to the input pulses AP1 and BP1, as discussed above, the details of which are shown by the waveform diagrams of FIG. 4E and will not be repeated.

Figure 4F:
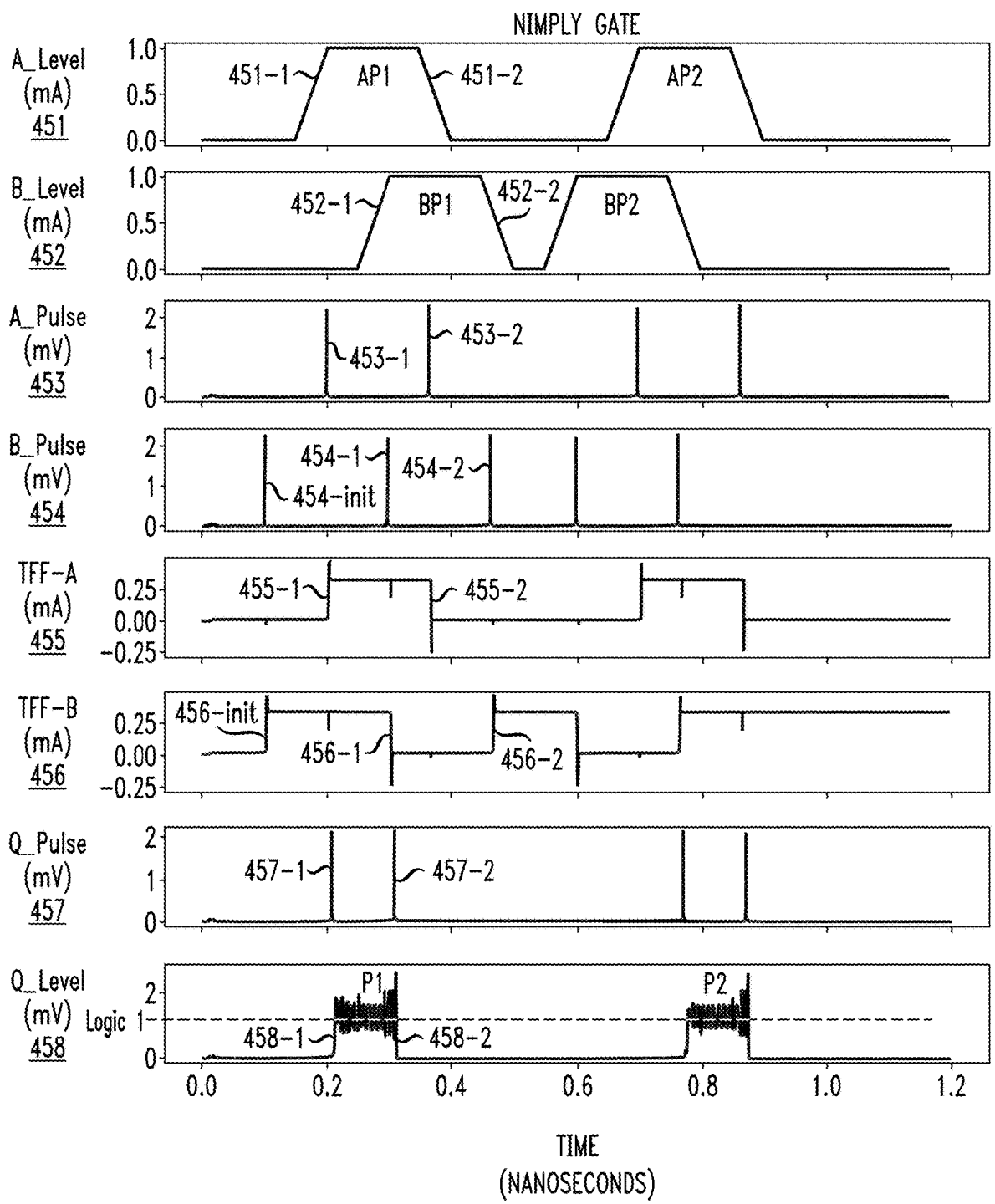
FIG. 4F depicts waveform diagrams that illustrate an exemplary mode of operation of the clockless SFQ logic circuitry of FIG. 2 when configured to implement a NIMPLY logic gate, according to an exemplary embodiment of the disclosure.

As noted above, the clockless SFQ logic circuitry 200 can be configured to implement a NIMPLY gate. In some embodiments, a NIMPLY logic gate is configured from the default AND configuration by initializing a NOT on a single input of the core logic gate 100. For example, FIG. 4F depicts waveform diagrams 450 that illustrate an exemplary mode of operation of the clockless SFQ logic circuitry of FIG. 2 when configured to implement a NIMPLY logic gate, according to an exemplary embodiment of the disclosure. Similar to the waveforms discussed above for FIG. 4E, the waveform diagrams in FIG. 4F include (i) an A_Level input waveform 451 and a B_Level input waveform 452, (ii) an A_Pulse waveform 453 and a B_Pulse waveform 454, (iii) a TFF-A waveform 455 and a TFF-B waveform 456, (iv) a Q_Pulse waveform 457 which represents an output of the core logic gate 100, and (v) a Q_Level waveform 458, which represents an output of the SFQ/DC converter 224.

FIG. 4F illustrates that all waveforms 451-458 are initially at 0 levels (at time 0.0 ns), which in some embodiments is the default initialization state for the AND gate configuration of the core logic gate 100. However, FIG. 4F shows an initialization process which comprises applying an initialization SFQ pulse 454-init (B_Pulse waveform 454) to the input port B of the core logic gate 100. The initialization SFQ pulse 454-init triggers a state transition of the second T flip-flop 120-2, which is shown by a transition 456-init of the TFF-B waveform 456 from the logic "0" state to the logic "1" state. The initialization SFQ pulse 454-init also causes a non-destructive readout of the state of the first T flip-flop 120-1, but since the internal state of the first T flip-flop 120-1 is in the logic "0" state at that time, the non-destructive readout of the first T flip-flop 120-1 results in a readout of a logic "0" level. In this instance, the Q_Pulse waveform 457 remains at a logic "0" level despite the initialization SFQ pulse 454-init. Consequently, following the initialization process, the Q_Level waveform 448 remains at a logic "1" level.

Next, a rising edge 451-1 of the A_Level input waveform 451 triggers an SFQ pulse 453-1 in the A_Pulse waveform 453, which is output from the first dDC/SFQ converter 212-1. The SFQ pulse 453-1 is applied to the input port A of the core logic gate 100, which causes a change in the state of the first T flip-flop 120-1 and causes a non-destructive readout of the state of the second T flip-flop 120-2. For example, the SFQ pulse 453-1 triggers a change in the internal state of the first T flip-flop 120-1, which is shown by a transition 455-1 of the TFF-A waveform 455 from the logic "0" state to the logic "1" state. In addition, since the internal state of the second T flip-flop 120-2 is in the "1" state, the non-destructive readout of the second T flip-flop 120-2 triggers an SFQ pulse 457-1 in the Q_Pulse waveform 457 to be output and applied to the input port A of the SFQ/DC converter 224. The SFQ pulse 457-1 triggers a state transition of the SFQ/DC converter 224, which results in a transition 458-1 in the Q_Level waveform 458 from the logic "0" state to the logic "1" state.

Next, a rising edge 452-1 of the B_Level input waveform 452 triggers an SFQ pulse 454-1 in the B_Pulse waveform 454 which is output from the second dDC/SFQ converter 212-2. The SFQ pulse 454-1 is applied to the input port B of the core logic gate 100, which causes a change in the state of the second T flip-flop 120-2 and causes a non-destructive readout of the state of the first T flip-flop 120-1. For example, the SFQ pulse 454-1 triggers a change in the internal state of the second T flip-flop 120-2, which is shown by a transition 456-1 of the TFF-B waveform 456 from the logic "1" state to the logic "0" state. In addition, since the internal state (TFF_A waveform 455) of the first T flip-flop 120-1 is in the logic "1" state, the non-destructive readout of the first T flip-flop 120-1 results in an SFQ pulse 457-2 (Q_Pulse waveform 457). The SFQ pulse 457-2 causes a transition 458-2 of the Q_Level waveform 448 from the logic "1" level to a logic "0" level.

Next, a falling edge 451-2 of the A_Level input waveform 451 triggers an SFQ pulse 453-2 in the A_Pulse waveform 453 which is output from the first dDC/SFQ converter 212-1. The SFQ pulse 453-2 is applied to the input port A of the core logic gate 100, which causes a change in the state of the first T flip-flop 120-1 and causes a non-destructive readout of the state of the second T flip-flop 120-2. For example, the SFQ pulse 453-2 triggers a change in the internal state of the first T flip-flop 120-1, which is shown by a transition 455-2 in the TFF-A waveform 455 from the logic "1" state to the logic "0" state. In addition, since the internal state of the second T flip-flop 120-2 is in the logic "0" state, the non-destructive readout of the second T flip-flop 120-2 remains at a logic "0" level. In this instance, the Q_Pulse waveform 457 remains at a logic "0" level despite the SFQ pulse 453-2. Consequently, the Q_Level waveform 458 remains at the logic "0" level.

Next, a falling edge 452-2 of the B_Level input waveform 452 triggers an SFQ pulse 454-2 in the B_Pulse waveform 454 which is output from the second dDC/SFQ converter 212-2. The SFQ pulse 454-2 is applied to the input port B of the core logic gate 100, which causes a change in the state of the second T flip-flop 120-2 and causes a non-destructive readout of the state of the first T flip-flop 120-1. For example, the SFQ pulse 454-2 triggers a change in the internal state of the second T flip-flop 120-2, which is shown by a transition 456-2 in the TFF-B waveform 456 from the logic "0" state to the logic "1" state. In addition, since the internal state of the first T flip-flop 120-1 is in the logic "0" state, the non-destructive readout of the first T flip-flop 120-1 remains at a logic "0" level. In this instance, the Q_Pulse waveform 457 remains at a logic "0" level despite the SFQ pulse 454-2. Consequently, the Q_Level waveform 458 remains at the logic "0" level.

FIG. 4F shows exemplary NIMPLY logic gate operations which correspond to the following NIMPLY truth table:

| A_Level | B_Level | Q_Level |
|---------|---------|---------|
| 0 | 0 | 0 |
| 0 | 1 | 0 |
| 1 | 0 | 1 |
| 1 | 1 | 0 |

In particular, FIG. 4F shows the NIMPLY logic gate operation wherein the Q_Level waveform 458 is asserted to a logic "1" level during periods P1 and P2 in which the A_Level input waveform 451 is at a logic "1" level and the B_Level input waveform 452 is at a logic "0" level, and wherein the Q_Level waveform 458 is asserted at a logic "0" level otherwise. In particular, FIG. 4F shows that the Q_Level waveform 458 is asserted to a logic "1" level during the first period P1 when the first A_Level input pulse (AP1) is at a logic "1" level, and the first B_Level input pulse (BP1) is at a logic "0" level, wherein AP1 is an "early pulse" and BP1 is a "late pulse" which arrives after AP1. In addition, FIG. 4F shows that the Q_Level waveform 458 is asserted to a logic "1" level during the second period P2 when the second B_Level input pulse (BP2) is at a logic "0" level and the second A_Level input pulse (AP2) is at a logic "1" level, wherein BP2 is an "early pulse" and AP2 is a "late pulse" which arrives after BP2. The various state transitions and SFQ pulse signal events that occur in response to the input pulses AP2 and BP2 are similar to the state transitions and SFQ pulse signal events that occur in response to the input pulses AP1 and BP1, as discussed above, the details of which are shown by the waveform diagrams of FIG. 4F and will not be repeated.

It is to be appreciated that FIGS. 4A-4F show that the core logic gate 100 can be configured to implement any one of a plurality of logic gates including an AND gate, a NAND gate, an OR gate, a NOR gate, an IMPLY gate, and a NIMPLY gate by performing an initialization process to initialize "NOT gates" at the requisite input and/or output ports as needed. More specifically, as demonstrated above, in some embodiments, the core logic gate 100 is configured upon startup as a AND gate with all signal inputs and internal states initialized to a logic "0" level. An initialization process can be performed to configure the default AND gate to one of a NAND, OR, NOR, IMPLY, or NIMPLY gate by changing the internal state of one of the first and second T flip-flops 120-1 and 120-2 of the core logic gate 100 and/or the internal state of the SFQ/DC converter 224. To achieve a controlled initialization, the state initialization bocks 232-1, 232-2, and/or 232-3 are utilized to inject the initialization SFQ pulses into one or more of the A path, the B path and/or the output stage of the clockless SFQ logic circuitry 200, as needed, to configure a target logic gate. The state initialization bocks 232-1, 232-2, and/or 232-3 are configured to stop an SFQ pulse from traveling forward and/or inject initializing SFQ pulses into the input of gates that hold state during the initialization/startup to controllably set the initial state of the gates.

Figure 5A:
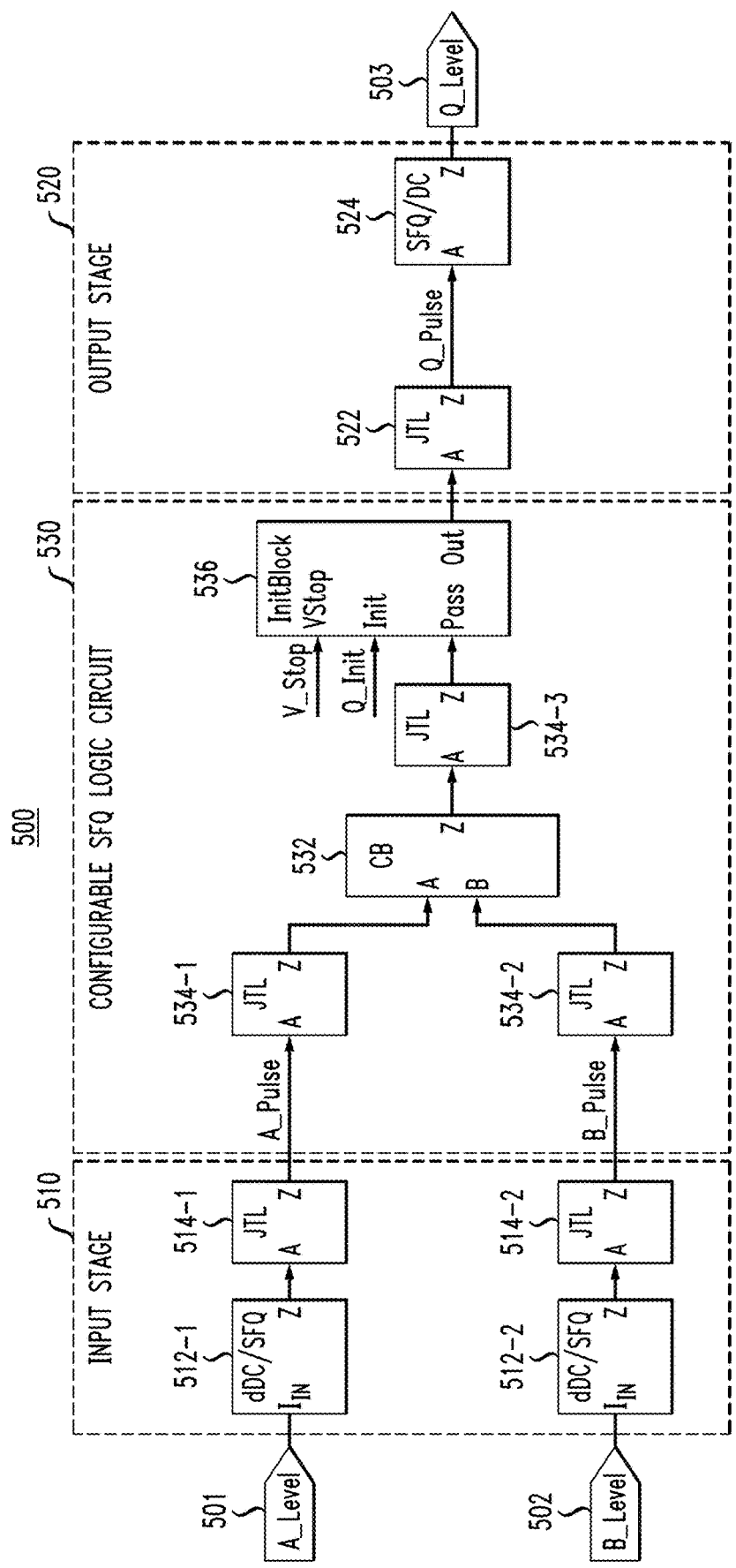
FIG. 5A is a block diagram of clockless SFQ logic circuitry comprising a configurable logic circuit, according to an exemplary embodiment of the disclosure.

In other embodiments, XOR and XNOR logic gates can be implement by clockless SFQ logic circuitry which comprises a configurable logic circuit. For example, FIG. 5A is a block diagram of clockless SFQ logic circuitry 500 comprising a configurable logic circuit, according to an exemplary embodiment of the disclosure. The clockless SFQ logic circuitry 500 comprises a first input port 501, a second input port 502, an output port 503, an input stage 510, an output stage 520, and a configurable logic circuit 530 coupled between the input and output stages 510 and 520. The input stage 510 comprises a first dDC/SFQ converter 512-1, a second dDC/SFQ converter 512-2, a first JTL 514-1, and a second JTL 514-2. The output stage 520 comprises a JTL 522, and an SFQ/DC converter 524. The input and output stages 510 and 520 have a same circuit architecture and operate in a similar manner as the input and output stages 210 and 220 of the clockless SFQ logic circuitry 200 of FIG. 2, the details of which will not be repeated.

The configurable SFQ logic circuit 530 comprises a confluence buffer 532, a first JTL 534-1, a second JTL 534-2, a third JTL 534-3, and a state initialization block 536. With this circuit architecture, the configurable logic circuit 530 can be configured to implement an XOR logic gate or an XNOR logic gate using the confluence buffer 532. The clockless SFQ logic XOR and XNOR gates have a common property in that if any input A or B changes state, the output state of the logic gate will always change. In other words, since the confluence buffer 532 does not store state, the confluence buffer 532 generates a same logical output as an XOR gate.

In view of these properties, the clockless SFQ logic circuitry 500 can be configured to implement a clockless SFQ logic XOR gate by simply using the confluence buffer 532, whereby any incoming SFQ pulse to the first input port A or the second input port B of the confluence buffer 532 will always pass to the output port Z thereof. In the XOR logic gate configuration, the internal state of the SFQ/DC converter 524 is initialized to a logic "0" state. Since the confluence buffer 532 does not store an internal state, any NOT function from a previous gate needs to be either propagated to a next gate with an internal state or to an output gate with an internal state. On the other hand, the clockless SFQ logic circuitry 500 can be configured to implement a clockless SFQ logic XNOR gate by using the confluence buffer 532 and implementing a NOT at the output of the confluence buffer 532 by initializing the internal state of the SFQ/DC converter 524 to a logic "1" state.

Figure 5B:
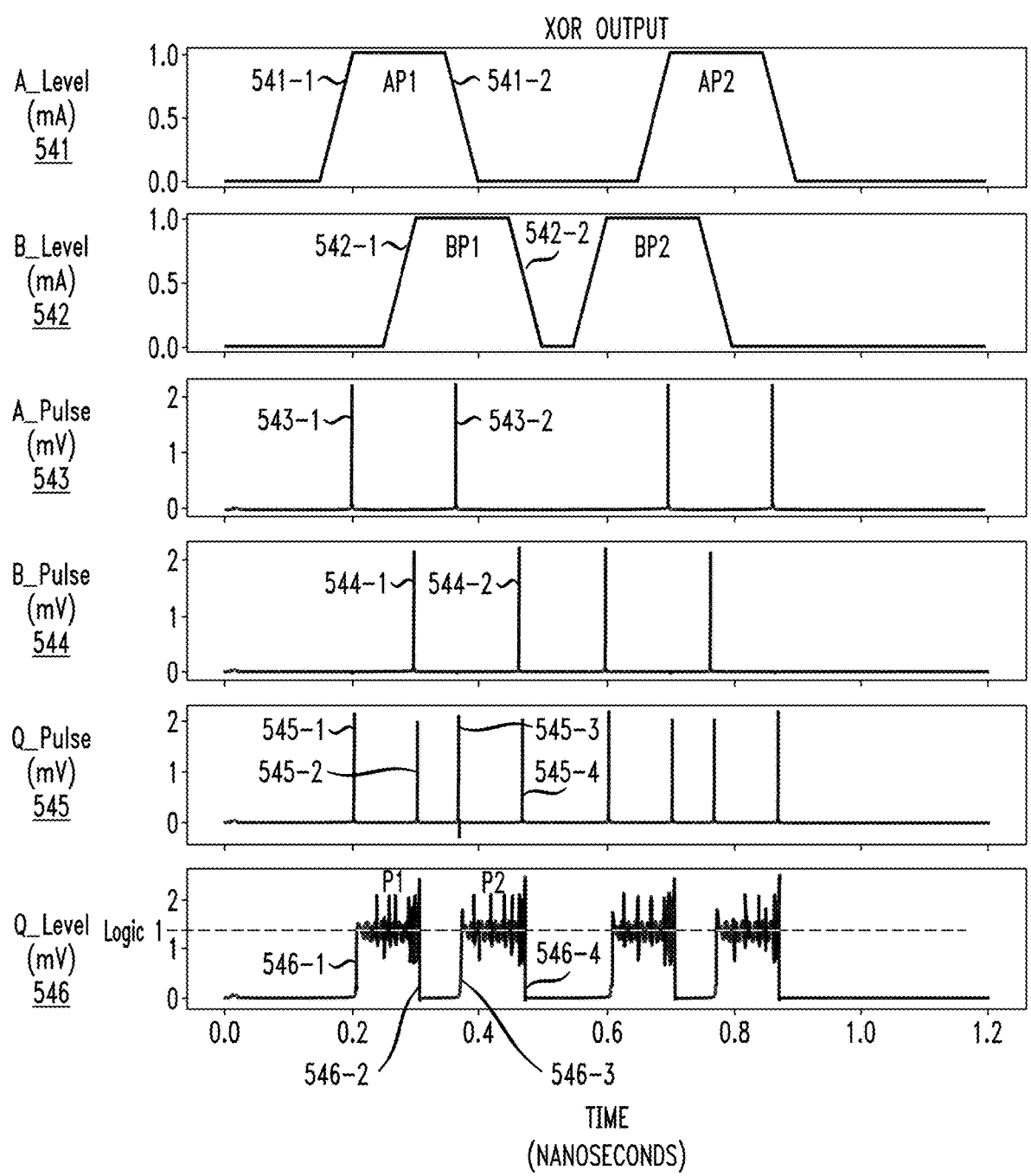
FIG. 5B depicts waveform diagrams that illustrate an exemplary mode of operation of the clockless SFQ logic circuitry of FIG. 5A when configured to implement an XOR logic gate, according to an exemplary embodiment of the disclosure.

FIG. 5B depicts waveform diagrams 540 that illustrate an exemplary mode of operation of the clockless SFQ logic circuitry 500 of FIG. 5A when configured to implement an XOR logic gate, according to an exemplary embodiment of the disclosure. Similar to the waveforms diagrams discussed above, the waveform diagrams in FIG. 5B include (i) an A_Level input waveform 541 and a B_Level input waveform 542, which are input to the first and second input ports 501 and 502 of the clockless SFQ logic circuitry 500, (ii) an A_Pulse waveform 543 and a B_Pulse waveform 544, which represent output waveforms of the first and second dDC/SFQ converters 512-1 and 512-2, (iii) a Q_Pulse waveform 545 which represents an output of the configurable logic circuit 530, and (iv) a Q_Level waveform 546, which represents an output of the SFQ/DC converter 524.

FIG. 5B illustrates that all waveforms 541-546 are initially at 0 levels (e.g., at time 0.0 ns) which, in some embodiments is the default startup state. For example, as noted above, for an XOR logic gate configuration, the SFQ/DC converter 524 has an internal state that is initialized to the logic "0" state, as shown by the Q_Level waveform 546 output from the SFQ/DC converter 524.

Next, a rising edge 541-1 of the A_Level input waveform 541 triggers an SFQ pulse 543-1 to be output from the first dDC/SFQ converter 512-1. The SFQ pulse 543-1 is applied to the input port A of the confluence buffer 532 and, in response, the confluence buffer 532 outputs an SFQ pulse 545-1. The SFQ pulse 545-1 is applied to the input port A of the SFQ/DC converter 524, which triggers a state transition of the SFQ/DC converter 524, as shown by a transition 546-1 in the Q_Level waveform 546 from the logic "0" state to the logic "1" state.

Next, a rising edge 542-1 of the B_Level input waveform 542 triggers an SFQ pulse 544-1 to be output from the second dDC/SFQ converter 512-2. The SFQ pulse 544-1 is applied to the input port B of the confluence buffer 532 and, in response, the confluence buffer 532 outputs an SFQ pulse 545-2. The SFQ pulse 545-2 is applied to the input port A of the SFQ/DC converter 524, which triggers a state transition of the SFQ/DC converter 524, as shown by a transition 546-2 in the Q_Level waveform 546 from the logic "1" state to the logic "0" state.

Next, a falling edge 541-2 of the A_Level input waveform 541 triggers an SFQ pulse 543-2 to be output from the first dDC/SFQ converter 512-1. The SFQ pulse 543-2 is applied to the input port A of the confluence buffer 532 and, in response, the confluence buffer 532 outputs an SFQ pulse 545-3. The SFQ pulse 545-3 is applied to the input port A of the SFQ/DC converter 524, which triggers a state transition of the SFQ/DC converter 524, as shown by a transition 546-3 in the Q_Level waveform 546 from the logic "0" state to the logic "1" state.

Next, a falling edge 542-2 of the B_Level input waveform 542 triggers an SFQ pulse 544-2 to be output from the second dDC/SFQ converter 512-2. The SFQ pulse 544-2 is applied to the input port B of the confluence buffer 532 and, in response, the confluence buffer 532 outputs an SFQ pulse 545-4. The SFQ pulse 545-4 is applied to the input port A of the SFQ/DC converter 524, which triggers a state transition of the SFQ/DC converter 524, as shown by a transition 546-4 in the Q_Level waveform 546 from the logic "1" state to the logic "0" state.

FIG. 5B shows exemplary XOR logic gate operations which correspond to the following XOR truth table:

| A_Level | B_Level | Q_Level |
| --- | --- | --- |
| 0 | 0 | 0 |
| 0 | 1 | 1 |
| 1 | 0 | 1 |
| 1 | 1 | 0 |

In particular, FIG. 5B shows that a logic "1" pulse P1 is output in response to assertion of the input pulse AP1 (early pulse) before assertion of the input pulse BP1 (late pulse), and that a logic "1" pulse P2 is output in response to assertion of the input pulse BP2 (early pulse) before assertion of the input pulse AP2 (late pulse). The output waveform Q_Level 546 is at a logic "0" level in all instances where (i) the A_Level input waveform 541 and the B_Level input waveform 542 are at essentially at logic "0" levels, and where (ii) the A_Level input waveform 541 and the B_Level input waveform 542 are both asserted at logic "1" levels at the same time. The various state transitions and SFQ pulse signal events that occur in response to the input pulses AP2 and BP2 are similar to the state transitions and SFQ pulse signal events that occur in response to the input pulses AP1 and BP1, as discussed above, the details of which are shown by the waveform diagrams of FIG. 5B and will not be repeated.

Figure 5C:
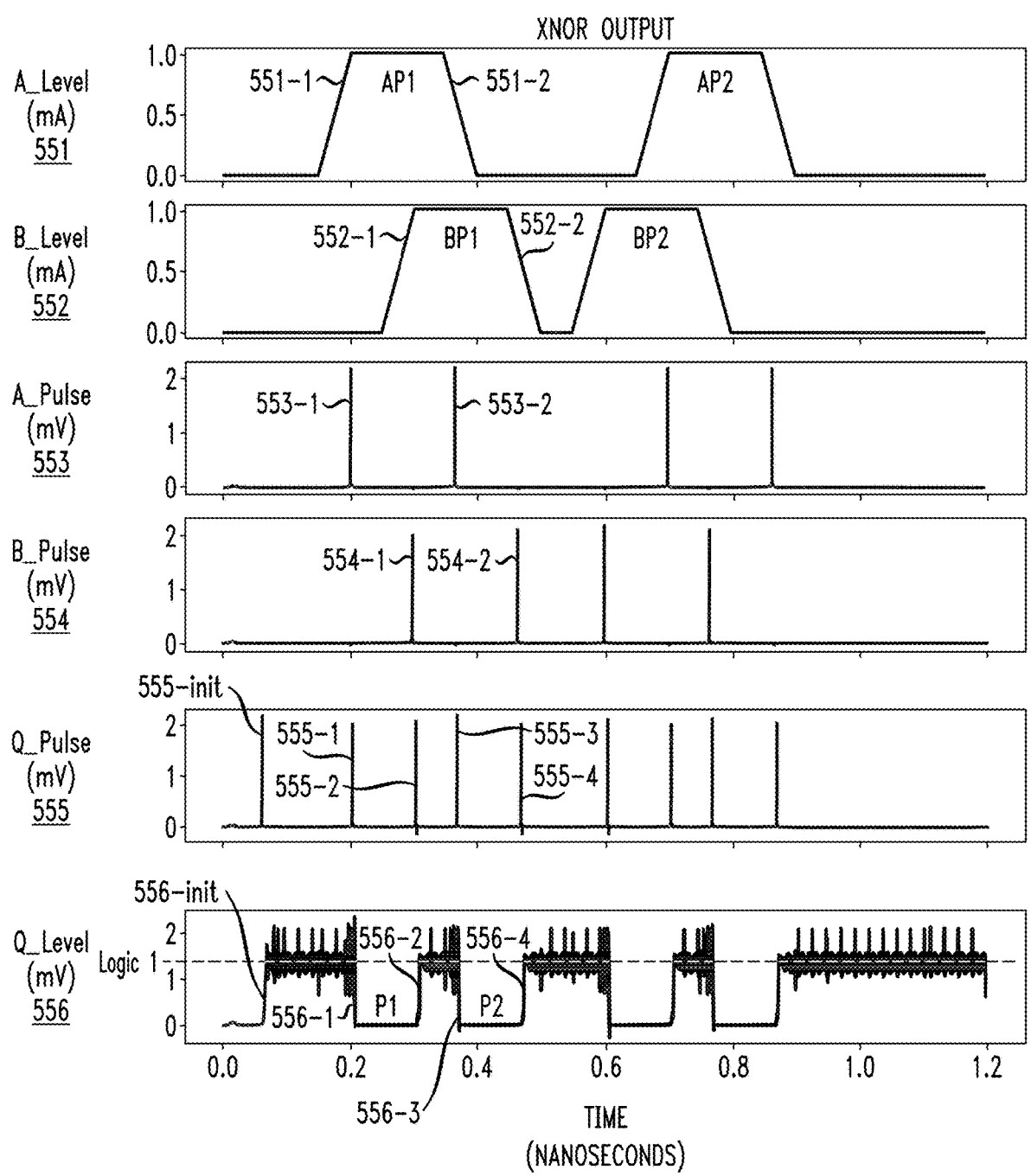
FIG. 5C depicts waveform diagrams that illustrate an exemplary mode of operation of the clockless SFQ logic circuitry of FIG. 5A when configured to implement an XNOR logic gate, according to an exemplary embodiment of the disclosure.

FIG. 5C depicts waveform diagrams 550 that illustrate an exemplary mode of operation of the clockless SFQ logic circuitry 500 of FIG. 5A when configured to implement an XNOR logic gate, according to an exemplary embodiment of the disclosure. Similar to the waveforms diagrams in FIG. 5B, the waveform diagrams in FIG. 5C include (i) an A_Level input waveform 551 and a B_Level input waveform 552, which are input to the first and second input ports 501 and 502 of the clockless SFQ logic circuitry 500, (ii) an A_Pulse waveform 553 and a B_Pulse waveform 554, which represent output waveforms of the first and second dDC/SFQ converters 512-1 and 512-2, (iii) a Q_Pulse waveform 555 which represents an output of the configurable logic circuit 530, and (iv) a Q_Level waveform 556, which represents an output of the SFQ/DC converter 524.

FIG. 5C illustrates that all waveforms 551-556 are initially at 0 levels (e.g., at time 0.0 ns) which, in some embodiments is the default startup state. However, FIG. 5C shows an initialization process in which an initialization SFQ pulse 555-init is injected into the output stage 520 and applied to the input of the SFQ/DC converter 524. The initialization SFQ pulse 555-init triggers a state transition of the SFQ/DC converter 524, as shown by a transition 556-init in the Q_Level waveform 556 from the logic "0" state to the logic "1" state, which results in configuring the XNOR gate (e.g., XOR gate with inverted output). Following the initialization process, since the A_Level input waveform 551 and the B_Level input waveform 552 are both at logic "0" levels, the Q_Level waveform 556 remains at the initialized logic "1" level.

Next, a rising edge 551-1 of the A_Level input waveform 551 triggers an SFQ pulse 553-1 to be output from the first dDC/SFQ converter 512-1. The SFQ pulse 553-1 is applied to the input port A of the confluence buffer 532 and, in response, the confluence buffer 532 outputs an SFQ pulse 555-1. The SFQ pulse 555-1 is applied to the input port A of the SFQ/DC converter 524, which triggers a state transition of the SFQ/DC converter 524, as shown by a transition 556-1 in the Q_Level waveform 556 from the logic "1" state to the logic "0" state.

Next, a rising edge 552-1 of the B_Level input waveform 552 triggers an SFQ pulse 554-1 to be output from the second dDC/SFQ converter 512-2. The SFQ pulse 554-1 is applied to the input port B of the confluence buffer 532 and, in response, the confluence buffer 532 outputs an SFQ pulse 555-2. The SFQ pulse 555-2 is applied to the input port A of the SFQ/DC converter 524, which triggers a state transition of the SFQ/DC converter 524, as shown by a transition 556-2 in the Q_Level waveform 556 from the logic "0" state to the logic "1" state.

Next, a falling edge 551-2 of the A_Level input waveform 551 triggers an SFQ pulse 553-2 to be output from the first dDC/SFQ converter 512-1. The SFQ pulse 553-2 is applied to the input port A of the confluence buffer 532 and, in response, the confluence buffer 532 outputs an SFQ pulse 555-3. The SFQ pulse 555-3 is applied to the input port A of the SFQ/DC converter 524, which triggers a state transition of the SFQ/DC converter 524, as shown by a transition 556-3 in the Q_Level waveform 556 from the logic "1" state to the logic "0" state.

Next, a falling edge 552-2 of the B_Level input waveform 542 triggers an SFQ pulse 554-2 to be output from the second dDC/SFQ converter 512-2. The SFQ pulse 554-2 is applied to the input port B of the confluence buffer 532 and, in response, the confluence buffer 532 outputs an SFQ pulse 555-4. The SFQ pulse 555-4 is applied to the input port A of the SFQ/DC converter 524, which triggers a state transition of the SFQ/DC converter 524, as shown by a transition 556-4 in the Q_Level waveform 556 from the logic "0" state to the logic "1" state.

FIG. 5C shows exemplary XNOR logic gate operations which correspond to the following XNOR truth table:

| A_Level | B_Level | Q_Level |
|---------|---------|---------|
| 0 | 0 | 1 |
| 0 | 1 | 0 |
| 1 | 0 | 0 |
| 1 | 1 | 1 |

In particular, FIG. 5C shows that a logic "0" pulse P1 is output in response to assertion of the input pulse AP1 (early pulse) before assertion of the input pulse BP1 (late pulse), and that a logic "0" pulse P2 is output in response to assertion of the input pulse BP2 (early pulse) before assertion of the input pulse AP2 (late pulse). The output waveform Q_Level 556 is at a logic "1" level at initialization and in all instances where (i) the A_Level input waveform 551 and the B_Level input waveform 552 are at essentially at logic "0" levels, and where (ii) the A_Level input waveform 551 and the B_Level input waveform 552 are both asserted at logic "1" levels at the same time. The various state transitions and SFQ pulse signal events that occur in response to the input pulses AP2 and BP2 are similar to the state transitions and SFQ pulse signal events that occur in response to the input pulses AP1 and BP1, as discussed above, the details of which are shown by the waveform diagrams of FIG. 5C and will not be repeated.

It is to be noted that with the exemplary clockless SFQ logic circuits disclosed herein, certain timing constraints should be followed to avoid the possibility of metastable states. For example, with regard to the use of non-destructive readout T flip-flops (as in the core logic gate 100), metastable states can possibly arise from a given non-destructive readout T flip-flop receiving SFQ pulses on the toggle input port T and the readout control port RI in close temporal proximity due to, e.g., concurrent SFQ pulses on the A and B input ports of the core logic gate 100. This can lead to errors in core logic gate 100 when configured as an AND logic gate as a result of the SFQ pulses arriving on the toggle input ports of the first and second T flip-flops 120-1 and 120-2, or a failure to read the proper state of a given T flip-flop, or a collision in the confluence buffer 130 which combines the readout signals from the output ports RO of the first and second T flip-flops 120-1 and 120-2. For example, computer simulations have shown that for a given circuit architecture of a non-destructive readout T flip-flop, it takes 7 picoseconds for the internal state to change and settle, and that an SFQ pulse arriving at the read control input port RI at least 2 picoseconds after the change state, results a correct readout of the new state. In addition, computer simulations have shown that for given circuit architecture of a confluence buffer, at least 3 picoseconds of separation between input SFQ pulses at the input ports A and B of the confluence buffer avoids a metastable state where one of the SFQ pulse would be dropped. In some embodiments, metastability is avoided by changing only one input of a given SFQ circuit at a time.

It is to be appreciated that the core logic gate 100 of FIG. 1 can be utilized as a basic building block to construct various types of combinational networks or combinational logic circuits using basic logic gates (e.g., AND, NAND, OR, NOR, etc.,) which are combined and connected together to implement more complex switching circuits. In addition, a single confluence buffer can be utilized to implement an XOR logic gate or XNOR logic gate in a combinational network. Exemplary embodiments of combinational networks include, encoders, decoders, multiplexers, demultiplexers, half-adders, full adders, etc. For purposes of illustration, exemplary embodiments of combinational networks with configurable SFQ logic circuitry to implement a 2-bit multiplexer gate and a full adders gate will be discussed below in conjunction with FIGS. 6A, 6B, 7A, and 7B, although it is to be understood that other types of combinational networks can be implemented using SFQ circuits and techniques is disclosed herein.

In accordance with exemplary embodiments of the disclosure, a general architecture of a combinational network comprises (i) an input stage (network input edge) comprising dDC/SFQ converter circuits to convert two-level input signals to SFQ pulses, (ii) a combinational logic circuit which comprises one or more instances of the core logic gate 100 and/or a confluence buffer, and one or more instances of a state initialization block to control initial states as needed to configure the requite logic gates, and (iii) an output stage (network output edge) comprising at least one SFQ/DC converter circuit to convert the output SFQ pulses generated by combinational logic circuit to two-level output signals. In this regard, an exemplary SFQ combinational network utilizes SFQ pulses to perform the logic operations, while utilizing two-level current signals and two-level voltage signals and the input and output edges of the SFQ combinational network.

Figure 6A:
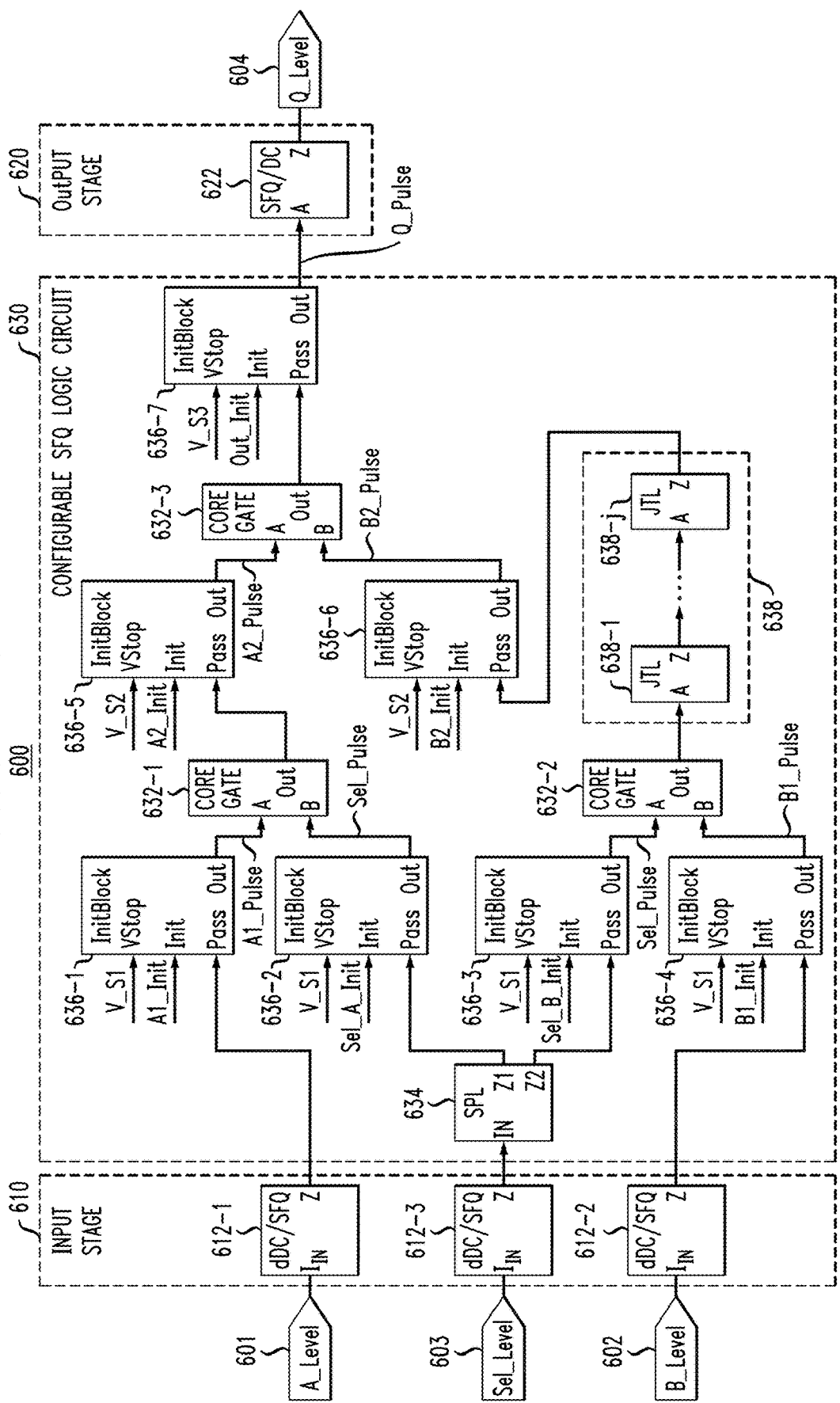
FIG. 6A is a block diagram of clockless SFQ logic circuitry which comprises a 2-bit multiplexer gate that is configured using multiple instances of the configurable logic gate of FIG. 1, according to an exemplary embodiment of the disclosure.

For example, FIG. 6A is a block diagram of clockless SFQ logic circuitry which comprises a 2-bit multiplexer gate that is configured using multiple instances of the configurable logic gate of FIG. 1, according to an exemplary embodiment of the disclosure. In particular, FIG. 6A is a block diagram of combinational network comprising clockless SFQ logic circuitry 600 (alternatively, 2-bit multiplexer gate circuit 600) which comprises input ports 601, 602, and 603, an output port 604, an input stage 610, an output stage 620, and a configurable logic circuit 630 coupled between the input and output stages 610 and 620. The input stage 610 comprises dDC/SFQ converters 612-1, 612-2, and 612-3, which are configured to convert two-level current signals to SFQ pulses. The output stage 620 comprises an SFQ/DC converter 622 which is configured to convert SFQ pulses into two-level voltage signals.

The configurable SFQ logic circuit 630 comprises a plurality of core logic gates 632-1, 632-2, and 632-3, an SFQ splitter 634, a plurality of state initialization blocks 636-1, 636-2, 636-3, 636-4, 636-5, 636-6, and 636-7, and a delay block 638 comprising a plurality of JTLs 638-1, . . . , 638-j. With this circuit architecture, the configurable logic circuit 630 can be configured to implement a two-bit multiplexer gate by configuring each of the core logic gates 632-1 and 632-2 as an AND logic gate, configuring the core logic gate 632-3 as an OR logic gate, and configuring a NOT gate at the input port B of the core logic gate 632-1 (e.g., AND gate) by initializing the state of a T flip-flop of the core logic gate 632-1 to a logic "1" state.

The two-bit multiplexer gate circuit 600 operates by switching one of the inputs applied to the first and second input ports 601 and 602 through to the output port 604 by applying a select control signal (denoted Sel_Level) to the input port 603. For example, when Sel_Level is set to a logic "0" level, the logic level of the input signal A_Level at the input port 601 will pass through to the output port 604 where the logic level of the output signal Q_Level will be the logic level of the input signal A_Level. On the other hand, when Sel_Level is set to a logic "1" level, the logic level of the input signal B_Level at the input port 602 will pass through to the output port 604 where the logic level of the output signal Q_Level will be the logic level of the input signal B_Level.

Figure 6B:
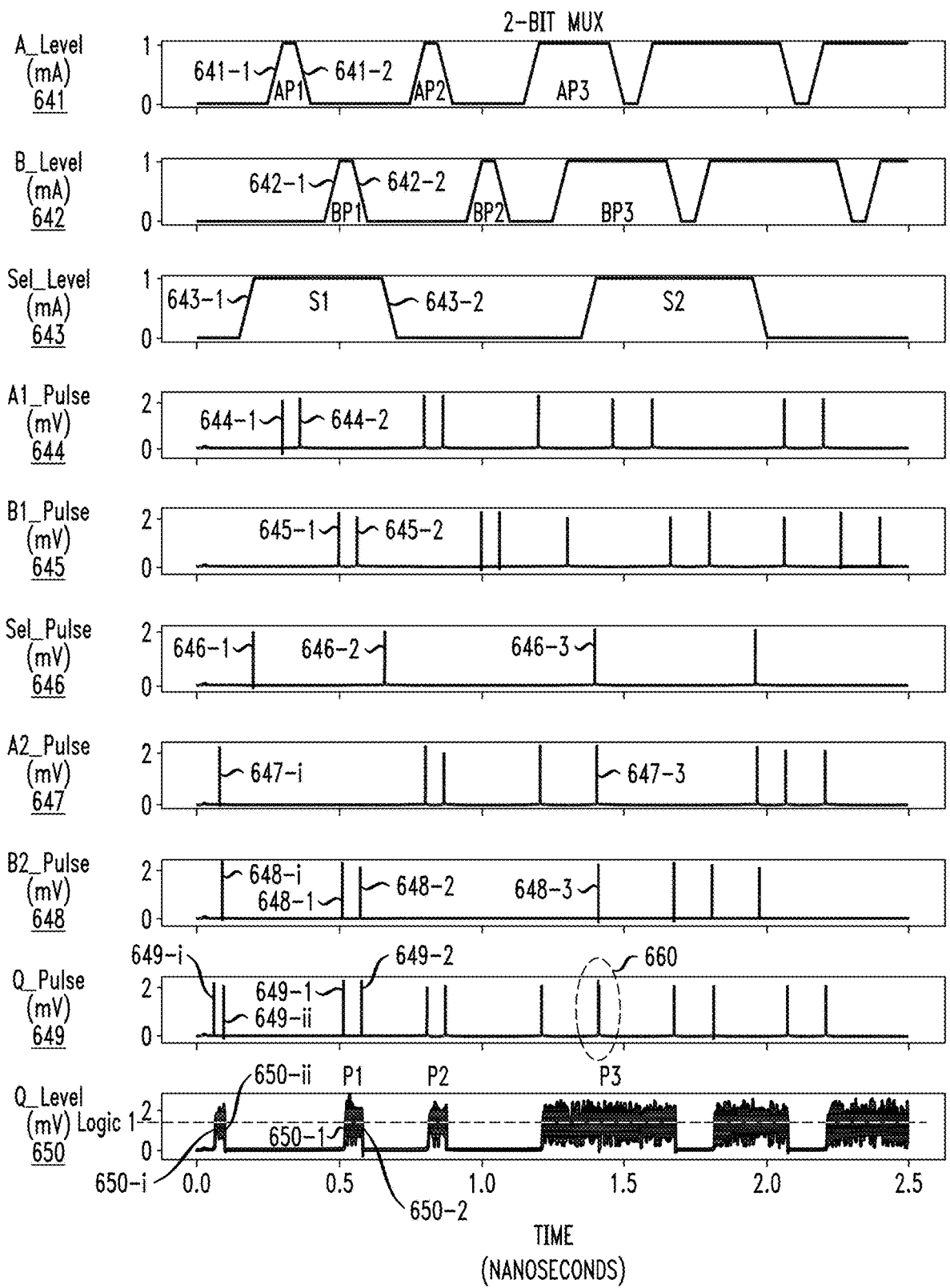
FIG. 6B depicts waveform diagrams that illustrate an exemplary mode of operation of the clockless SFQ logic circuitry of FIG. 6A configured as a 2-bit multiplexer gate, according to an exemplary embodiment of the disclosure.

FIG. 6B depicts waveform diagrams 640 that illustrate an exemplary mode of operation of the clockless SFQ logic circuitry 600 when configured as a 2-bit multiplexer gate, according to an exemplary embodiment of the disclosure. The waveform diagrams in FIG. 6B include (i) an A_Level input waveform 641 and a B_Level input waveform 642, which are input to the first and second input ports 601 and 602 of the clockless SFQ logic circuitry 600, (ii) a Sel_Level waveform 643 which is input to the select control input port 603 of the clockless SFQ logic circuitry 600, (iii) an A1_Pulse waveform 644 which is input to the input port A of the core logic gate 632-1, (iv) a B1_Pulse waveform 645 which is input to the input port B of the core logic gate 632-2, (v) a Sel_Pulse waveform 646 which represents SFQ pulses that are output from the dDC/SFQ converter 612-3 in response to rising and falling edges of the Sel_Level waveform 643, and applied to the input port B of the first core logic gate 632-1 and the input port A of the second core logic gate 632-2, (vi) an A2_Pulse waveform 647 which is input to the input port A of the third core logic gate 632-3, (vii) a B1_Pulse waveform 648 which is input to the input port B of the third core logic gate 632-3, (viii) a Q_Pulse waveform 649 which represents SFQ pulses that are input to the SFQ/DC converter 622, and (ix) a Q_Level waveform 650 which represents an output of the SFQ/DC converter 622.

FIG. 6B illustrates that all waveforms 641-650 are initially at 0 levels (at time 0.0 ns). FIG. 6B shows an initialization process which comprises applying an initialization SFQ pulse 649-i (Q_Pulse waveform 649) to the input port A of the SFQ/DC converter 622 to trigger a state transition of the SFQ/DC converter 622 from a logic "0" level to a logic "1" level, which causes a transition 650-i of the Q_Level waveform 650 from a logic "0" level to a logic "1" level. In some embodiments, the state transition is performed by the state initialization block 636-7 injecting the initialization SFQ pulse 649-i into the output stage 620.

Next, an initialization SFQ pulse 647-i (A2_Pulse waveform 647) is applied to the input port A of the third core logic gate 632-3, which causes the first T flip-flop 120-1 of the third core logic gate 632-3 to switch its internal state from a logic "0" level to a logic "1" level. The initialization SFQ pulse 647-i also causes a readout of the state of the second T flip-flop 120-2 of the third core logic gate 632-3, which is logic "0" at that time. Consequently, the initialization SFQ pulse 647-i does not result in a change in the logic level of the Q_Level waveform 650.

Next, an initialization SFQ pulse 648-i (B2_Pulse waveform 648) is applied to the input port B of the third core logic gate 632-3, which causes the second T flip-flop 120-2 of the third core logic gate 632-3 to switch its internal state from a logic "0" level to a logic "1" level. The initialization SFQ pulse 648-i also causes a readout of the state of the first T flip-flop 120-1 of the third core logic gate 632-3, which is logic "1" at that time. As such, the readout of the state of the first T flip-flop 120-1 of the third core logic gate 632-3 results in an initialization SFQ pulse 649-ii (Q_Pulse waveform 649) which causes a state transition of the SFQ/DC converter 622 from a logic "1" level to a logic "0" level, which results in a transition 650-ii of the Q_level waveform 650 from the logic "1" level to the logic "0" level. Following the initialization process, since the A_Level input waveform 641, the B_Level input waveform 642, and the Sel_Level waveform 643 are logic "0" levels, the Q_Level waveform 650 remains at the logic "0" level.

Next, a rising edge 643-1 of the Sel_Level waveform 643 triggers an SFQ pulse 646-1 to be output from the third dDC/SFQ converter 612-3. The SFQ pulse 646-1 is applied to the input port IN of the SFQ splitter 634, whereby the SFQ pulse 646-1 is split and applied to (i) the input port B of the first core logic gate 632-1 and to (ii) the input port A of the second core logic gate 632-2. In the first core logic gate 632-1, the SFQ pulse 646-1 triggers a change in the state of the second T flip-flop 120-2 (from the logic "0" state to a logic "1" state), and causes a non-destructive readout of the state of the first T flip-flop 120-1. Moreover, in the second core logic gate 632-2, the SFQ pulse 646-1 triggers a change in the state of the first T flip-flop 120-1 (from the logic "0" state to a logic "1" state), and causes a non-destructive readout of the state of the second T flip-flop 120-2. Since the readout states of the first and second T flip-flops of the respective second and first core logic gates are both logic "0" states, the Q_Level waveform 650 remains at a logic "0" level.

Next, a rising edge 641-1 of the A_Level input waveform 641 triggers an SFQ pulse 644-1 to be output from the first dDC/SFQ converter 612-1. The SFQ pulse 644-1 is applied to the input port A of the first core logic gate 632-1, which triggers a change in the state of the first T flip-flop 120-1 (from the logic "0" state to a logic "1" state), and causes a non-destructive readout of the state of the second T flip-flop 120-2. The readout SFQ pulse is applied to the input port A of the third core logic gate 632-3, and causes the first T flip-flop (TFF_A) to transition to a logic "1" state and the second T-flop (TFF-B) to readout a logic "0" state. Since the readout state of second T flip-flop is a logic "0" state, the Q_Level waveform 650 remains at a logic "0" level.

Next, a falling edge 641-2 of the A_Level input waveform 641 triggers an SFQ pulse 644-2 to be output from the first dDC/SFQ converter 612-1. The SFQ pulse 644-2 is applied to the input port A of the first core logic gate 632-1, which triggers a change in the state of the first T flip-flop 120-1 (from the logic "1" state to a logic "0" state), and which causes a non-destructive readout of the state of the second T flip-flop 120-2, which is applied to the input port A of the third core logic gate 632-3. At this time, the current internal states of the first core logic gate 632-1 and the third core logic gate 632-3 are such that the SFQ pulse 644-2 (A1_Pulse waveform 644) does not result in an SFQ pulse being output from third core logic gate 632-3. Consequently, the Q_Level waveform 650 remains at a logic "0" level.

Next, a rising edge 642-1 of the B_Level input waveform 642 triggers an SFQ pulse 645-1 to be output from the third dDC/SFQ converter 612-3. The SFQ pulse 645-1 is applied to the input port B of the second core logic gate 632-2, which triggers a change in the state of the first T flip-flop 120-1 and a non-destructive readout of the state of the second T flip-flop 120-1 of the second core logic gate 632-2. At this time, the current internal states of the second core logic gate 632-2 and the third core logic gate 632-3 are such that the SFQ pulse 645-1 (B1_Pulse waveform 645) input to the input port B of the second core logic gate 632-2 results in (i) an SFQ pulse 648-1 (B2_Pulse waveform 648) being readout from the second core logic gate 632-2 and applied to the input port B of the third core logic gate 632-3, and (ii) an SFQ pulse 649-1 (Q_Pulse waveform 649) being readout from the third core logic gate 632-2 and applied to the input port of the SFQ/DC converter 622. Consequently, the Q_Level waveform 650 transitions 650-1 from the logic "0" level to the logic "1" level.

Next, a falling edge 642-2 of the B_Level input waveform 642 triggers an SFQ pulse 645-2 to be output from the third dDC/SFQ converter 612-3. The SFQ pulse 645-2 is applied to the input port B of the second core logic gate 632-2, which triggers a change in the state of the first T flip-flop 120-1 and a non-destructive readout of the state of the second T flip-flop 120-1 of the second core logic gate 632-2. At this time, the current internal states of the second core logic gate 632-2 and the third core logic gate 632-3 are such that the SFQ pulse 645-2 (B1_Pulse waveform 645) input to the input port B of the second core logic gate 632-2 results in (i) an SFQ pulse 648-1 (B2_Pulse waveform 648) being readout from the second core logic gate 632-2 and applied to the input port B of the third core logic gate 632-3, and (ii) an SFQ pulse 649-1 (Q_Pulse waveform 649) being readout from the third core logic gate 632-2 and applied to the input port of the SFQ/DC converter 622. Consequently, the Q_Level waveform 650 transitions 650-2 from the logic "1" level to the logic "0" level.

Next, a falling edge 643-2 of the Sel_Level waveform 643 triggers an SFQ pulse 646-2 to be output from the third dDC/SFQ converter 612-3. The SFQ pulse 646-2 is applied to the input port IN of the SFQ splitter 634, whereby the SFQ pulse 646-2 is split and applied to (i) the input port B of the first core logic gate 632-1 and to (ii) the input port A of the second core logic gate 632-2. At this time, the current internal states of the first, second, and third core logic gates 632-1, 632-2, and 632-3 are such that no SFQ pulses are readout from any of the first, second, and third core logic gates 632-1, 632-2, and 632-3. Consequently, the Q_Level waveform 650 remains at the logic "0" level.

FIG. 6B illustrates a point in time, e.g., around 1.46 nanoseconds (as represented by a vertical dashed line) where two proximate SFQ pulses 660 exist in the Q_Pulse waveform 649. The two proximate SFQ pulses 660 are the result of the Sel_Level waveform 643 being asserted to the logic "1" level at the time when both the A_Level input waveform 641 and the B_Level input waveform are at logic "1" levels. In this instance, an SFQ pulse 646-3, which is generated and applied to input of the SFQ splitter 634, is split and applied to the first and second core logic gates 632-1 and 632-2, causing an SFQ pulse 647-3 (A2_Pulse waveform 647) and an SFQ pulse 648-3 (B2_Pulse waveform 648) to be output from the first and second core logic gates 632-1 and 632-2 at substantially the same time. However, the delay block 638 serves to delay the input of the SFQ pulse 648-3 to the input port B of the third core logic gate 632-3, so that the SFQ pulse 648-3 is applied subsequent to the input of the SFQ pulse 647-3 to the input port A of the third core logic gate 632-3. With this exemplary configuration, the delay between the input SFQ pulses 647-3 and 648-3 is configured to meet the skew timing requirements for two input SFQ pulses being applied to input ports of the core logic gate with a specific minimum skew to avoid metastable states that can arise with too small a skew of input SFQ pulses. The JTL delay block 638 can be utilized in other SFQ combinational logic circuits where a single SFQ pulse is split along two paths and then they reconverge later.

FIG. 6B shows exemplary 2-bit multiplexer gate operations which correspond to the following multiplexer truth table:

| Sel_Level | A_Level | B_Level | Q_Level |
| --- | --- | --- | --- |
| 0 | 0 | 0 | 0 |
| 0 | 0 | 1 | 0 |
| 0 | 1 | 0 | 1 |
| 0 | 1 | 1 | 1 |
| 1 | 0 | 0 | 0 |
| 1 | 0 | 1 | 1 |
| 1 | 1 | 0 | 0 |
| 1 | 1 | 1 | 1 |

In particular, FIG. 6B shows two-bit multiplexer gate operations where, for example, the Q_Level waveform 650 is asserted to a logic "1" level during (i) a period P1 where the Sel_Level waveform 643 (S1 pulse) and the B_Level input waveform 642 (BP1 pulse) are both at logic "1" levels and the A_Level input waveform 641 is at a logic "0" level, (ii) a period P2 where the Sel_Level waveform 643 and the B_Level input waveform 642 are both at logic "0" levels and the A_Level input waveform 641 (AP2 pulse) is at a logic "1" level. The various state transitions and SFQ pulse signal events that occur in response to the different logic states of the A_Level, B_Level, and Sel_Level input waveforms as shown in FIG. 6B are similar to the state transitions and SFQ pulse signal events that occur in response to the input pulses AP1 and BP1 and select pulse S1, as discussed above, the details of which are shown by the waveform diagrams of FIG. 6B and will not be repeated.

Next, FIG. 7A is a block diagram of clockless SFQ logic circuitry comprising a full adder gate that is configured using multiple instances of the configurable logic gate of FIG. 1, according to an exemplary embodiment of the disclosure. In particular, FIG. 7A is a block diagram of combinational network comprising clockless SFQ logic circuitry 700 (alternatively, full adder gate circuit 700) which comprises input ports 701, 702, and 703, output ports 704 and 705, an input stage 710, an output stage 720, and a configurable logic circuit 730 coupled between the input and output stages 710 and 720. The input stage 710 comprises dDC/SFQ converters 712-1, 712-2, and 712-3, which are configured to convert two-level current signals to SFQ pulses. The output stage 720 comprises SFQ/DC converters 722-1 and 722-2, which are configured to convert SFQ pulses into two-level voltage signals.

The configurable SFQ logic circuit 730 comprises a plurality of core logic gates 732-1, 732-2, and 732-3, a plurality of SFQ splitters 734-1, 734-2, 734-3, and 734-4, a plurality of state initialization blocks 736-1, 736-2, 736-3, 736-4, 736-5, 736-6, 736-7, and 736-8, and a plurality of confluence buffers 738-1 and 728-2. With this circuit architecture, the configurable logic circuit 730 can be configured to implement a full adder gate by configuring the first and second core logic gates 732-1 and 732-2 as AND logic gates, configuring the third core logic gate 732-3 as an OR logic gate, and utilizing the confluence buffers 738-1 and 738-2 as XOR gates.

The clockless SFQ logic circuitry 700, when configured as a full adder, operate by adding three inputs A_Level, B_Level, and C_Level, where the inputs A_Level and B_Level represent two one-bit numbers, and the input C_Level represents in input carry, and generating two outputs including a normal sum output S_Out, and an output carry C_Out. In an exemplary architecture, the A_Level and B_Level inputs are input to a first XOR gate implemented by the first confluence buffer 738-1. The output of the first XOR gate (first confluence buffer 738-1) and the C_Level input are applied to a second XOR gate implemented by the second confluence buffer 738-2, wherein the sum output S_Out is output from the second XOR gate (second confluence buffer 738-2). The A_Level and B_Level inputs are input to a first AND gate that is implemented by the first core logic gate 732-1. The output of the first XOR gate (first confluence buffer 738-1) and the C_Level input are input to a second AND gate that is implemented by the second core logic gate 732-2. The outputs of the first and second AND gates (first and second core logic gates 732-1 and 732-2) are input to an OR gate that is implemented by the third core logic gate 732-3. The output carry C_Out is output from the OR gate (third core logic gate 732-3).

Figure 7B:
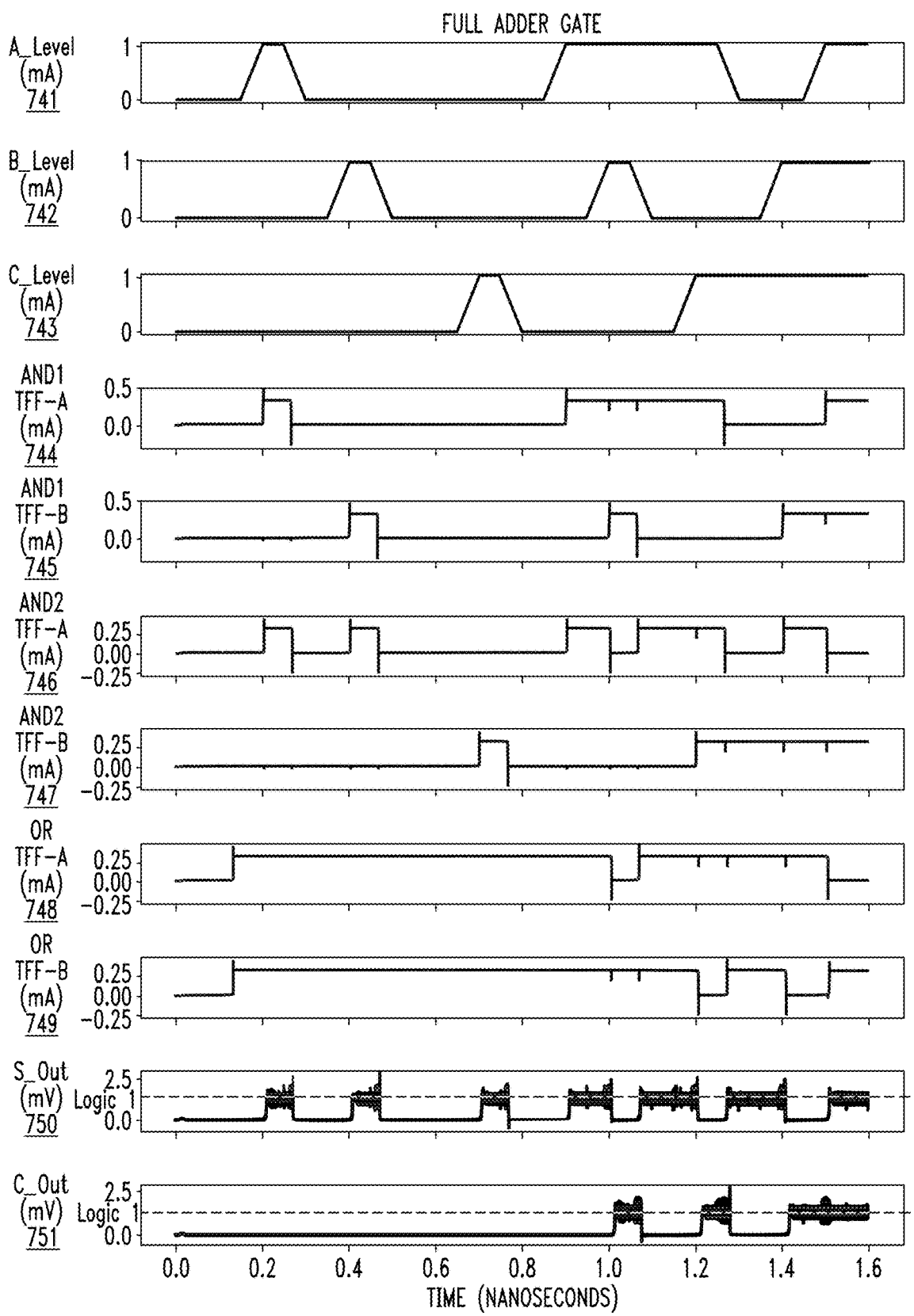
FIG. 7B depicts waveform diagrams that illustrate an exemplary mode of operation of the clockless SFQ logic circuitry of FIG. 7A, according to an exemplary embodiment of the disclosure.

FIG. 7B depicts waveform diagrams 740 that illustrate an exemplary mode of operation of the clockless SFQ logic circuitry 700 when configured as full adder gate, according to an exemplary embodiment of the disclosure. In FIG. 7B, an A_Level waveform 741 and a B_Level waveform 742 represent data inputs to the first and second input ports 701 and 702 of the clockless SFQ logic circuitry 700. A C_Level waveform 743 represents an input carry waveform that is applied to the third input port 703 of the clockless SFQ logic circuitry 700. An AND1 TFF-A waveform 744 and AND1 TFF-B waveform 745 represent internal states of the respective first and second T flip-flops 120-1 and 120-2 of the first core logic gate 732-1 (configured as the first AND gate). Similarly, an AND2 TFF-A waveform 746 and AND2 TFF-B waveform 747 represent internal states of the respective first and second T flip-flops 120-1 and 120-2 of the second core logic gate 732-2 (configured as the second AND gate). In addition, an OR TFF-A waveform 748 and OR TFF-B waveform 749 represent internal states of the respective first and second T flip-flops 120-1 and 120-2 of the third core logic gate 732-3 (configured as the OR gate). An S_Out waveform 750 represents a sum output from the first output port 704 of the clockless SFQ logic circuitry 700, and a C_Out waveform 751 represents an output carry from the second output port 705.

FIG. 7B shows exemplary full adder gate operations which correspond to the following full adder logic truth table:

| A_Level | B_Level | C_Level | S_Out | C_Out |
|---------|---------|---------|-------|-------|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

In a VLSI logic circuit, a large number of clockless SFQ logic gates can be utilized to implement combinational logic clouds, wherein data is fed into a given combinational logic cloud (in a given clock cycle) using a set of clocked registers at an input of the given combinational logic cloud which are controlled by a system clock, and output data generated by the given combinational logic cloud is captured by a set of clocked registers at the output of the given combinational logic cloud (in a next clock cycle). The captured data is then released to the next combinational logic cloud in a next clock cycle. In this configuration, a system clock controls the clock cycles for inputting data to a given combinational logic cloud and capturing data generated and output from the given combinational logic cloud.

The exemplary clockless SFQ combinational logic circuits as disclosed herein implement circuits on the input and output edges of the clockless SFQ combinational logic circuits to enable conversions between two-level input/output signals and SFQ circuitry. For example, in some embodiments, on the input edge, the two-level current input signals (e.g., A_Level, B_Level, C_Level, etc.) are generated using current sources which generate a constant current level. In some embodiments, the two-level current signals are inductively coupled to dual-output DC/SFQ conversion circuits (see, e.g., FIG. 10), which generate pulses on both rising and falling edges of the two-level current signals. In some embodiments, it is useful to have clocked SFQ circuits at the edges of the combinational logic. At the output edge of a clockless SFQ combinational circuit, conversion can be implemented using a single non-destructive readout T flip-flop with a clock signal applied to the readout control input port of the non-destructive readout T flip-flop. For the input, a previous logical state is compared to a current state using, e.g., a splitter that has a first output that is applied to a D flip-flop and a second output that is applied to a clocked XOR gate. The other input of the clocked XOR gate is connected to the output of the D flip-flop. As long as the D flip-flop is clocked first before the clocked XOR gate, the previous state can be compared to the current state and only output a pulse the previous and current states are different.

The various gates and logic blocks as discussed herein (e.g., JTLs, SFQ splitters, confluence buffers, T flip-flops, dDC/SFQ converters, SFQ/DC converters, etc.) can be implemented using SFQ circuit architectures that are suitable for the given application. The SFQ circuits utilize Josephson junctions as switching elements. As is known in the art, the critical current (generally denoted $I_c$) of a Josephson junction denotes a maximum amount of current that can coherently flow through the Josephson junction, while exhibiting no resistive dissipation. In particular, a Josephson junction operates as a nonlinear superconducting inductor when the amount of superconducting current flowing through the Josephson junction is less than the critical current. However, when the current flow through the Josephson junction exceeds its critical current, the Josephson junction temporarily transitions to a resistive state, which causes a finite voltage to develop across the Josephson junction. In the context of dynamic storage loops as discussed, such temporary switching of a Josephson junction allows a discrete amount of magnetic flux (i.e., a single flux quantum, or "fluxon") to enter or exit a storage loop which comprises the given Josephson junction, after which the given Josephson junction becomes superconducting again.

It is to be noted that each Josephson junction depicted in the illustrative embodiments shown in the drawings comprises a Josephson tunnel junction device that is shunted with a resistor. In this regard, the term Josephson junction as used herein refers to a resistively shunted Josephson tunnel junction. The shunt resistor targets a specific value to achieve a condition referred to as critical damping (e.g., critical damping of an LC resonance of the Josephson tunnel junction between the capacitance C of the tunnel junction and the inductance L associated with a superconducting current of the tunnel junction), which directly affects the primary time constant of a Josephson junction. For example, if the resistance of the shunt resistor were reduced by 50%, the time constant would double.

Figure 8A:
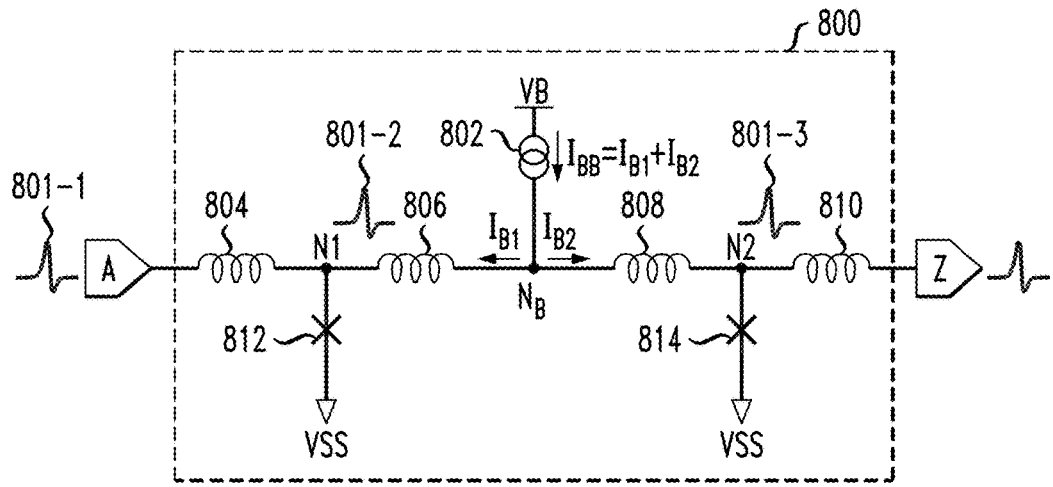
FIG. 8A schematically illustrates a Josephson transmission line, according to an exemplary embodiment of the disclosure.

FIG. 8A schematically illustrates a Josephson transmission line, according to an exemplary embodiment of the disclosure. More specifically, FIG. 8A schematically illustrates an exemplary embodiment of a Josephson transmission line 800 (or JTL 800) which can be used to implement the JTL blocks (e.g., SFQ buffers) as shown, for example, in FIGS. 2, 5A, and 6A. The JTL 800 comprises an input port A, and output port Z, a DC bias circuit 802, superconducting inductors 804, 806, 808, and 810 (non-quantizing inductors), and Josephson junctions 812 and 814. The JTL 800 comprises a multi-stage JTL buffer circuit comprising a first stage which comprises the first Josephson junction 812 and the superconducting (non-quantizing) inductor 806, and a second stage which comprises the second Josephson junction 814 and the superconducting (non-quantizing) inductor 808.

The DC bias circuit 802 is coupled between a positive supply voltage node VB and an intermediate node NB (bias current injection node) between superconducting inductors 806 and 808. The intermediate node NB is an output node of the first JTL stage and an input node of the second JTL stage. While the DC bias circuit 802 is generically depicted in FIG. 8A, it is to be understood that the DC bias circuit 802 can be implemented using a resistor for an RSFQ bias circuit or implemented using an RSFQ bias circuit comprising a limiter Josephson junction connected in series with a large superconducting inductor, as is known in the art.

The superconducting inductors 804, 806, 808, and 810 are designed to have relatively low inductance values such that the superconducting inductors 804, 806, 808, and 810 are non-quantizing inductors to ensure that (i) no magnetic flux quanta can be stored/trapped between the JTL stages and that (ii) an input SFQ pulse 801-1 results in a relatively high magnitude circulating current to cause the successive switching of the Josephson junctions 812 and 814.

As shown in FIG. 8A, the input SFQ pulse 801-1 applied to the input port A generates a circulating current which causes the first Josephson junction 812 to be temporarily driven above its critical current $I_C$ which, in turn, causes the Josephson junction 812 to switch and generate an SFQ pulse 801-2 at node N1. The SFQ pulse 801-2 generates a circulating current which causes the second Josephson junction 814 to be temporarily driven above its critical current $I_C$ which, in turn, causes the second Josephson junction 814 to switch and generate an SFQ pulse 801-3 at node N2, which output from the output port Z. The JTL 800 essentially operates as an SFQ pulse repeater, wherein the input SFQ pulse 801-1 is actively regenerated at each of the node N1 and N2 in succession after a short propagation delay.

Figure 8B:
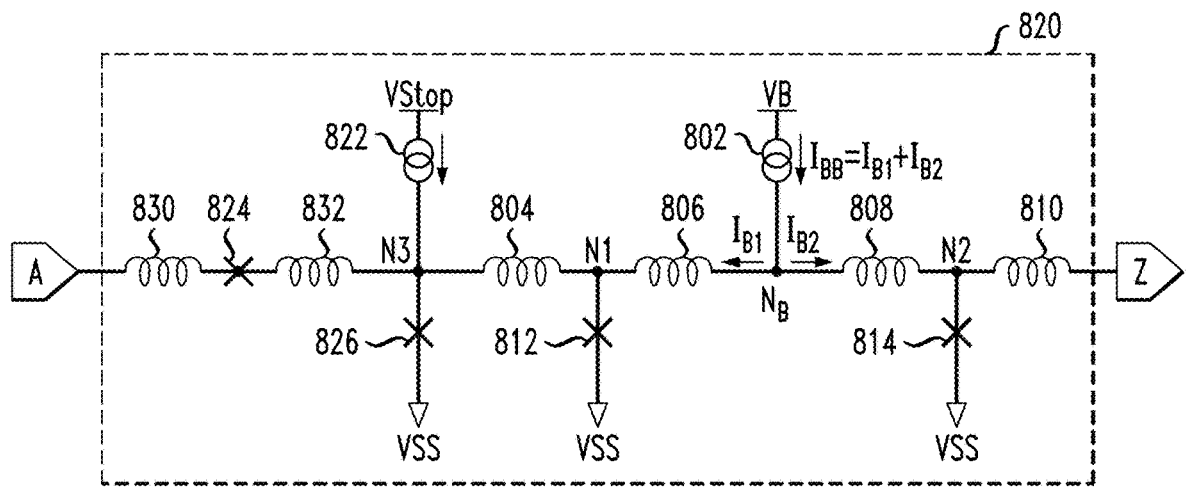
FIG. 8B schematically illustrates a blocking Josephson transmission line, according to an exemplary embodiment of the disclosure.

FIG. 8B schematically illustrates a blocking Josephson transmission line, according to an exemplary embodiment of the disclosure. In particular, FIG. 8B schematically illustrates a blocking JTL 820 which is similar to the JTL 800 of FIG. 8A, except that the blocking JTL 820 comprises an additional DC bias circuit 822 which is driven by a control voltage VStop, and additional Josephson junctions 824 and 826, and superconducting inductors 830 and 832 (non-quantizing inductors) at the input port A of the blocking JTL 820. The blocking JTL 820 is configured to either allow or block the passage of an input SFQ pulse at the input port A depending on the control voltage VStop.

In particular, when the control voltage VStop is asserted at a logic "0" level, no bias current is injected into node N3. In this instance, an input SFQ pulse applied to the input port A will cause the Josephson junction 824 to switch, but the Josephson junction 826 will not switch (as there is insufficient current to drive the Josephson junction 826 above its critical current $I_C$ and cause the Josephson junction 826 to switch and generate an SFQ pulse at node N3). The switching of the Josephson junction 824 and non-switching of the Josephson junction 826 results in rejecting the input SFQ pulse.

On the other hand, when the control voltage VStop is asserted at a logic "1" level (e.g., VB voltage level), bias current is injected into node N3 to bias the Josephson junction 826. In this instance, the input SFQ pulse applied to the input port A creates a circulating current which, together with the bias current injected into node N3, is sufficient to temporally drive the Josephson junction 826 above its critical current $I_C$ and cause the Josephson junction 826 to switch and generate an SFQ pulse at node N3, and successively regenerate SFQ pulses at nodes N1 and N2 to output an SFQ pulse from the output port Z. As explained in further detail below, in some embodiments, the blocking JTL 820 is utilized to implement a blocking confluence buffer which, in turn, may be utilized to implement the state initialization blocks shown, for example, in FIGS. 2, 5A, 6A, and 7A.

Figure 9:
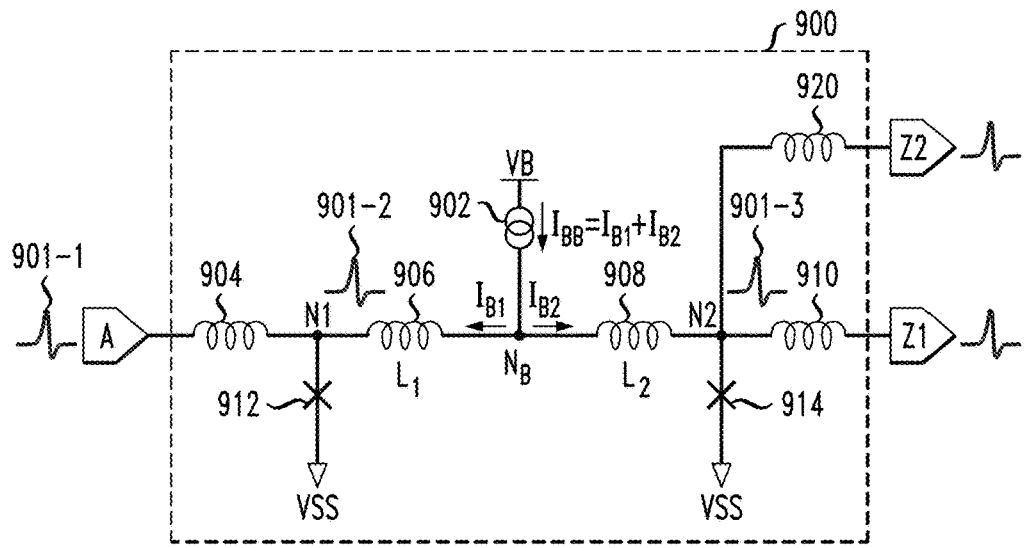
FIG. 9 schematically illustrates an SFQ pulse splitter, according to an exemplary embodiment of the disclosure.

FIG. 9 schematically illustrates an SFQ pulse splitter, according to an exemplary embodiment of the disclosure. More specifically, FIG. 9 schematically illustrates an exemplary embodiment of an SFQ pulse splitter 900 which can be used to implement the SFQ pulse splitter blocks as shown, for example, in FIGS. 1, 2, 6A, and 7A. The SFQ pulse splitter 900 comprises an input port A, a first output port Z1, and a second output port Z2. In addition, the SFQ pulse splitter 900 comprises a DC bias circuit 902, superconducting inductors 904, 906, 908, 910, and 920 (non-quantizing inductors), and first and second Josephson junctions 912 and 914.

The SFQ pulse splitter 900 comprises a two-stage JTL circuit similar to the JTL 800 of FIG. 8A, except that the SFQ pulse splitter 900 comprises two superconducting inductors 910 and 912 coupled to the node N2. In operation, as schematically shown in FIG. 9, an input SFQ pulse 901-1 is applied to the input port A and generates a circulating current which causes the Josephson junction 912 to be temporarily driven above its critical current $I_C$ which, in turn, causes the first Josephson junction 912 to switch and generate an SFQ pulse 901-2 at node N1. The SFQ pulse 901-2 generates a circulating current which causes the second Josephson junction 914 to be temporarily driven above its critical current $I_C$ which, in turn, causes the second Josephson junction 914 to switch and generate an SFQ pulse 901-3 at node N2, which is then output from both output ports Z1 and Z2.

Figure 10:
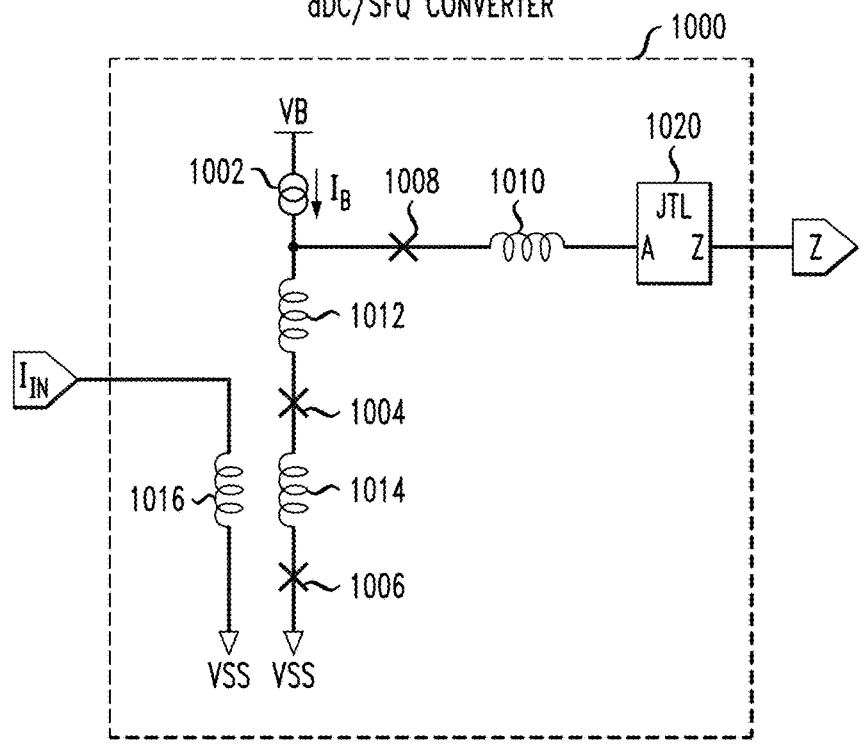
FIG. 10 schematically illustrates a dual-output DC/SFQ converter circuit, according to an exemplary embodiment of the disclosure.

Next, FIG. 10 schematically illustrates a dDC/SFQ converter circuit, according to an exemplary embodiment of the disclosure. More specifically, FIG. 10 schematically illustrates an exemplary embodiment of dDC/SFQ converter circuit 1000 which can be used to implement the dDC/SFQ converters shown, for example, in FIGS. 2, 6A, 6A, and 7A. The dDC/SFQ converter circuit 1000 comprises an input port $I_{IN}$, an output port Z, a DC bias circuit 1002 (e.g., resistor for an RSFQ bias circuit), Josephson junctions 1004, 1006, and 1008, superconducting inductors 1010, 1012, 1014, and 1016, and a JTL circuit 1020. As noted above, the dDC/SFQ converter circuit 1000 is configured to receive as input a two-level current signal at the input port $I_{IN}$, and generate SFQ pulses at the output port Z on each rising and falling edge of the two-level current input signal. As shown in FIG. 10, the dDC/SFQ converter circuit 1000 utilizes inductive coupling at the input, e.g., inductive coupling between the superconducting inductors 1016 and 1014 to inject input current into the dDC/SFQ converter circuit 1000. The JTL circuit 1020 serves as a buffer circuit and can be implemented using the JTL 800 of FIG. 8A.

Figure 11:
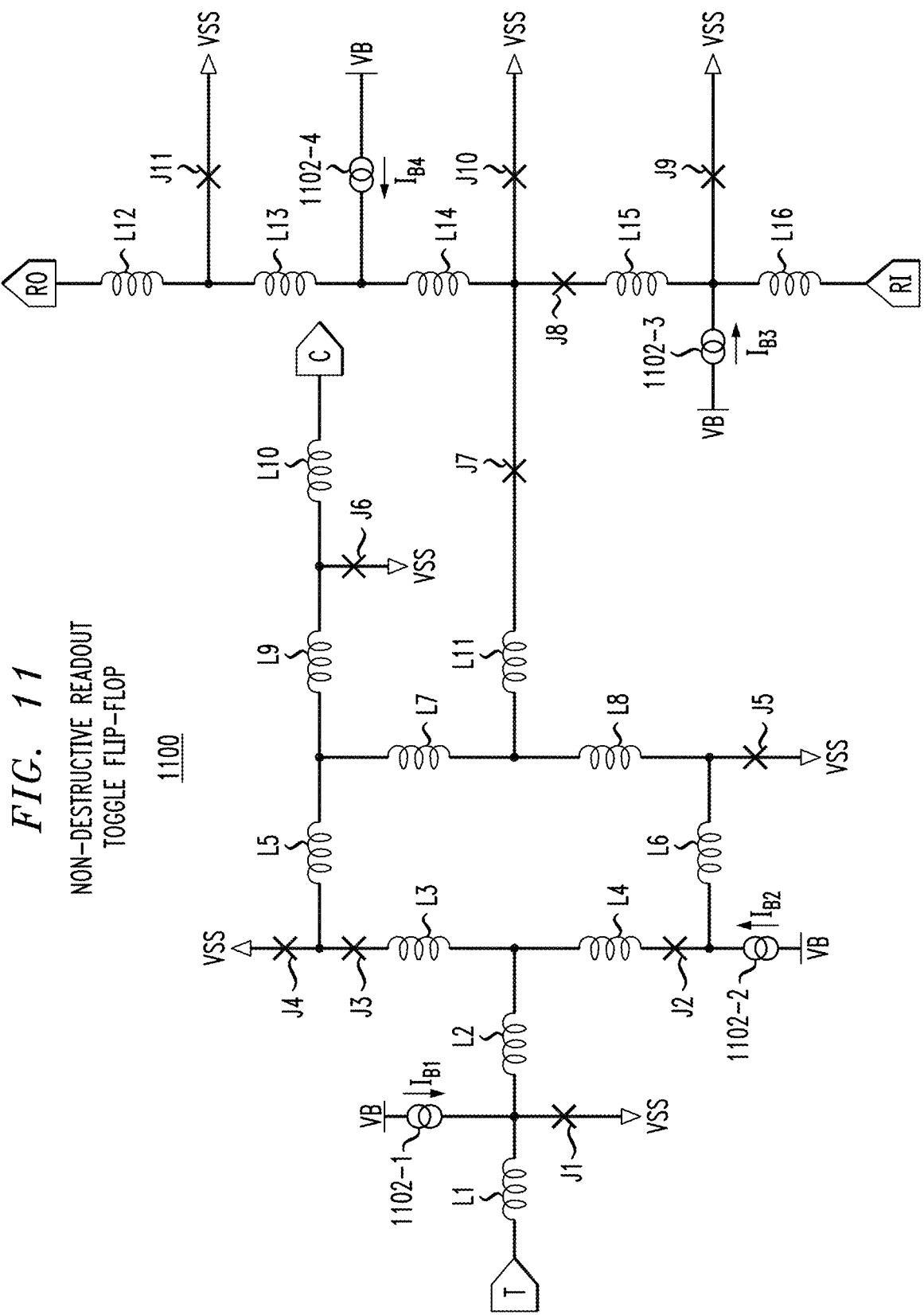
FIG. 11 schematically illustrates a toggle flip-flop circuit with a non-destructive readout architecture, according to an exemplary embodiment of the disclosure.

FIG. 11 schematically illustrates a toggle flip-flop circuit with a non-destructive readout architecture, according to an exemplary embodiment of the disclosure. More specifically, FIG. 11 schematically illustrates an exemplary embodiment of a T flip-flop circuit 1100 with a non-destructive readout cell, which can be used to implement the T flip-flop blocks of the core logic gates as shown, for example, in FIGS. 1, 2, 6A, and 7A. The T flip-flop circuit 1100 comprises a toggle input port T, a read control input port RI, a first output port C (normal output port), and a second output port RO (non-destructive readout port). The T flip-flop circuit 1100 further comprises a plurality of DC bias circuits 1102-1, 1102-2, 1102-3, and 1102-4 which inject respective bias currents $I_{B1}$, $I_{B2}$, $I_{B3}$, and $I_{B4}$ to nodes of the T flip-flop circuit 1100, as schematically shown. The T flip-flop circuit 1100 comprises a plurality of superconducting inductors L1, L2, L3, L4, L5, L6, L7, L8, L9, L10, L11, L12, L13, L14, L15, and L16, and a plurality of Josephson junctions J1, J2, J3, J4, J5, J6, J7, J8, J9, J10, and J11.

The architecture and operating modes of the T flip-flop circuit 1100 with the non-destructive readout cell are well-known and understood by those of ordinary skill in the art. Briefly, the input port T is the toggle input of the T flip-flop circuit 1100, which is formed by the Josephson junctions J1, J2, J3, J5, J5 and J6, and a superconducting quantizing loop is formed by the inductors L3, L4, L5, L6, L7, and L8. The superconducting quantizing loop stores a circulating fluxon for the logic "1" state, while the logic "0" state is when no circulating fluxon is stored in the superconducting quantizing loop. As noted above, the output port C outputs an SFQ pulse on each transition from a logic "0" state to a logic "1" state. Further, the Josephson junctions J7 and J10 which are coupled to the quantizing superconducting loop allow for a non-destructive readout of the internal state of the T flip-flop circuit 1100. When the T flip-flop circuit 1100 is in a logic "0" state (e.g., no flux quantum circulating in the superconducting quantizing loop), when a readout SFQ pulse is applied to the control input port RI, no output is produced at the readout port RO, and thus logic "0" state of the T flip-flop circuit 1110 is successfully read out. On the other hand, when T flip-flop circuit 1110 is in the logic "1" state, an SFQ pulse applied to the control input port RI causes an output SFQ pulse at the output port RO.

Figure 12A:
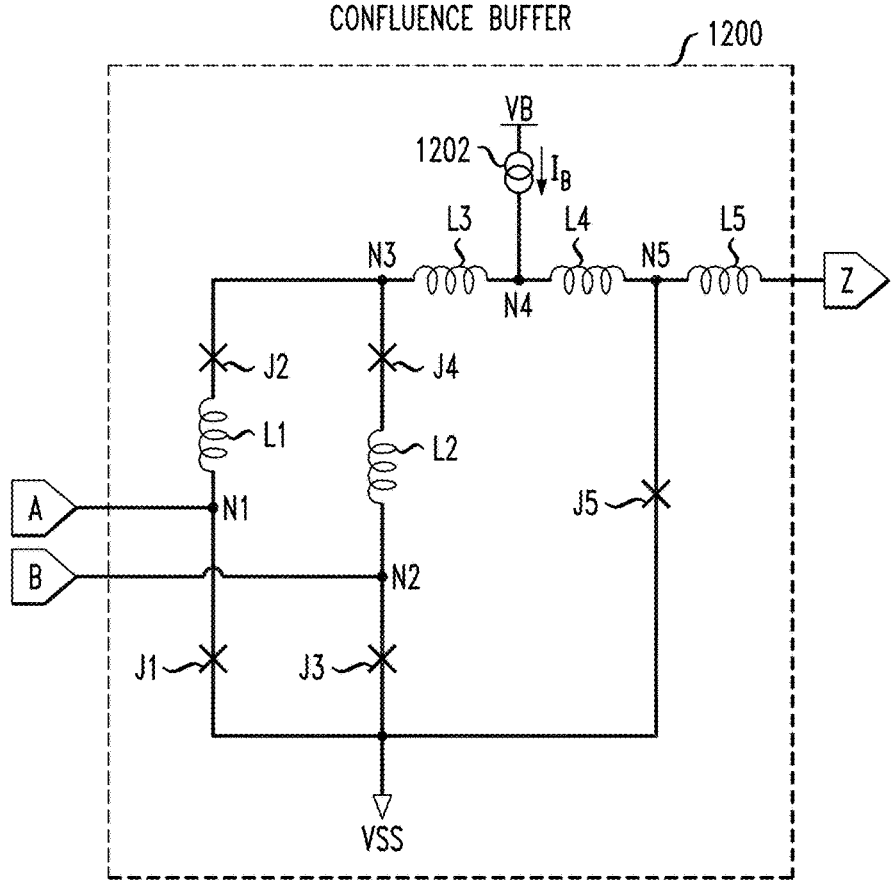
FIG. 12A schematically illustrates a confluence buffer circuit, according to an exemplary embodiment of the disclosure.

FIG. 12A schematically illustrates a confluence buffer, according to an exemplary embodiment of the disclosure. More specifically, FIG. 12A schematically illustrates an exemplary embodiment of a confluence buffer circuit 1200, which can be used to implement the confluence buffer blocks as shown, for example, in FIGS. 1, 5A, and 7A. The confluence buffer circuit 1200 comprises a first input port A, a second input port B, an output port Z, a DC bias circuit 1202, a first input node N1 which is coupled to the first input port A, a second input node N2 which is coupled to second input port B, a bridge of four Josephson junctions J1, J2, J3, and J4, an output Josephson junction J5, and superconducting inductors L1, L2, L3, L4, and L5.

The Josephson junctions J1 and J2 are serially connected between a node N3 and a negative supply voltage node (denoted VSS). The Josephson junctions J3 and J4 are serially connected between the node N3 and the negative supply voltage node VSS. The DC bias circuit 1202 is configured to inject a bias current IB into the node N4. The output Josephson junction J5 is coupled to and between a node N4 and VSS. The DC bias circuit 1202 is configured to generate a static DC bias current IB to provide static bias currents to bias the Josephson junctions J1-J5 with static bias currents that are less than the critical currents of the Josephson junctions. While the DC bias circuit 1202 is generically depicted in FIG. 12A, the DC bias circuit 1202 can be implemented using a resistor for an RSFQ bias circuit or implemented using an ERSFQ bias circuit which comprises a limiter Josephson junction connected in series with a large superconducting inductor, as is known in the art.

The confluence buffer circuit 1200 is configured to merge SFQ pulses from two input lines onto a common output line and operates as follows. When an SFQ pulse is applied to the first input port A, the SFQ pulse causes the Josephson junction J1 to switch. The Josephson junction J2 does not switch and remains in a superconducting state and, therefore, the SFQ pulse generated at node N1 is applied to node N3 and the inductors L3 and L4. The resulting current pulse through the inductors L3 and L4 cause the output Josephson junction J5 to switch, and an SFQ pulse is output from the output port Z. In addition, the Josephson junction J4 switches so that the SFQ pulse does not propagate to the second node N2 and be output from the second input port B. In a similar manner, an SFQ pulse applied to the second input port B causes the Josephson junctions J4, J2, and J5 to switch, resulting in an output SFQ pulse at the output port Z, and preventing the input SFQ pulse at the second input port to propagate out from the first input port A. With this circuit architecture of the confluence buffer circuit 1200, a pair of sufficiently skewed input SFQ pulses to the first and second input ports A and B yields two output SFQ pulses on output port Z. On the other hand, if the skew (time delay) between the first and second input SFQ pulses applied to the respective first and second ports A and B is small (e.g., less than one pulse width), the confluence buffer circuit 1200 will generate one output SFQ pulse as a result of two insufficiently skewed input pulses (metastable state). Therefore, to ensure proper operation, the timing of two input SFQ pulses applied to the respective first and second input ports should have sufficient skew to avoid such metastable state.

Figure 12B:
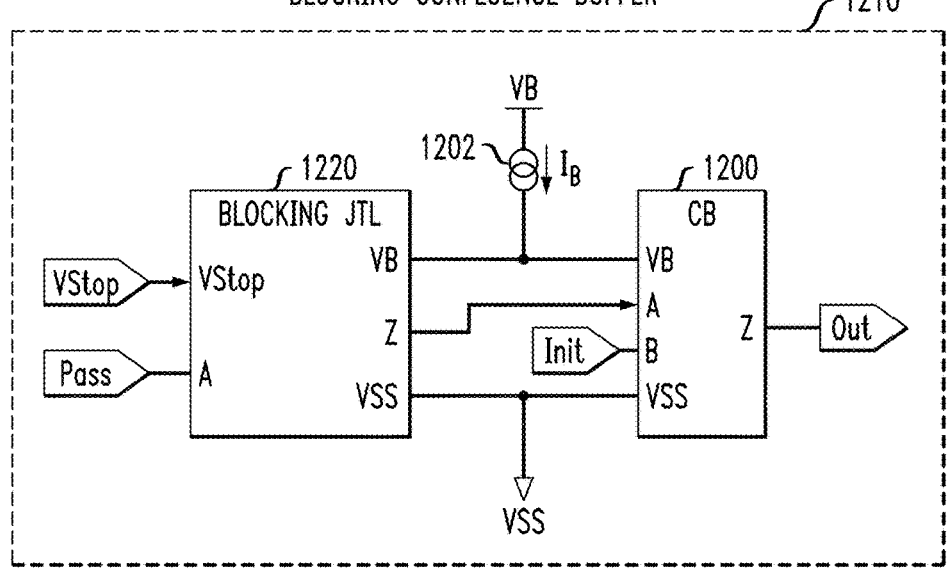
FIG. 12B is a block diagram of a blocking confluence buffer circuit, according to an exemplary embodiment of the disclosure.

FIG. 12B is a block diagram of a blocking confluence buffer, according to an exemplary embodiment of the disclosure. More specifically, FIG. 12B schematically illustrates a blocking confluence buffer 1210 which comprises a confluence buffer circuit 1200 and a blocking JTL circuit 1220. In some embodiments, the confluence buffer circuit 1200 is implemented as shown in FIG. 12A, and the blocking JTL circuit 1220 is implemented using the exemplary blocking JTL circuit of FIG. 8B. In some embodiments, the blocking confluence buffer 1210 is utilized to implement the state initialization blocks (InitBlocks) as shown, for example, in FIGS. 2, 5A, 6A, and 7A. In such embodiments, the VStop control input port of the InitBlock is coupled to a DC bias circuit of the blocking JTL 1220 (e.g., the DC bias circuit 822, FIG. 8B), the input port Pass of the InitBlock is coupled to the input port A of the blocking JTL circuit 1220, the input port Init of the InitBlock is coupled to the second input port B of the confluence buffer circuit 1200, the output port Out of the InitBlock is coupled to the output port Z of the confluence buffer circuit 1200, and the output port Z of the blocking JTL is coupled to the first input port A of the confluence buffer circuit 1200.

The exemplary blocking confluence buffer 1210 operates as follows. When VStop is asserted to a logic "1" level (e.g., VB), an input SFQ pulse applied to the input port Pass will pass through the blocking JTL 1220 to the output port Z thereof, and then pass from the input port A to the output port Z of the confluence buffer circuit 1200, wherein the SFQ pulse is then output from the output port Out of the blocking confluence buffer 1210. On the other hand, when VStop is asserted to a logic "0" level (e.g., zero (0) volts), an input SFQ pulse applied to the input port Pass will be blocked and not passed through the blocking JTL 1220 to the output port Z thereof. Moreover, when a state initialization SFQ pulse is applied to the input port Init of the blocking confluence buffer 1210, the initialization SFQ pulse will pass through the confluence buffer circuit 1200 and output from the output port Out of the blocking confluence buffer 1210. As noted above, a state initialization SFQ pulse, which is applied to the input port Init, is generated by control circuitry. For example, in some embodiments, a state initialization SFQ pulse is generated by applying a current signal (which goes from 0 to 500 uA) to a standard DC/SFQ circuit followed by a JTL buffer, wherein the standard DC/SFQ circuit generates an SFQ pulse on the rising edge on the current signal, and outputs the SFQ pulses to the JTL buffer.

Figure 13:
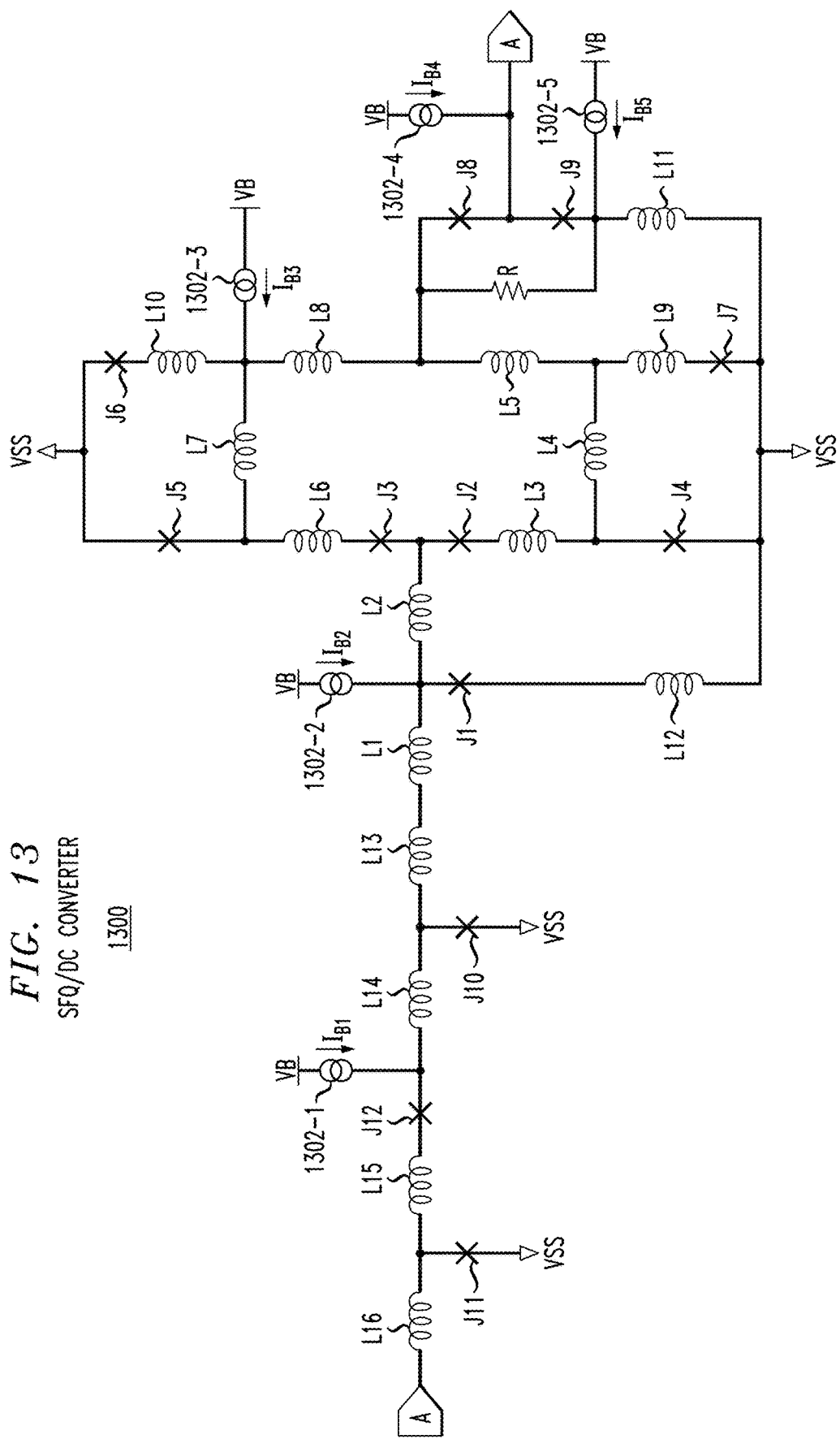
FIG. 13 schematically illustrates an SFQ/DC converter circuit, according to an exemplary embodiment of the disclosure.

FIG. 13 schematically illustrates an SFQ/DC converter circuit, according to an exemplary embodiment of the disclosure. More specifically, FIG. 13 schematically illustrates an exemplary embodiment of an SFQ/DC converter circuit 1300, which can be used to implement the SFQ/DC converters as shown, for example, in FIGS. 2, 5A, 6A, and 7A. The SFQ/DC converter circuit 1300 comprises an input port A, and output port Z, a plurality of DC bias circuits 1302-1, 1302-2, 1302-3, 1302-4, and 1302-5, which inject respective bias currents $I_{B1}$, $I_{B2}$, $I_{B3}$, $I_{B4}$, and $I_{B5}$ to nodes of the SFQ/DC converter circuit 1300, a plurality of superconducting inductors L1, L2, L3, L4, L5, L6, L7, L8, L9, L10, L11, L12, L13, L14, L15, and L16, and a plurality of Josephson junctions J1, J2, J3, J4, J5, J6, J7, J8, J9, J10, and J11, and a resistor R. The architecture and operating modes of the SFQ/DC converter circuit 1300 are well-known and understood by those of ordinary skill in the art. With the exemplary architecture shown in FIG. 13, a primary superconducting quantizing loop is formed by the elements J6, L10, L8, L5, L9, and J7, with the loop spreading somewhat over L4 and J4 (in parallel with L9 and J7), and L7 and J5 (in parallel with L10 and J6).

It is to be noted that the Josephson junctions depicted in the illustrative embodiments shown in the drawings comprise a Josephson tunnel junction device that is shunted with a resistor (e.g., damping resistor). In this regard, the term Josephson junction as used herein refers to a resistively shunted Josephson tunnel junction. The shunt resistor targets a specific value to achieve a condition referred to as critical damping (e.g., critical damping of an LC resonance of the Josephson tunnel junction between the capacitance C of the tunnel junction and the inductance L associated with a superconducting current of the tunnel junction), which directly affects the primary time constant of a Josephson junction.

It is to be appreciated that the exemplary SFQ logic circuits as discussed herein can be utilized to construct various types of combinational logic circuits which are fundamental components for various types of VLSI integrated circuits and devices such as microprocessors for superconducting computing applications. The exemplary SFQ logic circuits described herein can be configured to operate at multiple Gigahertz speeds with very little power dissipation (e.g., low switching energy, sub-femtojoule (fJ)) when operating in cryogenic temperatures (e.g., 4K), which is useful for classical control of quantum systems. For example, FIG. 14 schematically illustrates a superconducting computing system which implements combinational logic circuitry comprising configurable clockless SFQ logic gates, according to an exemplary embodiment of the disclosure.

Figure 14:
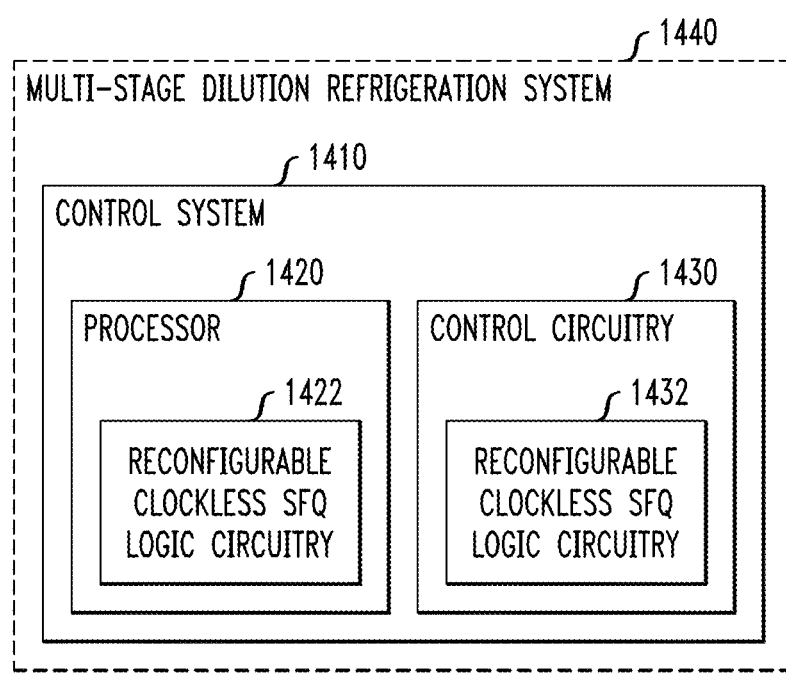
FIG. 14 schematically illustrates a superconducting computing system which implements combinational logic circuitry comprising configurable clockless SFQ logic gates, according to an exemplary embodiment of the disclosure.

More specifically, FIG. 14 schematically illustrates a superconducting computing system 1400 comprising a control system 1410. The control system 1410 comprises at least one processor 1420 which comprises reconfigurable clockless SFQ logic circuitry 1422, and control circuitry 1430 which comprises reconfigurable clockless SFQ logic circuitry 1432. In some embodiments, the control system 1410 is disposed in a dilution refrigeration system 1440 which can generate cryogenic temperatures that are sufficient to operate components of the control system 1410 for superconducting computing applications such as quantum computing applications. In some embodiments, the dilution refrigeration system 1440 comprises different temperature stages such as five temperature stages: 20 millikelvin (mK), 100 mK, 1K, 3-4K, and 40K, wherein different components of the control system 1410 can be cooled down to desired target temperatures, depending on the application.

In some embodiments, the processor 1420 is configured to execute program code to implement one or more HPC applications where in some embodiments, the superconducting reconfigurable clockless SFQ logic circuitry 1422 of the processor 1420 supports standard digital machine architectures and algorithms associated with standard room temperature CMOS computing. In some embodiments, the processor 1420 is configured to execute computer readable program instructions that are embodied on a computer program product which includes a computer readable storage medium (or media) having such computer readable program instructions thereon for causing the processor 1420 to perform various control methods using, for example, the superconducting control circuitry 1430.

In some embodiments, the control system 1410 is implemented for quantum computing to control the operation of an array of superconducting quantum bits (qubits) of a quantum processor. The control system 1410 can be configured to (i) control a multi-channel arbitrary waveform generator (AWG) system that is configured to generate control pulses that are applied to superconducting qubits for performing single-qubit gate operations or multi-qubit bit gate operations (entanglement gate operations), (ii) control a qubit readout system to readout the quantum states of superconducting qubits, (iii) perform quantum error correction operations, etc.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 15:
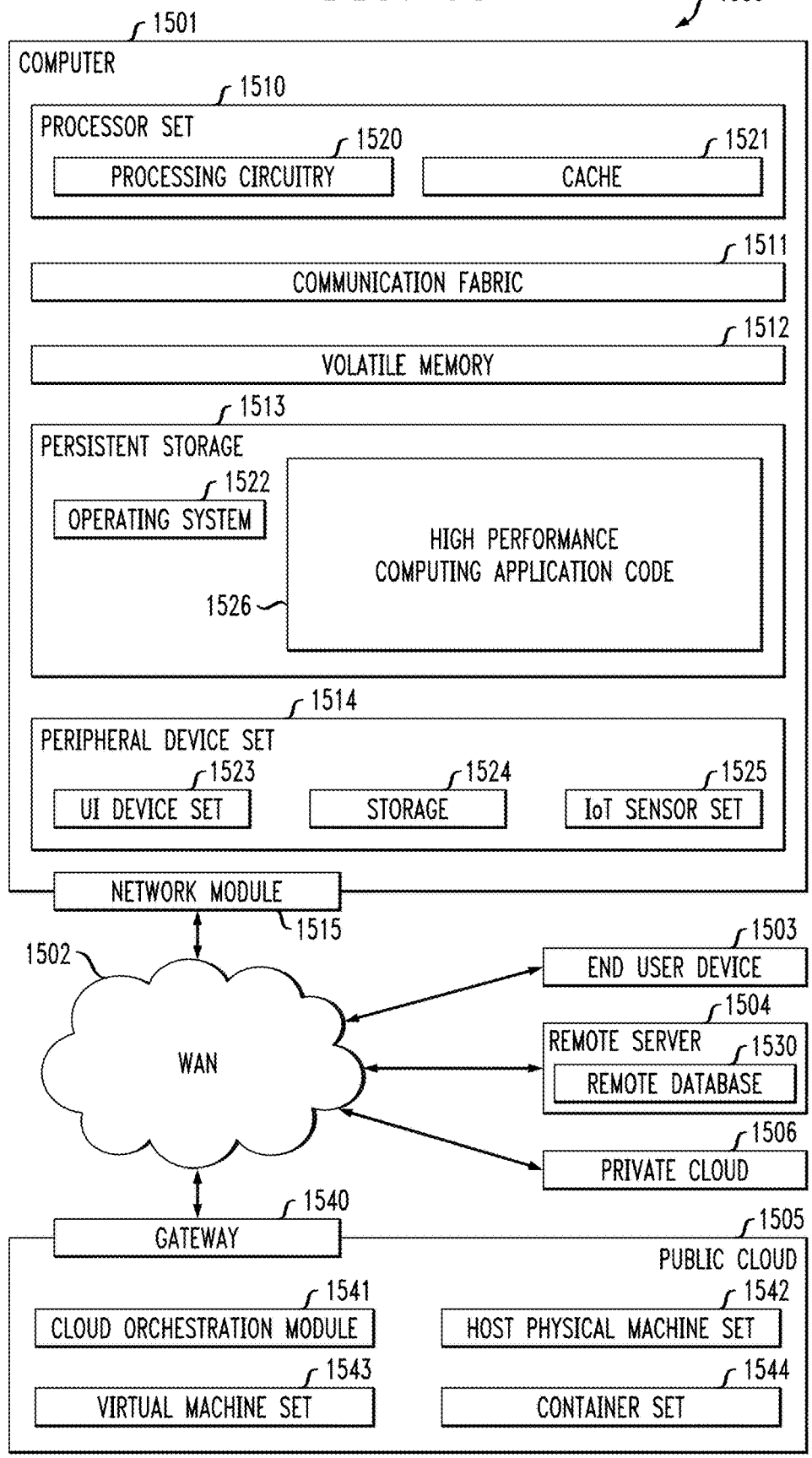
FIG. 15 schematically illustrates an exemplary architecture of a computing environment for hosting a superconducting computing platform, according to an exemplary embodiment of the disclosure.

FIG. 15 schematically illustrates an exemplary architecture of a computing environment 1500 for hosting a superconducting computing platform, according to an exemplary embodiment of the disclosure. Computing environment 1500 of FIG. 15 contains an example of an environment for the execution of at least some of the computer code involved in performing methods for high performance superconducting computing using superconducting clockless configuration SFQ logic circuitry, such as high performance computing application code in block 1526 which is executable by superconducting processors to implement high performance superconducting computing operations or superconducting quantum computing using superconducting SFQ logic circuitry, as discussed herein. In addition to block 1526, computing environment 1500 includes, for example, computer 1501, wide area network (WAN) 1502, end user device (EUD) 1503, remote server 1504, public cloud 1505, and private cloud 1506. In this embodiment, computer 1501 includes processor set 1510 (including processing circuitry 1520 and cache 1521), communication fabric 1511, volatile memory 1512, persistent storage 1513 (including operating system 1522 and block 1526, as identified above), peripheral device set 1514 (including user interface (UI), device set 1523, storage 1524, and Internet of Things (IoT) sensor set 1525), and network module 1515. Remote server 1504 includes remote database 1530. Public cloud 1505 includes gateway 1540, cloud orchestration module 1541, host physical machine set 1542, virtual machine set 1543, and container set 1544.

Computer 1501 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1530. As is well understood in the art of computer technology, and depending upon the technology, performance of a computer-implemented method may be distributed among multiple computers and/or between multiple locations. On the other hand, in this presentation of computing environment 1500, detailed discussion is focused on a single computer, specifically computer 1501, to keep the presentation as simple as possible. Computer 1501 may be located in a cloud, even though it is not shown in a cloud in FIG. 15. On the other hand, computer 1501 is not required to be in a cloud except to any extent as may be affirmatively indicated.

Processor set 1510 includes one, or more, computer processors of any type now known or to be developed in the future. Processing circuitry 1520 may be distributed over multiple packages, for example, multiple, coordinated integrated circuit chips. Processing circuitry 1520 may implement multiple processor threads and/or multiple processor cores. Cache 1521 is memory that is located in the processor chip package(s) and is typically used for data or code that should be available for rapid access by the threads or cores running on processor set 1510. Cache memories are typically organized into multiple levels depending upon relative proximity to the processing circuitry. Alternatively, some, or all, of the cache for the processor set may be located "off chip." In some computing environments, processor set 1510 may be designed for working with qubits and performing quantum computing.

Computer readable program instructions are typically loaded onto computer 1501 to cause a series of operational steps to be performed by processor set 1510 of computer 1501 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1521 and the other storage media discussed below. The program instructions, and associated data, are accessed by processor set 1510 to control and direct performance of the inventive methods. In computing environment 1500, at least some of the instructions for performing the inventive methods may be stored in block 1526 in persistent storage 1513.

Communication fabric 1511 is the signal conduction paths that allow the various components of computer 1501 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1512 is any type of volatile memory now known or to be developed in the future. Examples include dynamic type random access memory (RAM) or static type RAM. Typically, the volatile memory is characterized by random access, but this is not required unless affirmatively indicated. In computer 1501, the volatile memory 1512 is located in a single package and is internal to computer 1501, but, alternatively or additionally, the volatile memory may be distributed over multiple packages and/or located externally with respect to computer 1501.

Persistent storage 1513 is any form of non-volatile storage for computers that is now known or to be developed in the future. The non-volatility of this storage means that the stored data is maintained regardless of whether power is being supplied to computer 1501 and/or directly to persistent storage 1513. Persistent storage 1513 may be a read only memory (ROM), but typically at least a portion of the persistent storage allows writing of data, deletion of data and re-writing of data. Some familiar forms of persistent storage include magnetic disks and solid-state storage devices. Operating system 1522 may take several forms, such as various known proprietary operating systems or open source Portable Operating System Interface type operating systems that employ a kernel. The code included in block 1526 typically includes at least some of the computer code involved in performing the inventive methods.

Peripheral device set 1514 includes the set of peripheral devices of computer 1501. Data communication connections between the peripheral devices and the other components of computer 1501 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1523 may include components such as a display screen, speaker, microphone, wearable devices (such as goggles and smart watches), keyboard, mouse, printer, touchpad, game controllers, and haptic devices. Storage 1524 is external storage, such as an external hard drive, or insertable storage, such as an SD card. Storage 1524 may be persistent and/or volatile. In some embodiments, storage 1524 may take the form of a quantum computing storage device for storing data in the form of qubits. In embodiments where computer 1501 is required to have a large amount of storage (for example, where computer 1501 locally stores and manages a large database) then this storage may be provided by peripheral storage devices designed for storing very large amounts of data, such as a storage area network (SAN) that is shared by multiple, geographically distributed computers. IoT sensor set 1525 is made up of sensors that can be used in Internet of Things applications. For example, one sensor may be a thermometer and another sensor may be a motion detector.

Network module 1515 is the collection of computer software, hardware, and firmware that allows computer 1501 to communicate with other computers through WAN 1502. Network module 1515 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1515 are performed on the same physical hardware device. In other embodiments (for example, embodiments that utilize software-defined networking (SDN)), the control functions and the forwarding functions of network module 1515 are performed on physically separate devices, such that the control functions manage several different network hardware devices. Computer readable program instructions for performing the inventive methods can typically be downloaded to computer 1501 from an external computer or external storage device through a network adapter card or network interface included in network module 1515.

WAN 1502 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1503 is any computer system that is used and controlled by an end user (for example, a customer of an enterprise that operates computer 1501), and may take any of the forms discussed above in connection with computer 1501. EUD 1503 typically receives helpful and useful data from the operations of computer 1501. For example, in a hypothetical case where computer 1501 is designed to provide a recommendation to an end user, this recommendation would typically be communicated from network module 1515 of computer 1501 through WAN 1502 to EUD 1503. In this way, EUD 1503 can display, or otherwise present, the recommendation to an end user. In some embodiments, EUD 1503 may be a client device, such as thin client, heavy client, mainframe computer, desktop computer and so on.

Remote server 1504 is any computer system that serves at least some data and/or functionality to computer 1501. Remote server 1504 may be controlled and used by the same entity that operates computer 1501. Remote server 1504 represents the machine(s) that collect and store helpful and useful data for use by other computers, such as computer 1501. For example, in a hypothetical case where computer 1501 is designed and programmed to provide a recommendation based on historical data, then this historical data may be provided to computer 1501 from remote database 1530 of remote server 1504.

Public cloud 1505 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1505 is performed by the computer hardware and/or software of cloud orchestration module 1541. The computing resources provided by public cloud 1505 are typically implemented by virtual computing environments that run on various computers making up the computers of host physical machine set 1542, which is the universe of physical computers in and/or available to public cloud 1505. The virtual computing environments (VCEs) typically take the form of virtual machines from virtual machine set 1543 and/or containers from container set 1544. It is understood that these VCEs may be stored as images and may be transferred among and between the various physical machine hosts, either as images or after instantiation of the VCE. Cloud orchestration module 1541 manages the transfer and storage of images, deploys new instantiations of VCEs and manages active instantiations of VCE deployments. Gateway 1540 is the collection of computer software, hardware, and firmware that allows public cloud 1505 to communicate through WAN 1502.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1506 is similar to public cloud 1505, except that the computing resources are only available for use by a single enterprise. While private cloud 1506 is depicted as being in communication with WAN 1502, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1505 and private cloud 1506 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a clockless single flux quantum logic circuit comprising an input stage, an output stage, and a configurable logic circuit coupled to and between the input stage and the output stage, wherein:
the configurable logic circuit comprises at least one state initialization circuit;
the configurable logic circuit comprises at least one configurable logic gate which holds an internal state;
the input stage comprises a signal input converter circuit which is configured to receive a two-level input signal and generate a single flux quantum (SFQ) pulse on each rising edge and falling edge of the two-level input signal;
wherein the configurable logic circuit is configured to perform one or more logic operations using the SFQ pulses received from the input stage, and output SFQ pulses to the output stage;
wherein the output stage comprises a signal output converter circuit which is configured to convert each of the output SFQ pulses into a two-level output signal, wherein the signal output converter circuit holds an internal state; and
wherein the configurable logic circuit is configurable to implement a given logic function by the at least one state initialization circuit initializing at least one of the internal state of the signal output converter circuit and the internal state of the at least one configurable logic gate.

2. The device of claim 1, wherein:
the two-level input signal comprises a two-level current signal; and
the two-level output signal comprises a two-level voltage signal.

3. The device of claim 1, wherein the configurable logic circuit is configurable to implement one of a plurality of logic gates including an AND gate, a NAND gate, an OR gate, a NOR gate, an IMPLY gate, a NIMPLY gate, an XOR gate, and an XNOR gate, based on an initialized internal state of at least one of the signal output converter circuit and the at least one configurable logic gate.

4. The device of claim 1, wherein the at least one state initialization circuit of the configurable logic circuit comprises:
a first state initialization circuit that is configured to inject an SFQ pulse into an input port of the at least one configurable logic gate to initialize the internal state of the at least one configurable logic gate; and
a second state initialization circuit that is configured to inject an SFQ pulse into an input port of the signal output converter circuit to initialize the internal state of the signal output converter circuit.

5. The device of claim 4, wherein the first state initialization circuit and the second state initialization circuit each comprise:
a blocking Josephson transmission line; and
a confluence buffer circuit comprising a first input coupled to an output of the blocking Josephson transmission line.

6. The device of claim 1, wherein the at least one configurable logic gate comprises:
a first toggle flip-flop circuit configured for non-destructive readout of an internal state of the first toggle flip-flop circuit;
a second toggle flip-flop circuit configured for non-destructive readout of an internal state of the second toggle flip-flop circuit;
a first pulse splitter circuit comprising an input port, a first output port coupled to a toggle input port of the first toggle flip-flop circuit, and a second output port coupled to a readout control input port of the second toggle flip-flop circuit; and
a second pulse splitter circuit comprising an input port, a first output port coupled to a readout control input port of the first toggle flip-flop circuit, and a second output port coupled to a toggle input port of the second toggle flip-flop circuit;
wherein the at least one configurable logic gate is configurable to implement one of a plurality of logic gates by initializing an internal state of at least one of the first toggle flip-flop circuit and the second toggle flip-flop circuit.

7. The device of claim 1, wherein:
the configurable logic circuit is configured as a multi-bit multiplexer circuit; and
the at least one configurable logic gate comprises at least two configurable logic gates configured as AND gates of the multi-bit multiplexer circuit, and at least one other configurable logic gate configured as an OR gate of the multi-bit multiplexer circuit.

8. The device of claim 1, wherein:
the configurable logic circuit is configured as a full adder circuit;
the at least one configurable logic gate comprises at least two configurable logic gates configured as AND gates of the full adder circuit, and at least one other configurable logic gate configured as an OR gate of the full adder circuit; and the configurable logic circuit comprises a confluence buffer circuit that is configured to implement an XOR gate of the full adder circuit.

9. A device, comprising:
a clockless single flux quantum logic circuit comprising a configurable logic gate, wherein the configurable logic gate comprises:
a first toggle flip-flop circuit configured for non-destructive readout of an internal state of the first toggle flip-flop circuit;
a second toggle flip-flop circuit configured for non-destructive readout of an internal state of the second toggle flip-flop circuit;
a first pulse splitter circuit comprising an input port, a first output port coupled to a toggle input port of the first toggle flip-flop circuit, and a second output port coupled to a readout control input port of the second toggle flip-flop circuit; and
a second pulse splitter circuit comprising an input port, a first output port coupled to a readout control input port of the first toggle flip-flop circuit, and a second output port coupled to a toggle input port of the second toggle flip-flop circuit;
wherein the configurable logic gate is configurable to implement one of a plurality of logic gates by initializing an internal state of at least one of the first toggle flip-flop circuit and the second toggle flip-flop circuit.

10. The device of claim 9, wherein:
in response to a single flux quantum (SFQ) pulse applied to the input port of the first pulse splitter circuit, the first pulse splitter circuit generates a first output SFQ pulse and a second output SFQ pulse at the first output port and the second output port, respectively, of the first pulse splitter circuit to toggle the internal state of the first toggle flip-flop circuit, and non-destructively readout the internal state of the second toggle flip-flop circuit; and
in response to a SFQ pulse applied to the input port of the second pulse splitter circuit, the second pulse splitter circuit generates a first output SFQ pulse and a second output SFQ pulse at the first output port and the second output port, respectively, of the second pulse splitter circuit to non-destructively readout the internal state of the first toggle flip-flop circuit and toggle the internal state of the second toggle flip-flop circuit.

11. The device of claim 9, wherein the configurable logic gate further comprises a confluence buffer circuit, wherein the confluence buffer circuit comprises a first input port coupled to a non-destructive readout port of the first toggle flip-flop circuit, and a second input port coupled to a non-destructive readout port of the second toggle flip-flop circuit.

12. The device of claim 11, wherein the clockless single flux quantum logic circuit further comprises:
a signal output converter circuit, which is coupled to an output port of the confluence buffer circuit, wherein the signal output converter circuit is configured to convert an SFQ pulse at the output port of the confluence buffer circuit into a two-level output signal;
a state initialization circuit coupled to the output port of the confluence buffer circuit of the configurable logic gate, and to an input port of the signal output converter circuit;

wherein the state initialization circuit is configured to initialize an internal state of the signal output converter circuit to implement one of the plurality of logic gates.

13. The device of claim 12, wherein the plurality of logic gates include an AND gate, a NAND gate, an OR gate, a NOR gate, an IMPLY gate, and a NIMPLY gate.

14. The device of claim 12, wherein the state initialization circuit comprises:
a blocking Josephson transmission line; and
a confluence buffer circuit which comprises a first input port coupled to an output port of the blocking Josephson transmission line, and a second input port coupled to the output port of the confluence buffer circuit of the configurable logic gate.

15. The device of claim 9, wherein the clockless single flux quantum logic circuit further comprises:
a first signal input converter circuit coupled to the input port of the first pulse splitter circuit;
a second signal input converter circuit coupled to the input port of the second pulse splitter circuit;
wherein the first signal input converter circuit is configured to receive a first two-level input signal on a first input signal line and generate an SFQ pulse on each rising edge and falling edge of the first two-level input signal; and
wherein the second signal input converter circuit is configured to receive a second two-level input signal on a second input signal line and generate an SFQ pulse on each rising edge and falling edge of the second two-level input signal.

16. The device of claim 9, wherein the clockless single flux quantum logic circuit further comprises:
a first state initialization circuit coupled to a first input of the configurable logic gate and configured to initialize an internal state of the first toggle flip-flop circuit; and
a second state initialization circuit coupled to a second input of the configurable logic gate and configured to initialize an internal state of the second toggle flip-flop circuit.

17. A device, comprising:
a clockless single flux quantum logic circuit comprising a configurable logic gate, wherein the configurable logic gate comprises:
a confluence buffer circuit comprising a first input port, a second input port, and an output port;
a signal output converter circuit which is configured to convert an SFQ pulse at the output port of the confluence buffer circuit into a two-level output signal, wherein the signal output converter circuit is configured to hold an internal state; and
a state initialization circuit which is configured to initialize the internal state of the signal output converter circuit;
wherein the configurable logic gate is configured to operate as one of an XOR gate and an XNOR gate depending on the initialized internal state of the signal output converter circuit.

18. The device of claim 17, wherein the configurable logic gate is configured as an XNOR gate by initializing the internal state of the signal output converter circuit to implement a NOT operation at an output port of the confluence buffer circuit.

19. The device of claim 17, wherein the state initialization circuit comprises:
a first input port coupled to an output port of the confluence buffer circuit;

a second input port, which is configured to receive a state initialization SFQ pulse;

an output port coupled to an input port of the signal output converter circuit; and a control input port configured to receive a control signal;

wherein the control signal is configured to one of: allow an input SFQ pulse at the first input port to pass to the output port of the state initialization circuit; and block the input SFQ pulse from passing to the output port of the state initialization circuit.

20. The device of claim 19, wherein the state initialization circuit comprises:

a blocking Josephson transmission line comprising an input coupled to the first input port of the state initialization circuit; and a confluence buffer circuit comprising a first input coupled to an output of the blocking Josephson transmission line, a second input coupled to the second input port of the state initialization circuit, and an output coupled to the output port of the state initialization circuit.

* * * * *